US010562760B2

(12) United States Patent
Chen et al.

(10) Patent No.: US 10,562,760 B2
(45) Date of Patent: Feb. 18, 2020

(54) SUPPORT PILLAR

(71) Applicant: Foresee Technology Corp., Taoyuan (TW)

(72) Inventors: Chien-Chang Chen, Taoyuan (TW); Yi-Der Liang, Taoyuan (TW); Shiao-Yi Lin, Taoyuan (TW); Cheng-Kuang Yang, Taoyuan (TW)

(*) Notice: Subject to any disclaimer, the term of this patent is extended or adjusted under 35 U.S.C. 154(b) by 0 days.

(21) Appl. No.: 15/652,960

(22) Filed: Jul. 18, 2017

(65) Prior Publication Data

US 2017/0313576 A1 Nov. 2, 2017

Related U.S. Application Data

(62) Division of application No. 15/155,448, filed on May 16, 2016, now Pat. No. 9,902,610.

(30) Foreign Application Priority Data

May 15, 2015 (TW) ............................. 104115514 A
May 15, 2015 (TW) ............................. 104207483 U
Jul. 7, 2015 (TW) ............................. 104210954 U
Aug. 28, 2015 (TW) ............................. 104214023 U

(51) Int. Cl.
*H01L 29/84* (2006.01)
*B81B 3/00* (2006.01)
(Continued)

(52) U.S. Cl.
CPC ........ *B81B 3/0054* (2013.01); *B81C 1/00246* (2013.01); *H04R 19/005* (2013.01); *H04R 19/04* (2013.01); *B81B 2201/0257* (2013.01); *B81B 2203/0118* (2013.01); *B81B 2203/0361* (2013.01); *B81B 2207/015* (2013.01); *B81B 2207/07* (2013.01); *B81C 2201/013* (2013.01); (Continued)

(58) Field of Classification Search
CPC ..... B81B 2201/0257; B81B 2203/0118; B81B 2203/0361; B81B 2207/015; B81B 2207/07; B81B 3/0054; B81C 1/00246; B81C 2201/013; B81C 2201/053; B81C 2203/0714; B81C 2203/0735
See application file for complete search history.

(56) References Cited

U.S. PATENT DOCUMENTS

2014/0264653 A1* 9/2014 Cheng ................ B81C 1/00238
257/416

OTHER PUBLICATIONS

Banser Jr., "Micromachines Biomimetic Optical Microphones with Improved Packaging and Power Consumption", A Thesis Presented to the Academic Faculty of Georgia Institute of Technology, May 2012, 135 pages.

(Continued)

*Primary Examiner* — Meiya Li
(74) *Attorney, Agent, or Firm* — Muncy, Geissler, Olds & Lowe, P.C.

(57) ABSTRACT

The present invention disclosed a micro acoustic collector with a lateral cavity, comprising: a base metal layer; a movable film, an annular side wall; a lateral metal layer. The movable film faces towards the base metal layer to form a hollow space. The lateral metal layer is formed at a side of the movable film and around the movable film, fixed by the annular side wall and spaced apart from peripheral of the movable film by a distance, and the lateral metal layer faces towards the base metal layer to form a lateral cavity to assist an acoustic collection.

14 Claims, 68 Drawing Sheets

(51) Int. Cl.
*B81C 1/00* (2006.01)
*H04R 19/00* (2006.01)
*H04R 19/04* (2006.01)

(52) U.S. Cl.
CPC .................. *B81C 2201/053* (2013.01); *B81C 2203/0714* (2013.01); *B81C 2203/0735* (2013.01)

(56) References Cited

OTHER PUBLICATIONS

Chen, "Physical Analyses of MEMS Component Structures for Optimal Microsystem Design", A Dissertation submitted to Department of Electronics Engineering and Institute of Electronics College of Electrical and Computer Engineering National Chiao Tung University, Jan. 2011, 214 pages.

Chen et al., "Physical Analysis of a Biomimetic Microphone With a Central-Supported (C-S) Circular Diaphragm for Sound Source Localization", IEEE Sensors Journal, vol. 12, No. 5, May 2012, pp. 1504-1512.

\* cited by examiner

SUPPORT PILLAR

CROSS REFERENCE TO RELATED APPLICATIONS

This application is a Divisional of co-pending application Ser. No. 15/155,448 filed on May 16, 2016, for which priority is claimed under 35 U.S.C. § 120; and this application claims priority of Application No. 104115514 filed in Taiwan on May 15, 2015, 104207483 filed in Taiwan on May 15, 2015, 104210954 filed on Jul. 7, 2015, and 104214023 filed in Taiwan on Aug. 28, 2015, under 35 U.S.C. § 119; the entire contents of all of which are hereby incorporated by reference.

BACKGROUND OF THE INVENTION

1. Field of the Invention

The present disclosure relates to a semiconductor technology, more particularly to a micro acoustic collector with a lateral cavity and with a support pillar.

2. Description of the Related Art

A capacitive plate manufactured by micro electro mechanical system (MEMS) technology can be applied widely, for example, in fields of inertial sensor, sound sensor, fluid sensor, tactile sensor, pressure sensor, and actuator and so on. For nice sensing effect, a comb electrode or mass block is often used in the capacitive plate to achieve better sensitivity. Generally speaking, the capacitive plate manufactured by MEMS process is totally different from a standard complementary metal-oxide-semiconductor (CMOS) device. Currently, the capacitive plate manufactured by MEMS technology has higher cost, and the capacitive plate manufactured by the standard CMOS process has relative low cost.

The capacitive plate, manufactured by MEMS process or CMOS process, has an essential structure that is movable component. The movable component must be supported well to stably generate desired physical variation (such as deformation or displacement), and then generate the sensing signal according to the physical variation. The way of supporting the movable component is to use at least one support pillar.

Currently, the support pillar, manufactured by MEMS process or CMOS process, is formed by a metal pillar encapsulated with oxide layer and has just normal strength. Therefore, what is need is to develop a support pillar having the same size but better strength, to improve the stability of the movable component and extend lifetime of the movable component.

SUMMARY OF THE INVENTION

In order to solve the problem in conventional technology, the present disclosure provides a support pillar and more particularly a micro acoustic collector with a lateral cavity and with a support pillar to provide better resistance against strong vibration and etching.

The present disclosure provides a support pillar which is formed under a movable film for support. The support pillar includes a plurality of first metal micropillars, a base metal connection pillar layer and a first oxide encapsulation layer. The plurality of first metal micropillars are formed under the movable film and conductively connected to the movable film by metal connection. The base metal connection pillar layer is formed under the plurality of first metal micropillars and conductively connected to the plurality of first metal micropillars. The first oxide encapsulation layer fully or partially encapsulates the plurality of first metal micropillars to insulate the plurality of first metal micropillars from air and shape the support pillar into a column shape.

The present disclosure further provides a support pillar including a plurality of metal pillar bodies and at least one insulating pillar body. The two adjacent metal pillar bodies are connected by a plurality of metal micropillars, and the at least one insulating pillar body fully or partially encapsulates entire or a part of the plurality of metal micropillars.

BRIEF DESCRIPTION OF THE DRAWINGS

The detailed structure, operating principle and effects of the present disclosure will now be described in more details hereinafter with reference to the accompanying drawings that show various embodiments of the present disclosure as follows.

DETAILED DESCRIPTION OF THE PREFERRED EMBODIMENTS

Figure 1A:
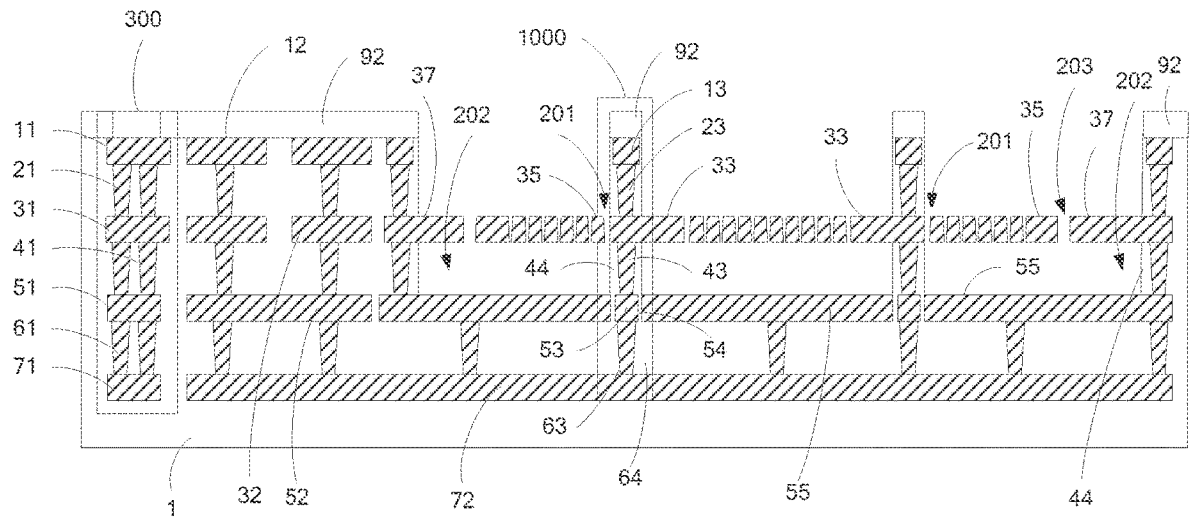
FIGS. 1A and 1B are cross section view and top view of an embodiment of a sensor chip having movable components with support pillars of the present disclosure.

Reference will now be made in detail to the exemplary embodiments of the present disclosure, examples of which are illustrated in the accompanying drawings. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. These embodiments are provided so that this disclosure will be thorough and complete, and will fully convey the inventive concept to those skilled in the art. The relative proportions and ratios of components in the drawings may be exaggerated or diminished in size for the sake of clarity and convenience in the drawings, and such arbitrary proportions are only illustrative and not limiting in any way. The same reference numbers are used in the drawings and the description to refer to the same or like parts.

It will be understood that, although the terms 'first', 'second', 'third', etc., may be used herein to describe various components, these components should not be limited by these terms. The terms are used only for the purpose of distinguishing one component from another component. Thus, a first component discussed below could be termed a second component without departing from the teachings of embodiments. As used herein, the term "or" includes any and all combinations of one or more of the associated listed items.

A concept of the present disclosure is to apply a structure similar to reinforced concrete, and an oxide layer is used to encapsulate multiple metal micropillars to form connection structures for supporting the conductive layer of the movable component, so as to improve structural strength of the support pillar manufactured by CMOS process, MEMS process or other manufacturing process. The support pillar of the present disclosure can have higher metal structural strength than the support pillar made by single material.

Please refer to FIG. 1A which shows a cross section view of a first embodiment of a support pillar of the present disclosure. In the first embodiment, four metal layers are disposed on a substrate 1 to form a CMOS movable component, the third layer is used to form the movable component, and the fourth layer is used to form cap structures of the support pillars.

The first metal layer can be used to form a semiconductor device layer 72, where a sensing circuit including transistors, resistors, capacitors and so on is disposed, and a pad layer 71 for a pad area 300.

The second metal layer can be used to form a base metal layer 55 for the movable component, a connection line layer 52 disposed at a side thereof, and a pad layer 51 for the pad area 300. A through-via layer 61 between the first metal layer and the second metal layer functions as a bridge between circuits disposed on the first and the second metal layers. An insulating layer (such as oxide layer) is distributed in the through-via layer 61.

The third metal layer can be used to form the movable component. Please refer to FIG. 1B which shows an embodiment of an inner-annular-supported acoustic collection film 35. This embodiment is applied to a microphone and includes suspended arms. In addition, the connection line layer 32 (not shown in FIG. 1B) and the pad layer 31 (not shown in FIG. 1B) are disposed at the third metal layer. In this embodiment, a lateral metal layer 37 is disposed at a side of the layer of the movable component, and separated from the inner-annular-supported acoustic collection film by annular trench 203, so as to improve capacitance sensitivity of the movable component.

The fourth metal layer is dedicated to form the cap structure for improving strength of the support pillar. The fourth metal layer includes a top metal connection pillar layer 13, the connection line layer 12 and a pad layer 11 for the pad area 300. The pad layers for the pad area 300 are connected with each other by connection pillars 21, 41 and 61.

Figure 1B:
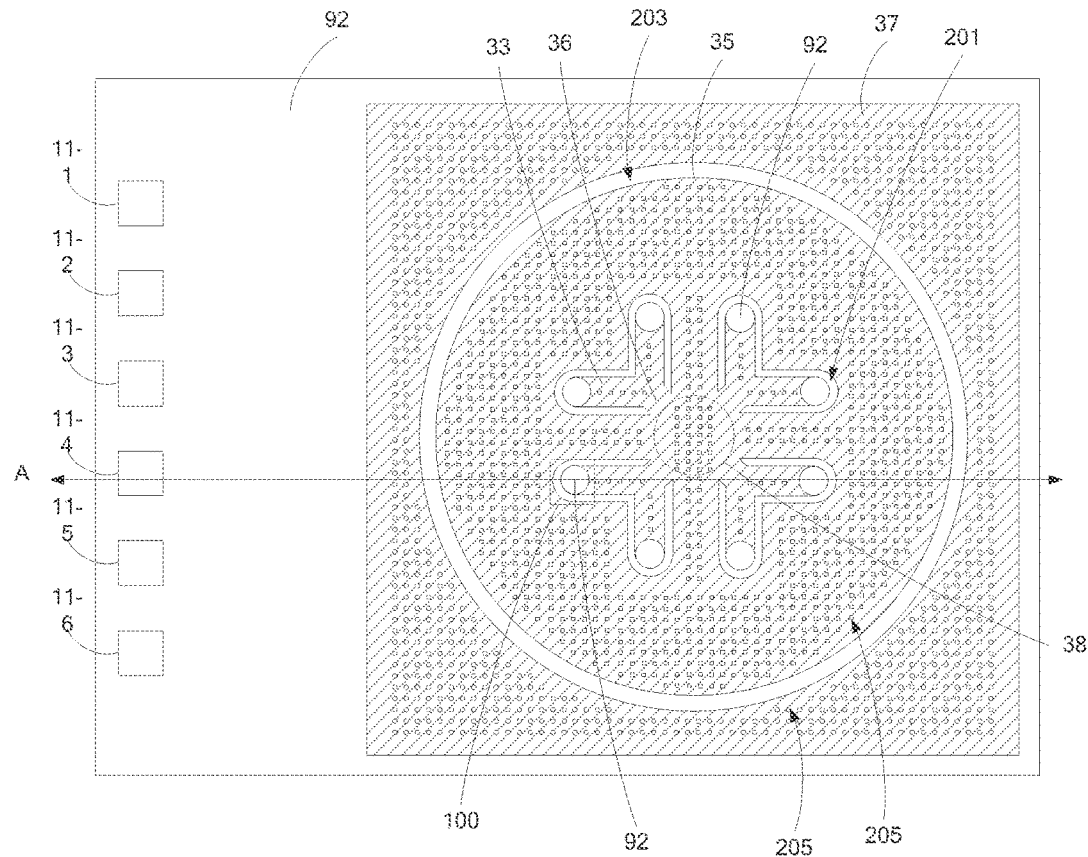

From the top view of the embodiment shown in FIG. 1B, the pad area 300 includes six pads 11-1, 11-2, 11-3, 11-4, 11-5 and 11-6, and these pads are separated from each other by a protective layer 92.

This embodiment of the inner-annular-supported acoustic collection film 35 adopts a leaf-shaped structure 33 which has four in number, as shown in FIG. 1B. The leaf-shaped structures 33 are arranged annularly and each is defined by a continuous trench 201. The four continuous trenches 201 define a film arm well (that is, a well-shaped film arm structure). The leaf-shaped structures 33 are designed as L-shaped restrained arm structure with the same lengths, and two support pillars are respectively disposed at distal ends of the L-shaped restrained arms, and a suspended arm 36 is formed at a connection portion between the restrained arms. The two adjacent and parallel leaf-shaped structures 33 are spaced apart from each other to form at least one central channel which is passed through a central portion of the inner-annular-supported acoustic collection film 35 to form a suspended fulcrum 38. In addition, the isotropic etching process can be performed on the entire inner-annular-supported acoustic collection film 35 (including the leaf-shaped structures 33, the central channel and the suspended fulcrum 38) through the uniformly-distributed through-vias 205, so that the inner-annular-supported acoustic collection film 35 can be suspended.

Please refer back to FIG. 1A. In this embodiment, a support pillar 1000 has multiple parts respectively disposed on the first metal layer to the fourth metal layer. Each metal layer can be made by metal, alloy or multilayer composite metal. The support pillar 1000 has a structure including a support pillar body, a cap and a bottom pillar. The support pillar body includes a plurality of first metal micropillars 43, a base metal connection pillar layer 53, and a first oxide encapsulation layer 44. The cap is formed by at least one second metal micropillar 23, a top metal connection pillar layer 13 and a second oxide encapsulation layer 24 (not shown in FIG. 1A). The bottom pillar is formed by at least one third metal micropillar 63, a bottom metal connection pillar layer 72 and a fourth oxide encapsulation layer 64.

The plurality of first metal micropillars 43 of the support pillar body is formed under the leaf-shaped structures 33 to support the leaf-shaped structures 33 by metal-connection, and the metal of the support pillar body can be mixed with the oxide encapsulation layer to form a reinforced structure, so that the leaf-shaped structure 33 can be supported well. Moreover, by the metal-connection support provided by the second metal micropillar 23 and the top metal connection pillar layer 13 of the cap, and the reinforced structure formed by mixing the metal of the cap and the oxide encapsulation layer, the cap and the support pillar body can clamp both top and bottom sides of the leaf-shaped structure 33, so that the leaf-shaped structure 33 can be provided with dual-support. Therefore, the leaf-shaped structures 33 can support entire inner-annular-supported acoustic collection film 35 more stably, so as to extend the life of the inner-annular-supported acoustic collection film 35 and continuously stabilize the voice response of the inner-annular-supported acoustic collection film 35.

The cap is an optional structure for further reinforcing the strength of the support pillar. The bottom pillar is also an optional structure for assisting transmission of signal and can be designed as the structure the same as the cap or the support pillar.

In the embodiment shown in FIGS. 1A and 1B, the movable component is implemented by the inner-annular-supported acoustic collection film 35. The inner-annular-supported acoustic collection film 35 and the metal substrate layer 55 define a hollow space, and the lateral metal layer 37 and the base metal layer 55 also define a lateral cavity 202. The hollow space and the lateral cavity 202 are in communication with each other, so that the inner-annular-supported acoustic collection film 35 has a larger hollow cavity to improve sound pressure sensitivity thereof.

Figure 2A:
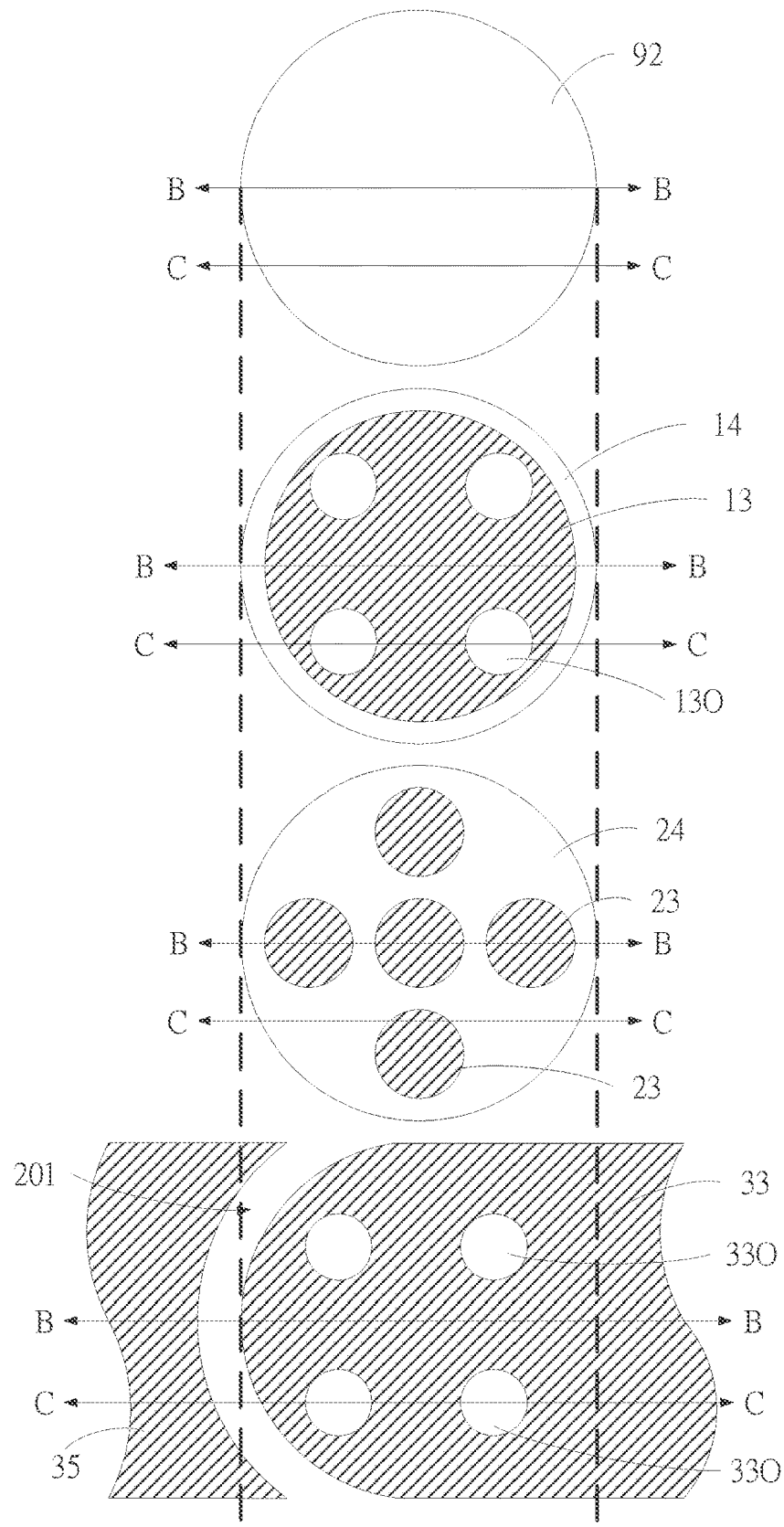
FIGS. 2A through 2D show an embodiment of the support pillar of FIGS. 1A and 1B, respectively.
Figure 2B:
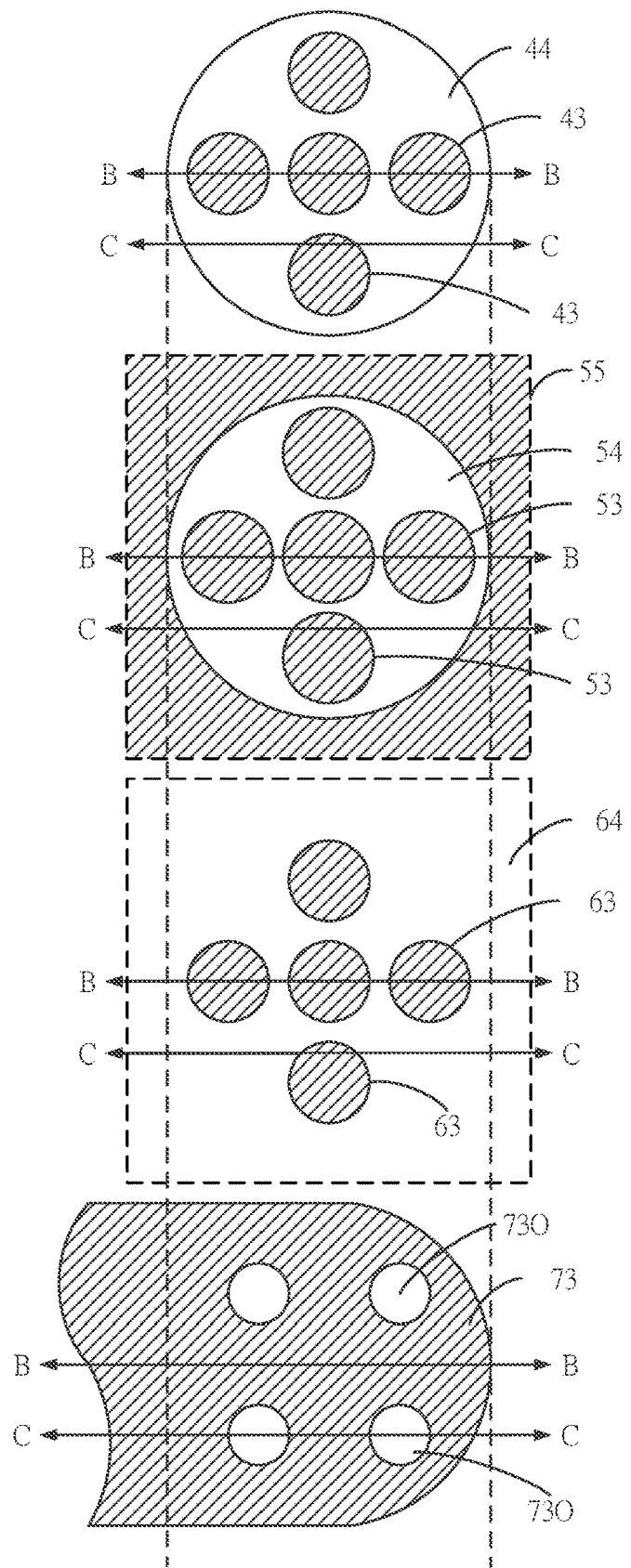

The way of respectively connecting the metal micropillars of the support pillar and the metal layers will be described below. Please refer to FIGS. 2A through 2D which show the embodiment of the structure of support pillar shown in FIGS. 1A and 1B. FIGS. 2A and 2B show structural views of different layers of the embodiment, and FIGS. 2C and 2D show cross section views taken along B-B and C-C lines of FIGS. 2A and 2B.

FIGS. 2A through 2D disclose the entire structure of the support pillar. The topmost protective layer 92 can be a thick film photoresist, an oxide layer or organic compound which is well known in a field of semiconductor process. The top metal connection pillar layer 13 has four third through-vias 130 and is encapsulated by the third oxide encapsulation layer 14. Five second metal micropillars 23 are disposed under the top metal connection pillar layer 13 and encapsulated by the second oxide encapsulation layer 24. The leaf-shaped structure 33 and a first through-via 330 are disposed under the five second metal micropillars 23. Five first metal micropillars 43 are disposed under the leaf-shaped structure 33 and are encapsulated by the first oxide encapsulation layer 44. The base metal layer connection pillar layer 53 is disposed under the five first metal micropillars 43 and includes five base metal pillars encapsulated by the base metal oxide layer 54. Five third metal micropillars 63 and the fourth oxide encapsulation layer 64 which is used to encapsulate the five third metal micropillars 63, are disposed under the base metal layer connection pillar layer 53. The bottommost layer of the support pillar is a conductor layer which is the main structure of the first metal layer 73 and configured to transmit a sensing signal generated by the movable component (that is, the inner-annular-supported acoustic collection film 35). Preferably, multiple through-vias 730 can be formed in the bottommost layer to enable the oxide layers to be in communication with each other.

Figure 2C:
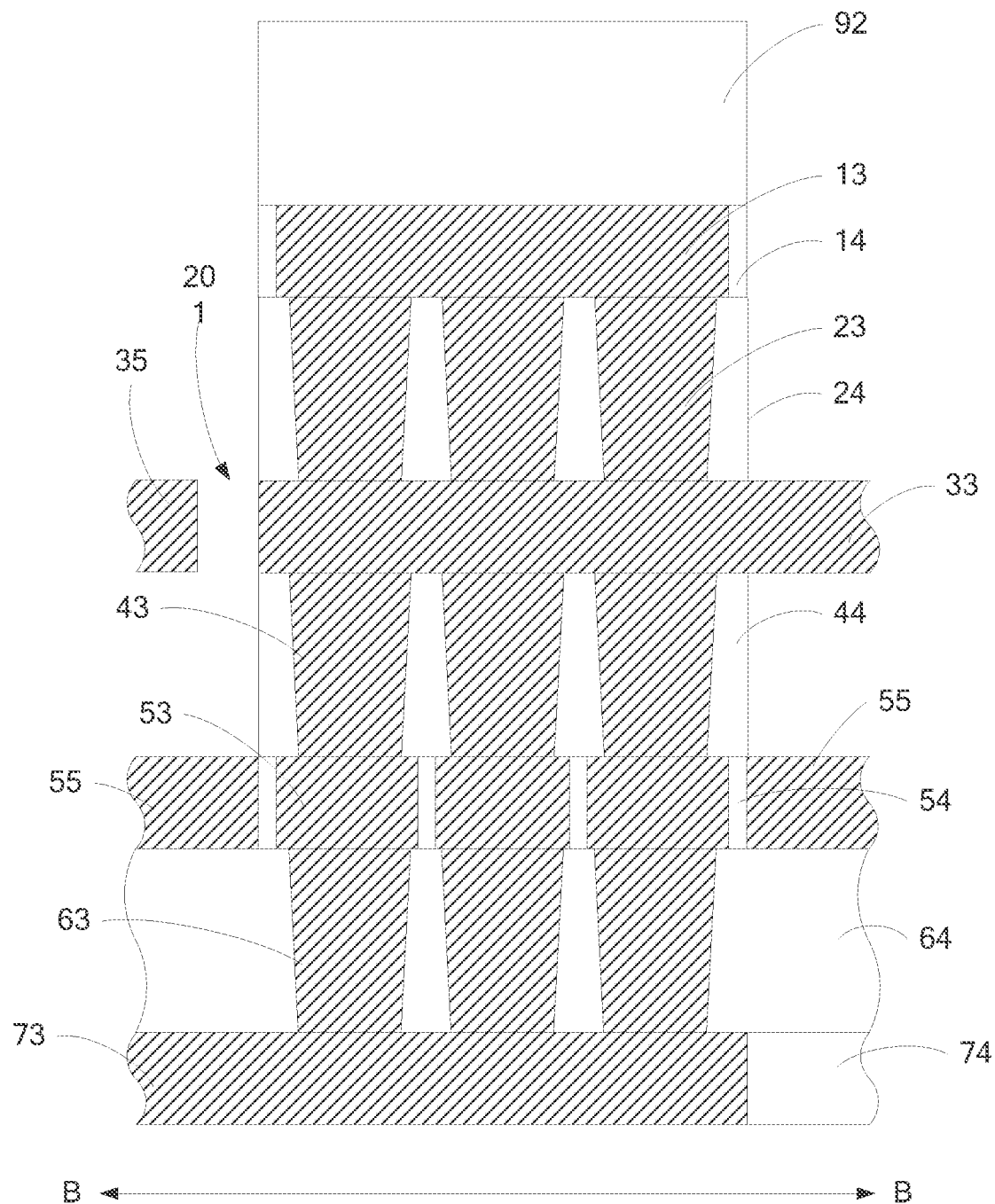
Figure 2D:
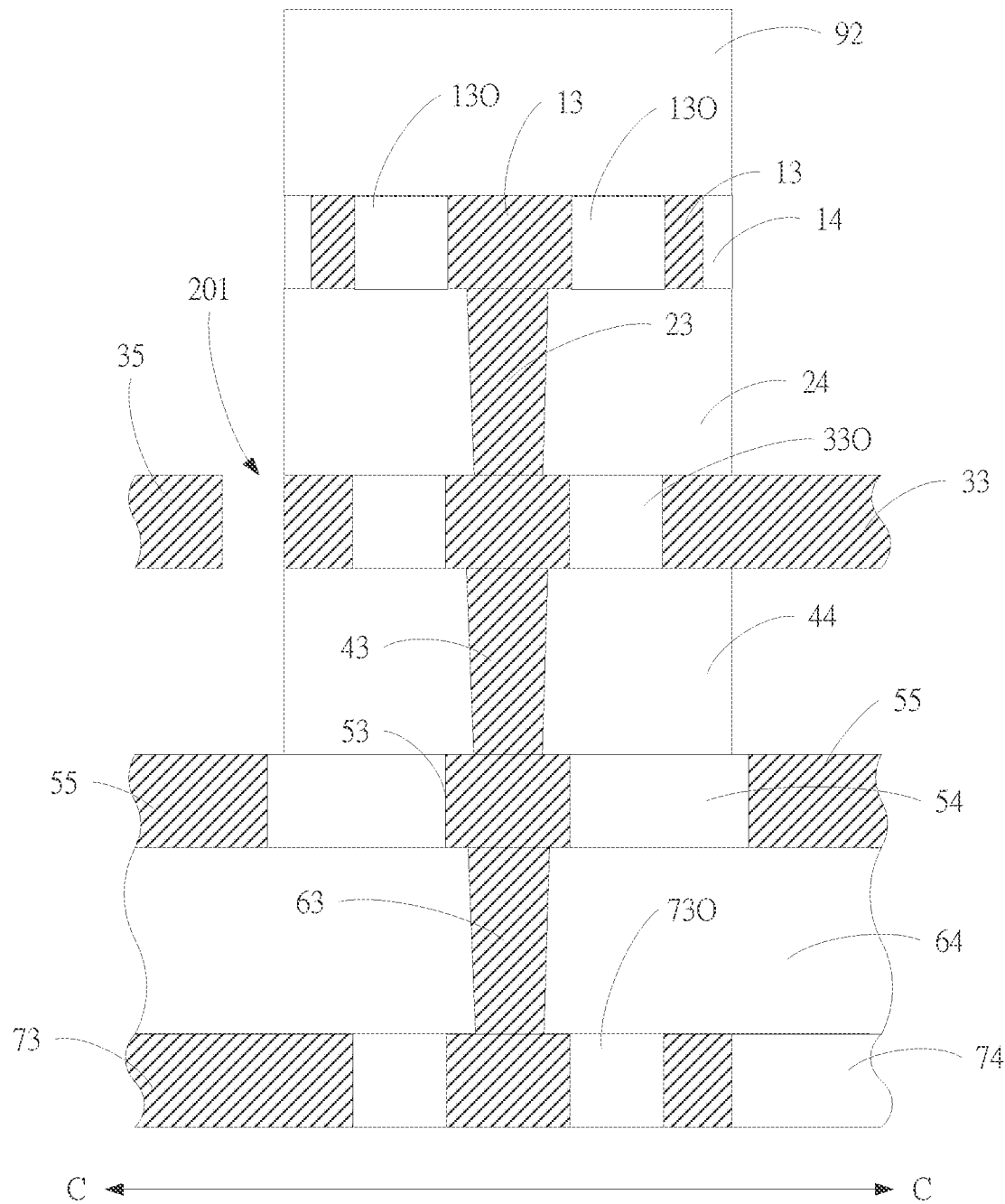
Figure 3A:
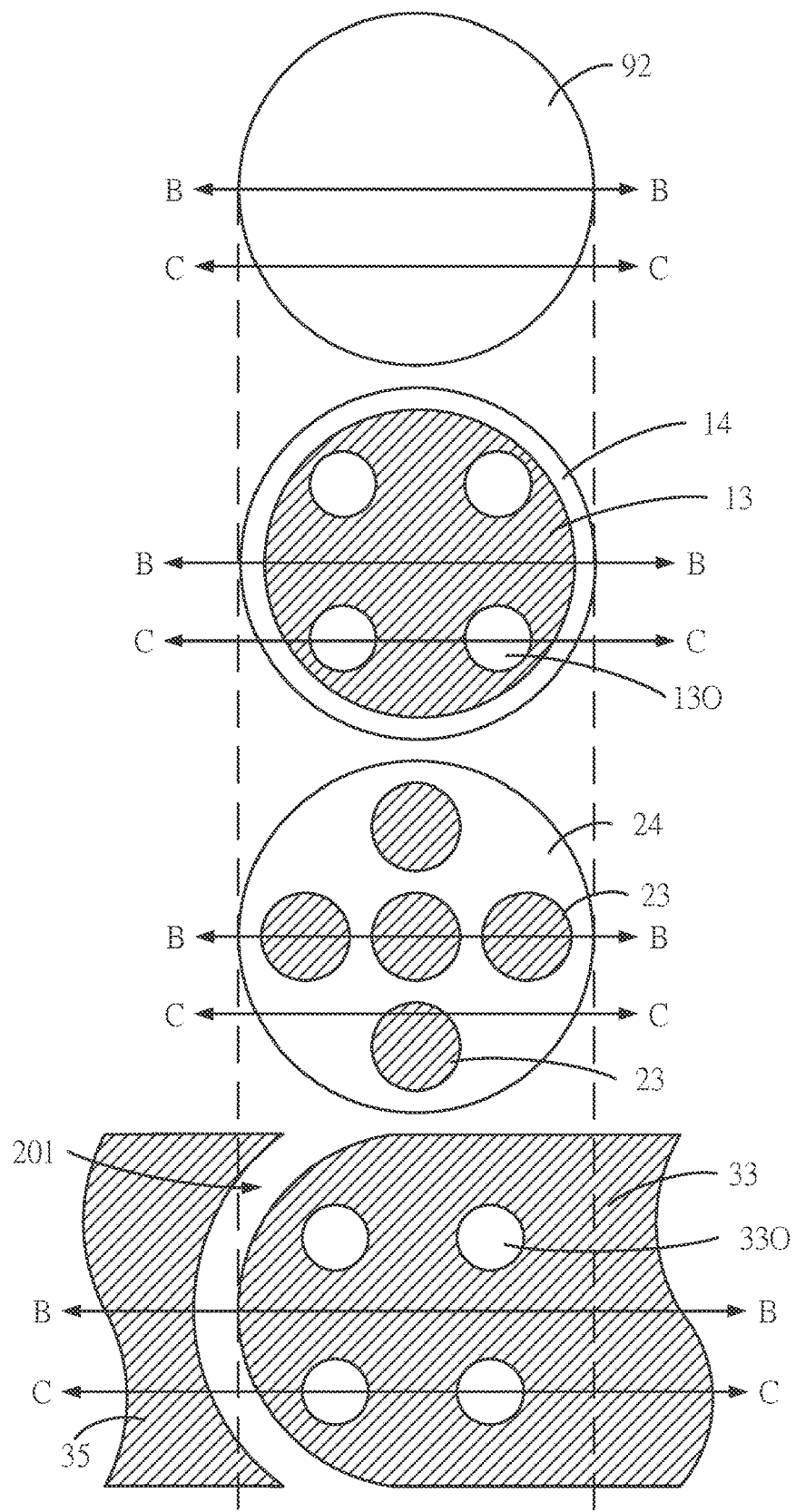
FIGS. 3A through 3D show other embodiment of the support pillar of FIGS. 1A and 1B, respectively.
Figure 3B:
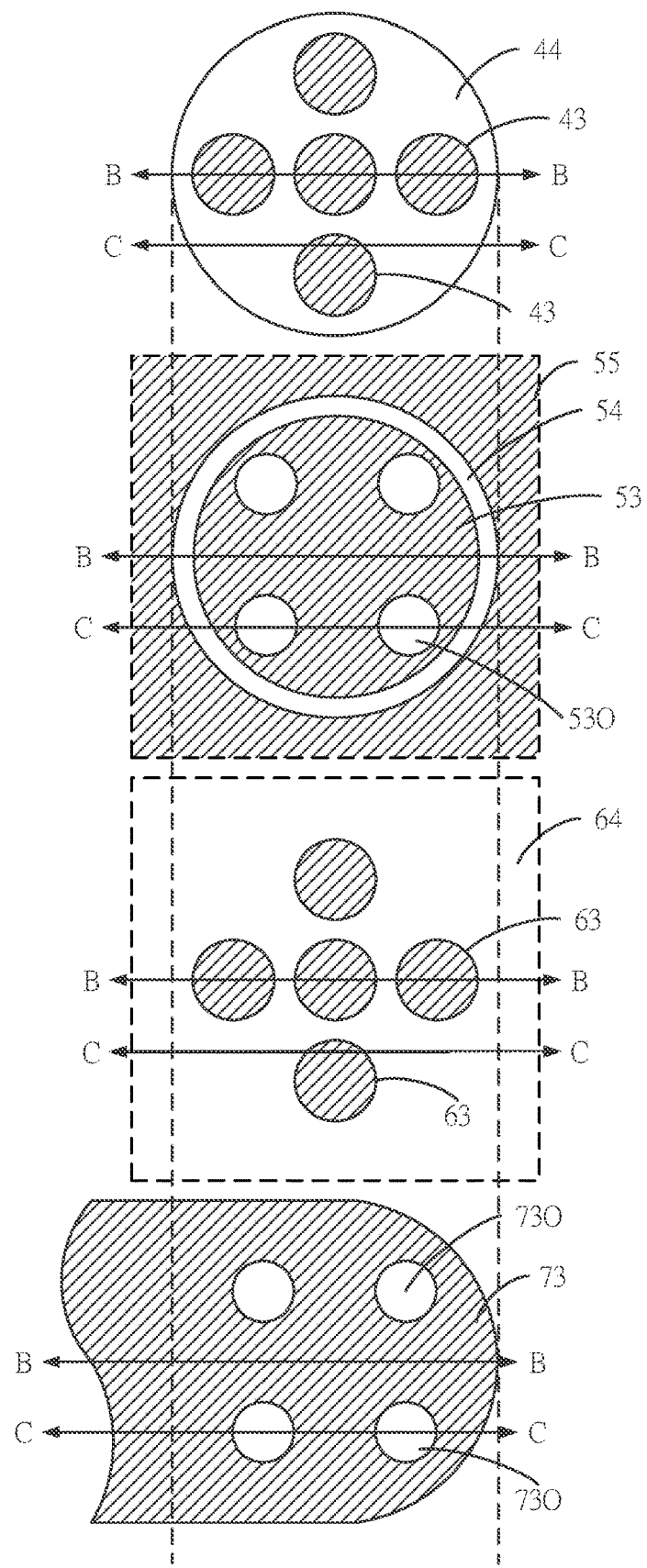
Figure 3C:
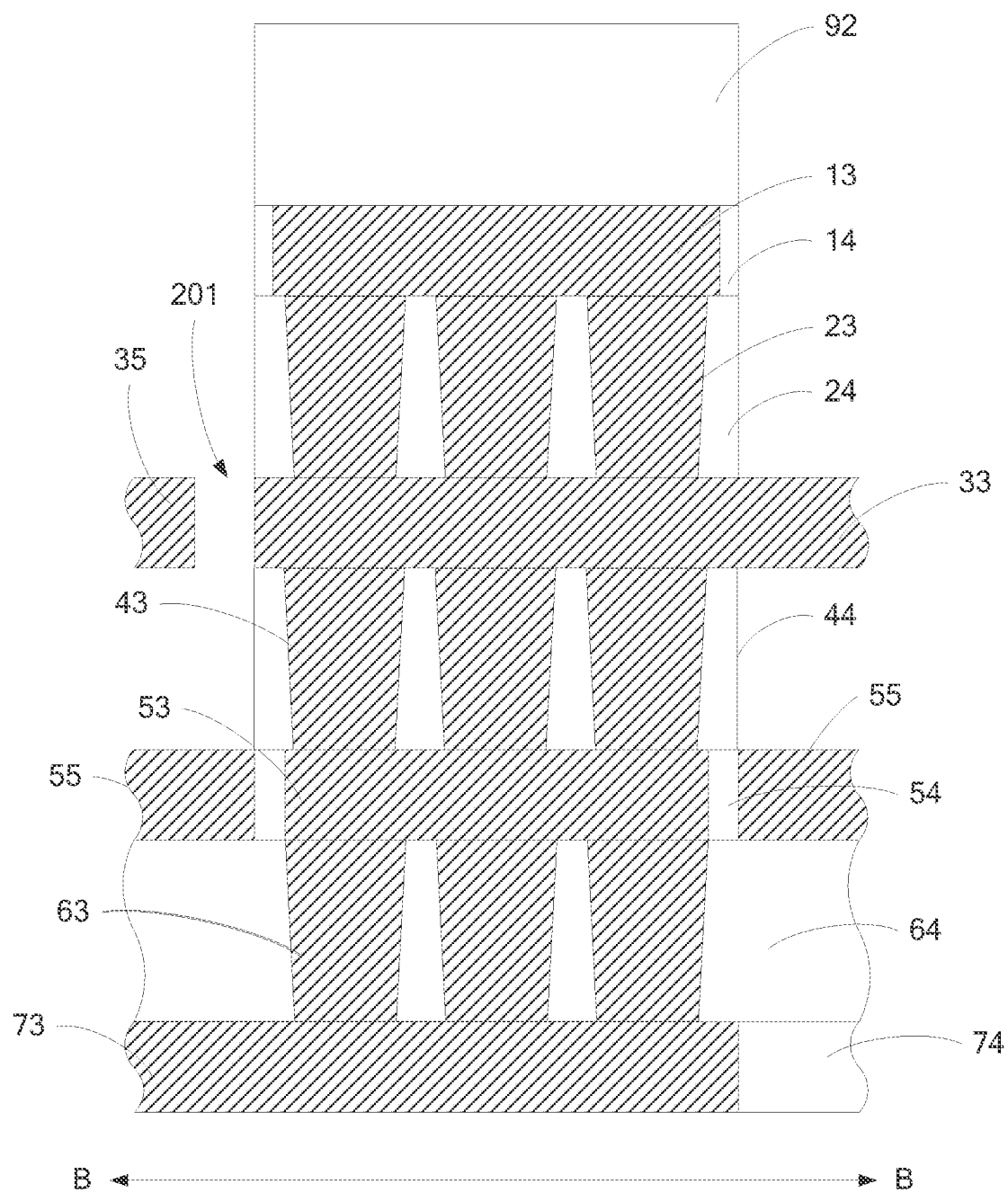
Figure 3D:
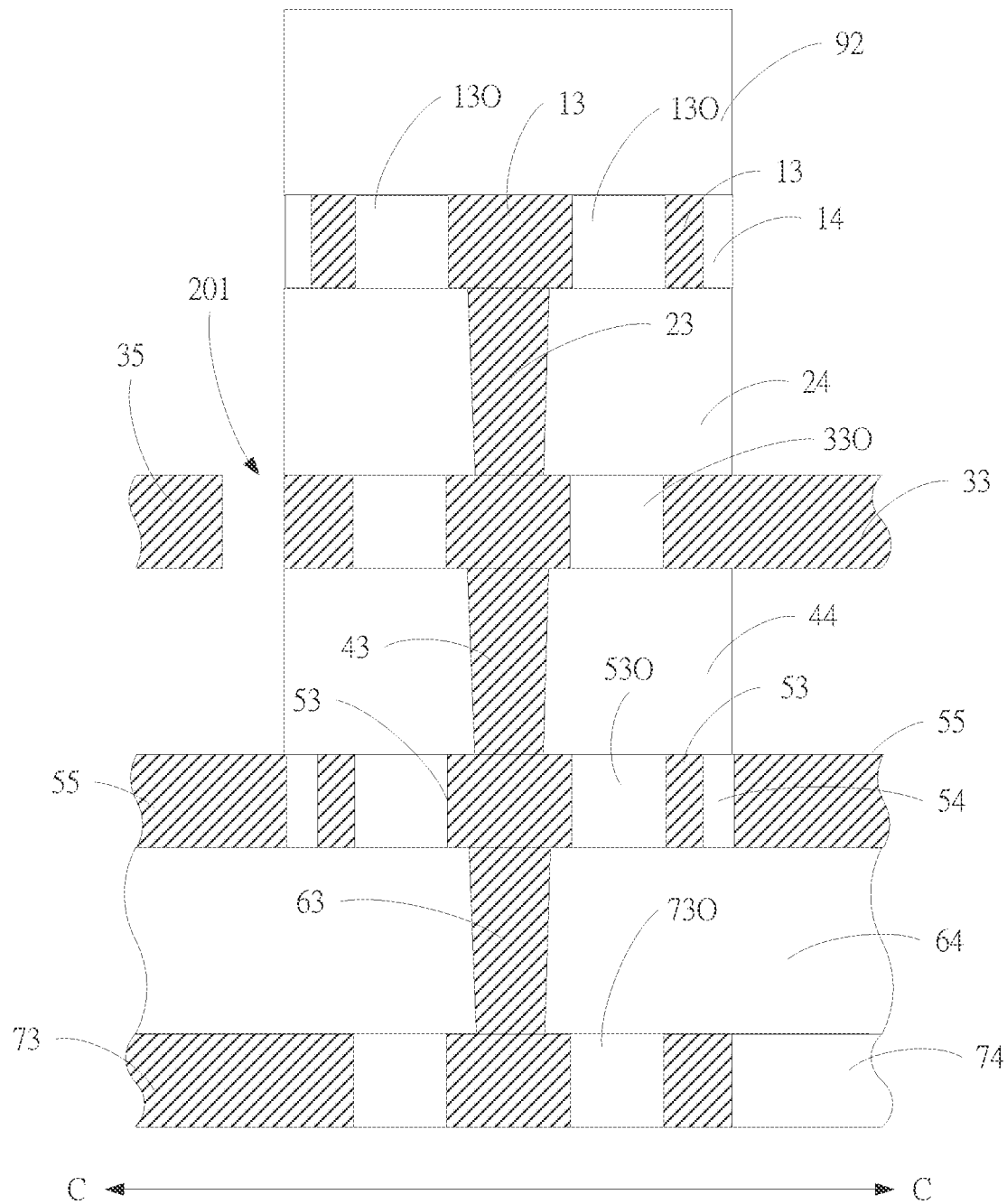
Figure 4A:
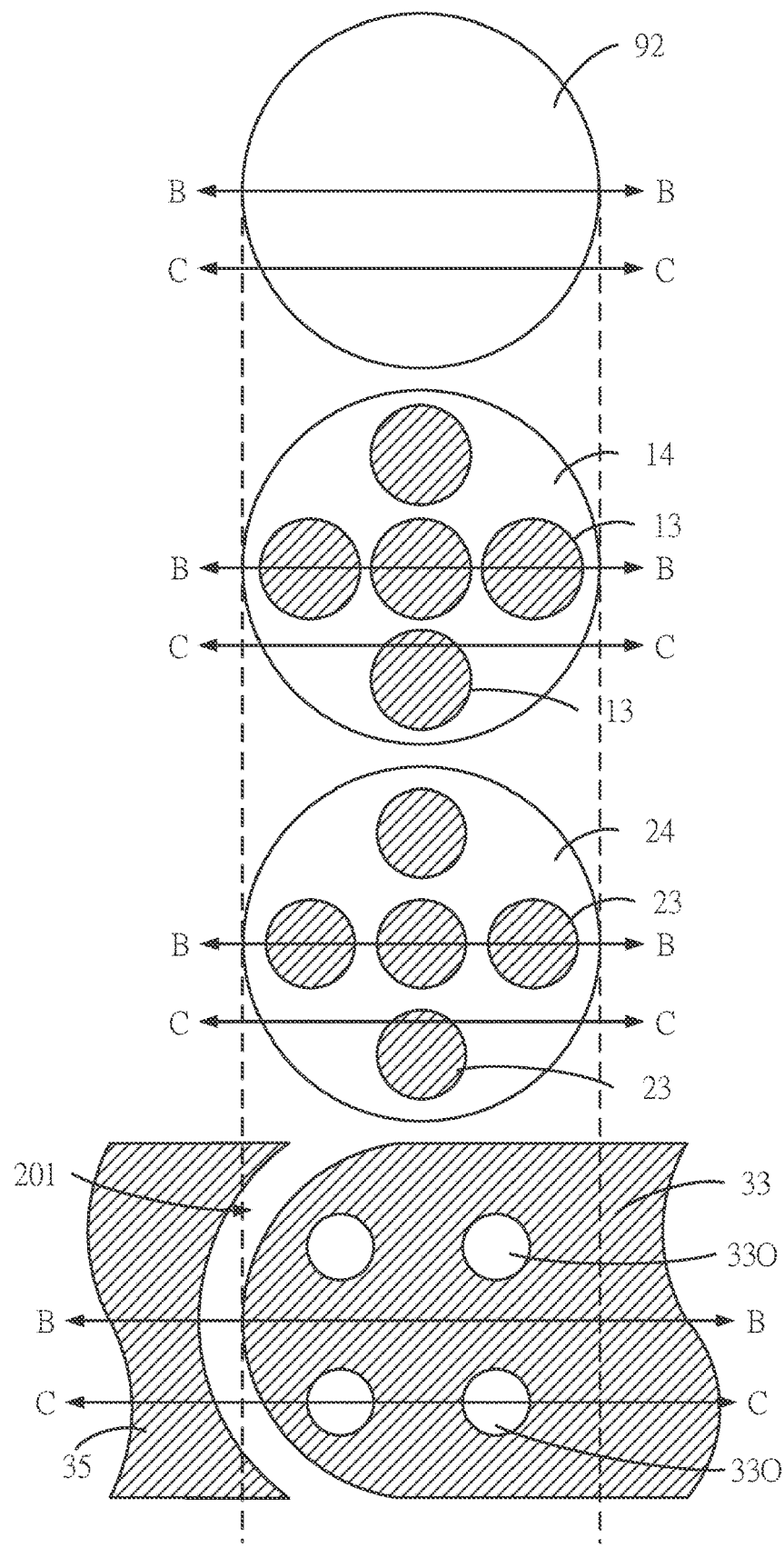
FIGS. 4A through 4D show another embodiment of structure of the support pillar of FIGS. 1A and 1B, respectively.
Figure 4B:
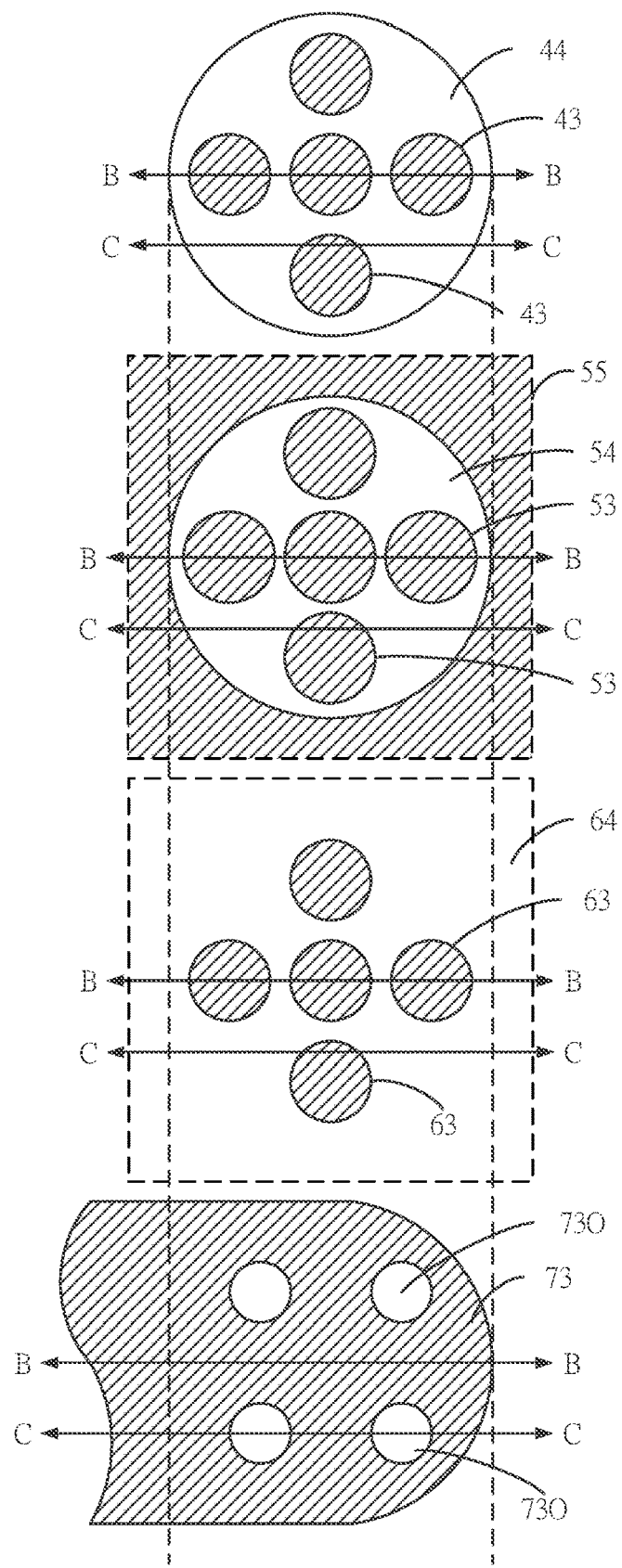
Figure 4C:
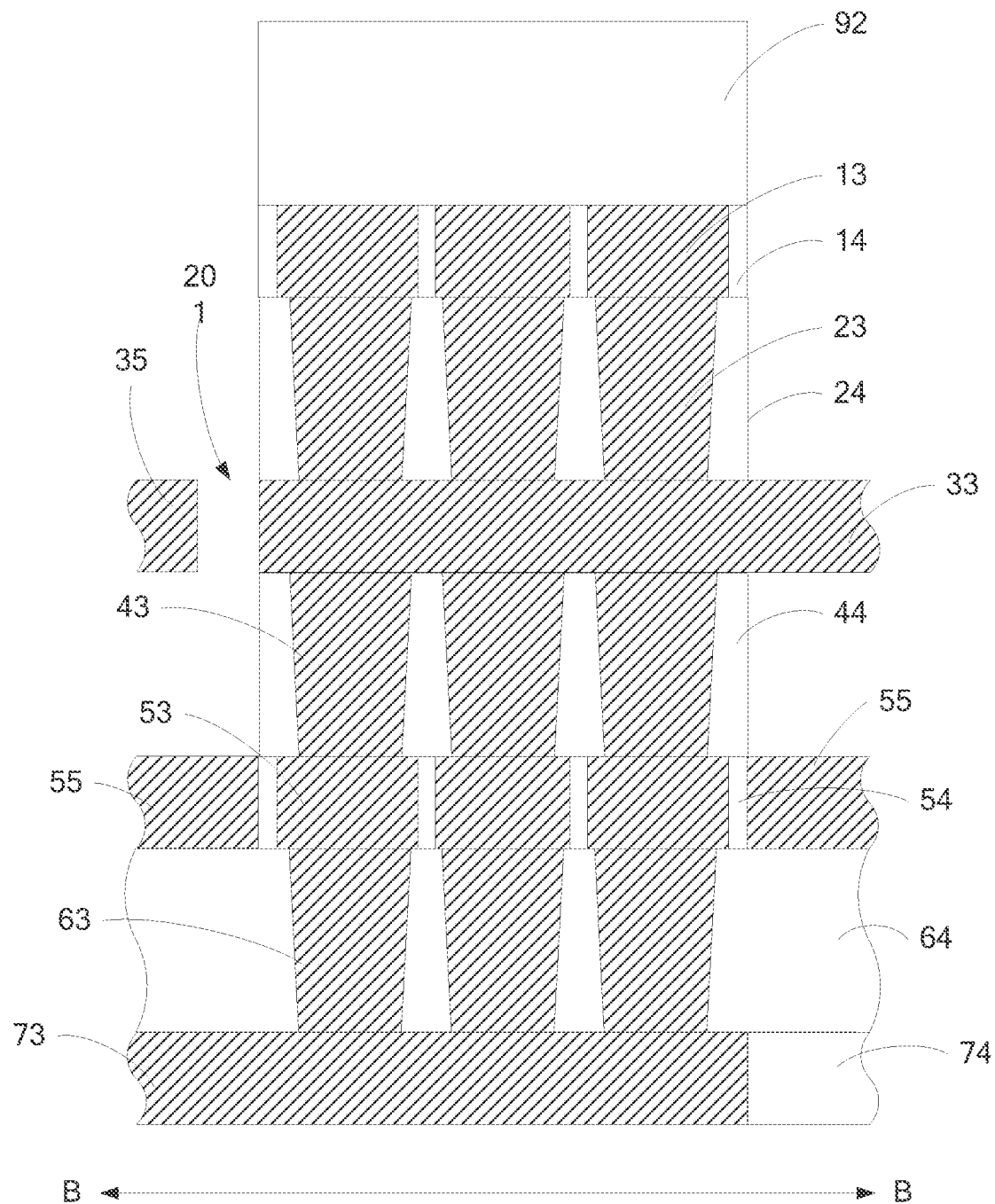
Figure 4D:
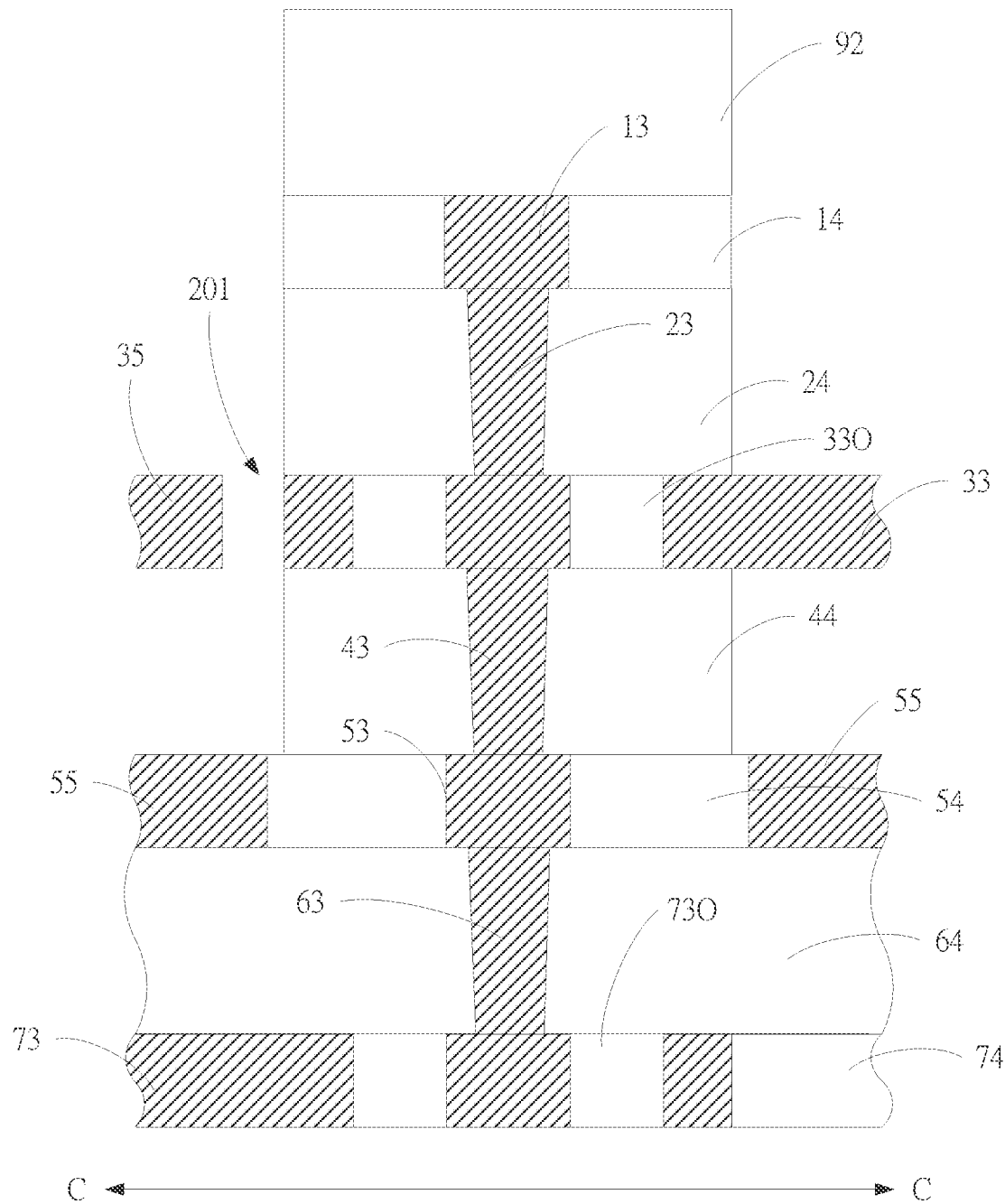
Figure 5A:
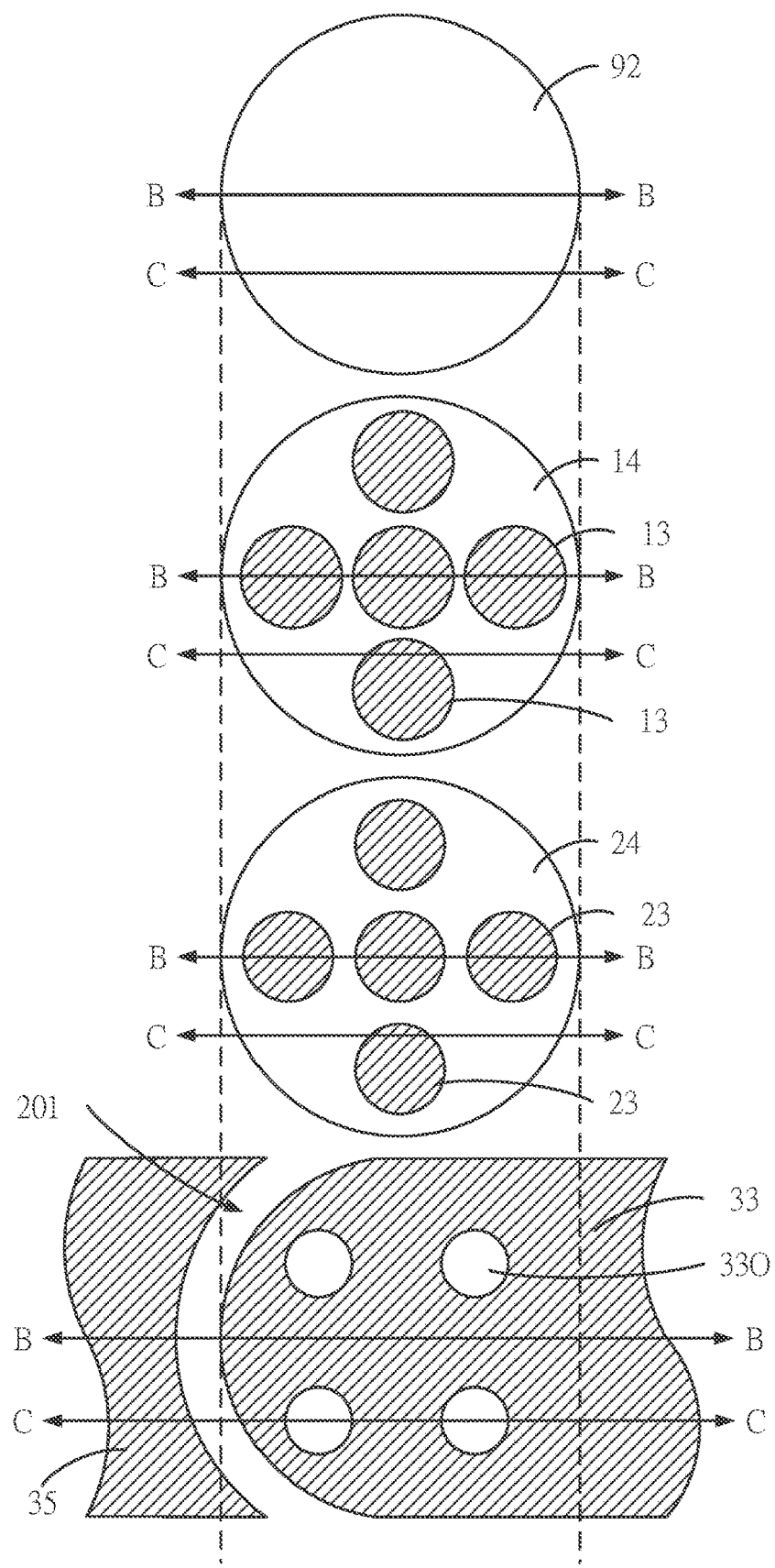
FIGS. 5A through 5D show another embodiment of structure of the support pillar of FIGS. 1A and 1B, respectively.
Figure 5B:
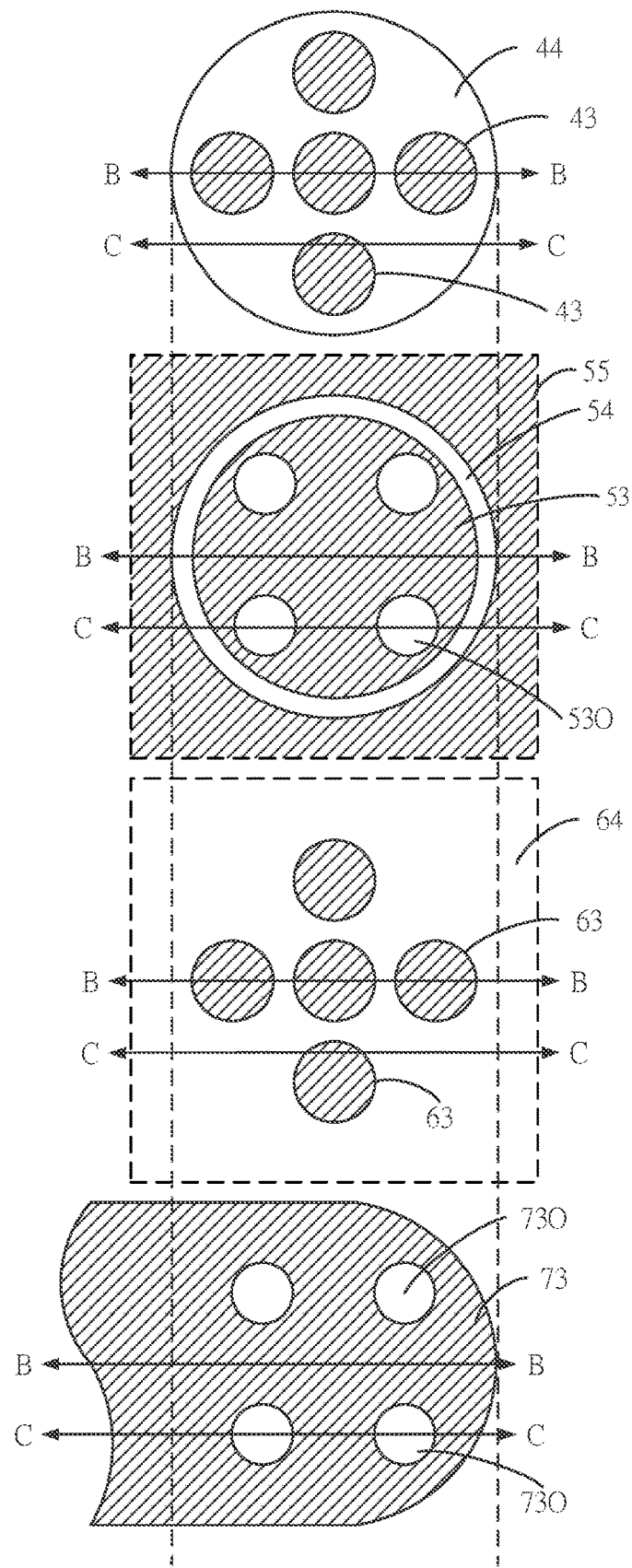
Figure 5C:
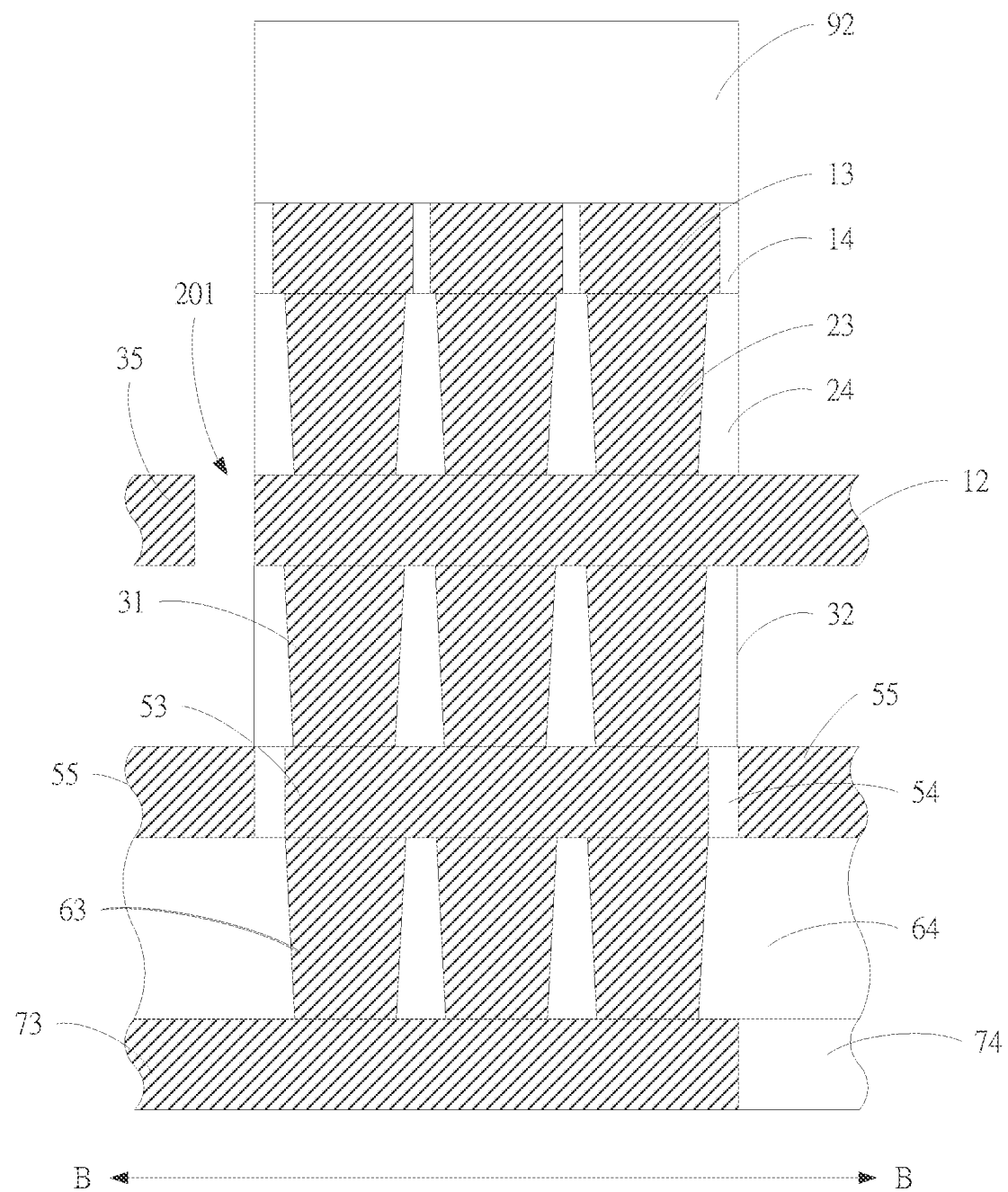
Figure 5D:
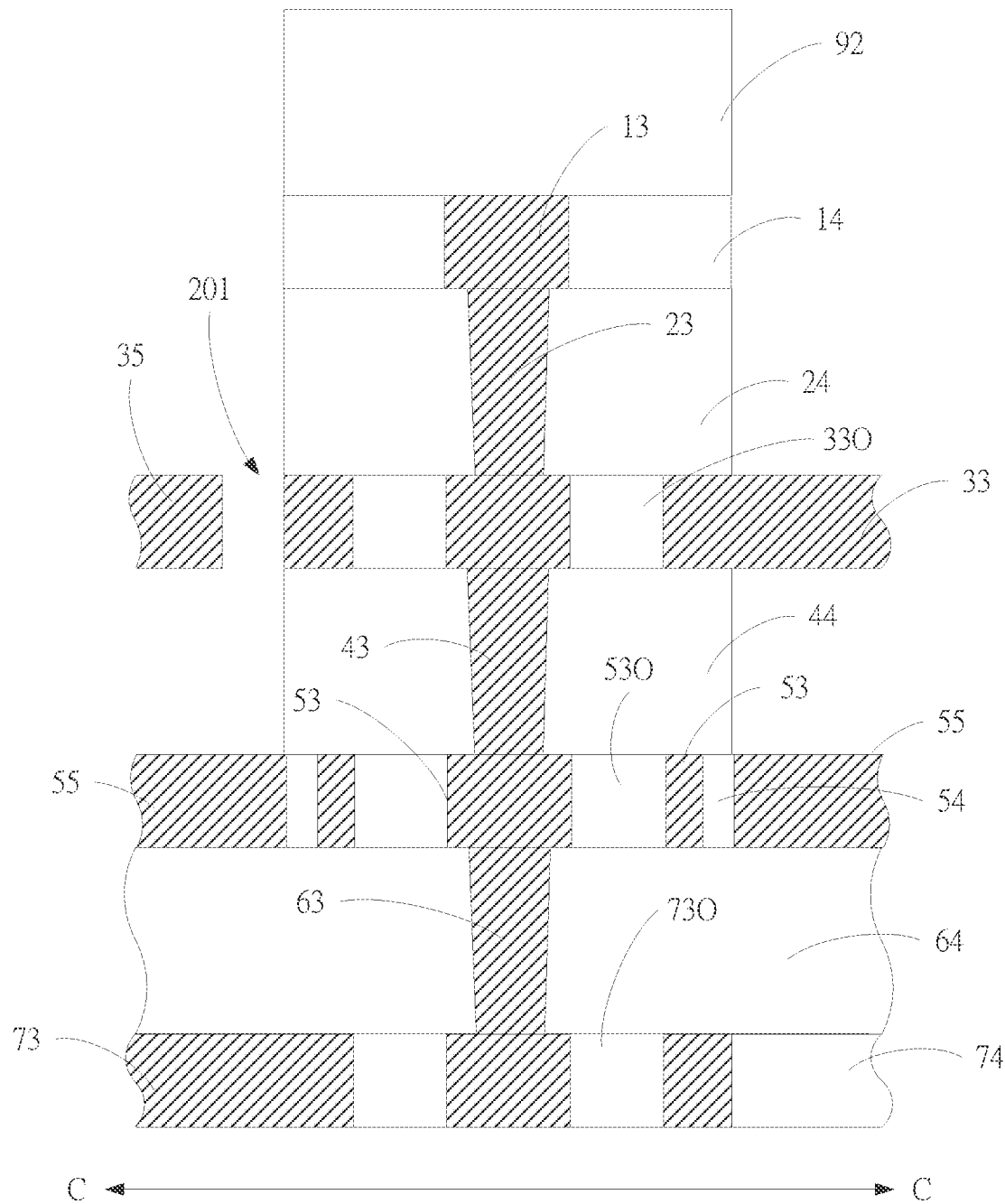

Please refer to FIGS. 2C and 2D. Metal portions of the top metal connection pillar layer 13, the second metal micropillar 23, the leaf-shaped structure 33, the first metal micropillar 43, the base metal layer connection pillar 53, the third metal micropillar 63 and the first metal layer 73 are connected and conducted with each other, and gaps between these structures are fully encapsulated by the oxide encapsulation layer, so as to form a structure like reinforced concrete. As shown in FIGS. 2C and 2D, the oxide layer portions of the protective layer 92, the third oxide encapsulation layer 14, the second oxide encapsulation layer 24, the first through-vias 330, the first oxide encapsulation layer 44, the base metal oxide layer 54, the fourth oxide encapsulation layer 64, and the through-vias 730 are also connected, and staggered with the metal portions to form the concrete structure. Each of the top metal connection pillar layer 13 and the leaf-shaped structure 33 has a size larger than that of the second metal micropillar 23, so the second metal micropillars 23 can be placed therebetween. The second oxide encapsulation layer 24 and the first oxide encapsulation layer 44 are fully connected via the four first through-vias 330. The base metal connection pillar layer 53 has a size larger than that of the first metal micropillar 43 and the third metal micropillar 63, so the first metal micropillar 43 can be disposed on the base metal connection pillar layer 53 and the third metal micropillar 63 can be disposed under the base metal connection pillar layer 53.

As shown in FIGS. 2A and 2D, it is obvious that the metal layers are connected with each other, and the oxide layers are connected with each other. In the support pillar, the protective layer, the cap, the support pillar body and the bottom pillar are connected with each other by the metal portions thereof, and the metal micropillars are encapsulated by the oxide layers, and the oxide layers are connected with each other through the through-vias, so as to form a staggered-hybrid structure. This structure is similar to the reinforced concrete and the oxide layer structures provides better flexibility and rigidity performance, compared with the structure with only metal pillars. Therefore, the support pillar of the present disclosure can support the movable component with better flexibility, rigidity, stability, and so on.

Please refer to FIGS. 3A through 3D which show other embodiment of the support pillar of the present disclosure. The difference between this embodiment and the previous embodiment is the base metal layer, and in this embodiment the base metal connection pillar layer 53 has four second through-vias 530. The base metal connection pillar layer 53 has a size greater than that of the first metal micropillar 43 and the third metal micropillar 63, so the first metal micropillars 43 can be totally disposed on the base metal connection pillar layer 53, and the third metal micropillars 63 can be totally disposed under the base metal connection pillar layer 53. The first oxide encapsulation layer 44 is fully filled in the four second through-vias 530. The other features of this embodiment are the same as that of the embodiment of FIGS. 2A through 2D, so their detailed descriptions are omitted.

Please refer to FIGS. 4A through 4D which show other embodiment of the support pillar of the present disclosure. The difference between this embodiment and previous embodiments is the structure of the top metal connection pillar layer 13, and in this embodiment the top metal connection pillar layer 13 includes five metal micropillars corresponding to the second metal micropillars 23. The top metal connection pillar layer 13 has a size larger than that the second metal micropillar 23 and can be fully connected with the second metal micropillars 23 correspondingly. Other features of this embodiment are the same as the embodiment of FIGS. 2A through 2D, so their detailed descriptions are omitted.

Please refer to FIGS. 5A through 5D which show other embodiment of the support pillar of the present disclosure. The difference between this embodiment and the previous embodiments is the structure of the top metal connection pillar layer 13, and in this embodiment the top metal connection pillar layer 13 has five metal micropillars corresponding to the second metal micropillars 23. The top metal connection pillar layer 13 has a size larger than the second metal micropillars 23, so the second metal micropillars 23 can be fully connected with the top metal connection pillar layer 13. Other features of this embodiment are the same as that of the embodiment of FIGS. 3A through 3D, so their detailed descriptions are omitted.

Figure 6A:
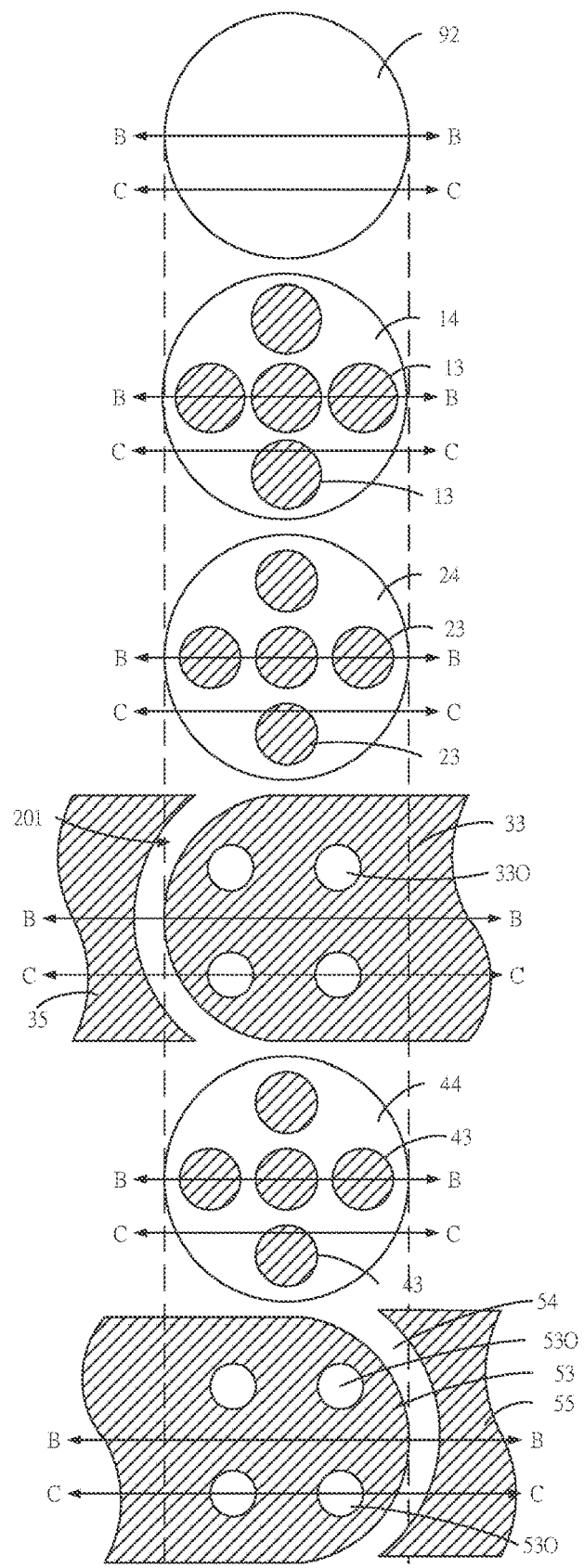
FIGS. 6A through 6C show another embodiment of structure of the support pillar of FIGS. 1A and 1B, respectively.
Figure 6B:
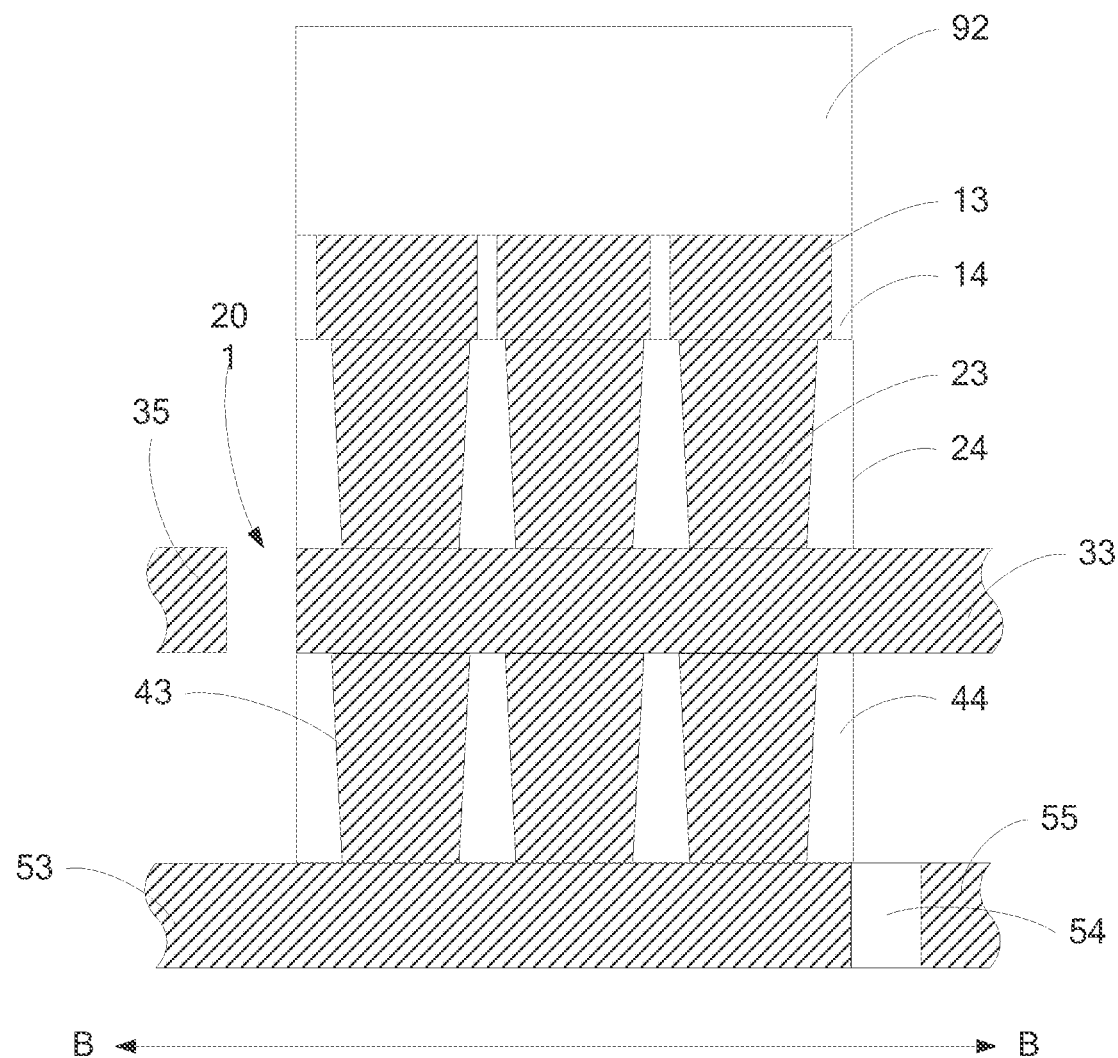
Figure 6C:
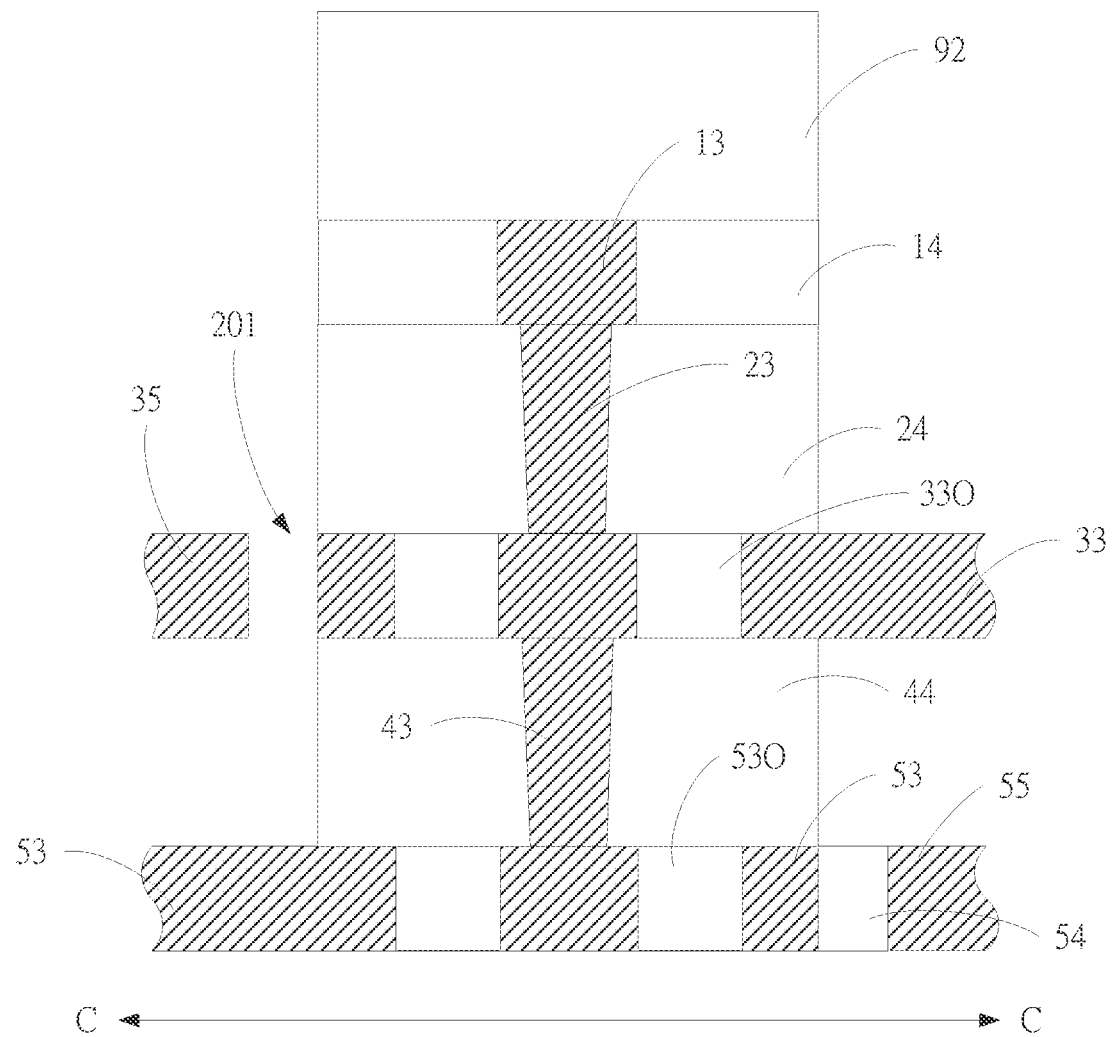

Please refer to FIGS. 6A through 6C which show other embodiment of the support pillar of the present disclosure. The difference between this embodiment and the previous embodiments of FIGS. 4A through 4D and FIGS. 5A through 5D is the base metal layer, and in this embodiment the base metal connection pillar layer 53 directly functions as the conductor layer and has four second through-vias 530. Other features of this embodiment are the same as that of the embodiments of FIGS. 4A through 4D and FIGS. 5A through 5D, so their detailed descriptions are omitted.

Figure 7A:
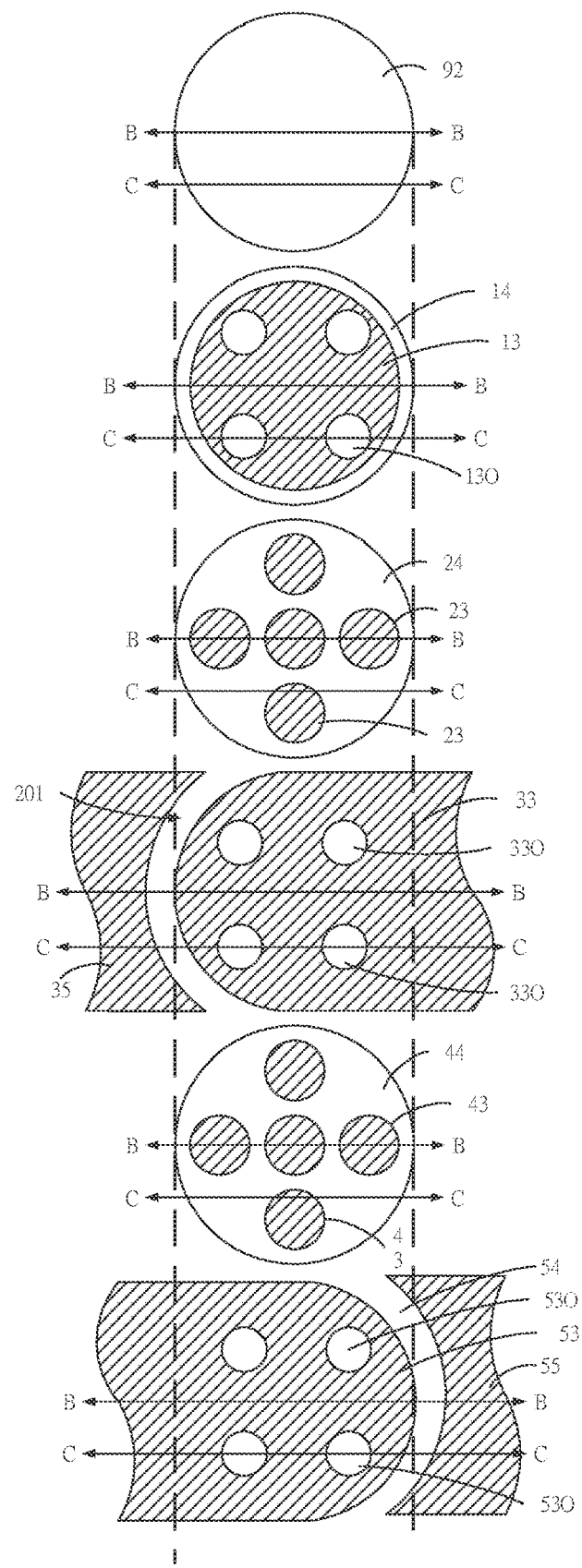
FIGS. 7A through 7C show another embodiment of structure of the support pillar of FIGS. 1A and 1B, respectively.
Figure 7B:
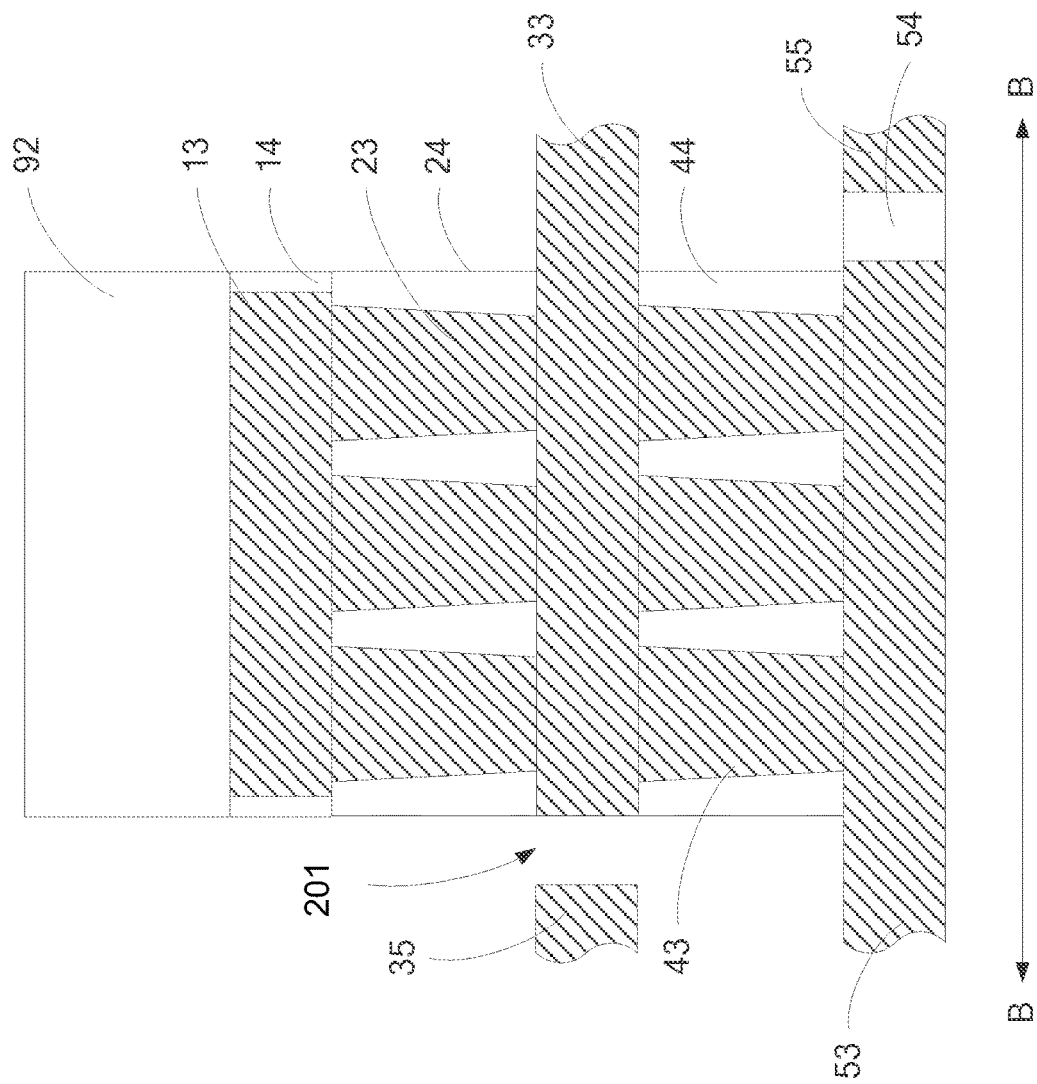
Figure 7C:
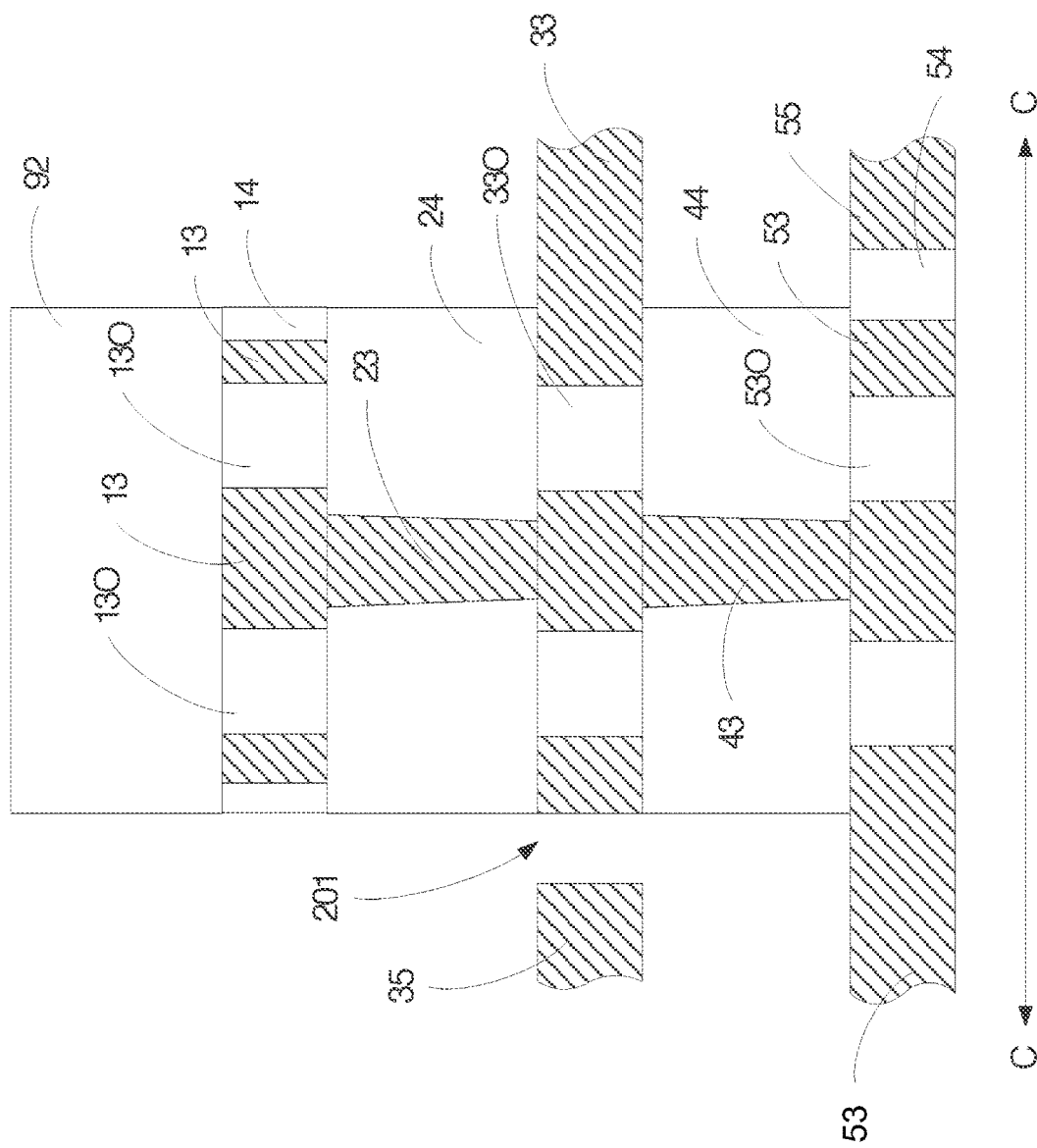

Please refer to FIGS. 7A through 7C which show other embodiment of the support pillar of the present disclosure. The difference between this embodiment and the embodiments of FIGS. 2A through 2D and FIGS. 3A and 3D is the base metal layer, and in this embodiment the base metal connection pillar layer 53 is directly connected, functions as the conductor layer and has four second through-vias 530. Other features of this embodiment are the same as that of the embodiments of FIGS. 2A through 2D and FIGS. 3A through 3D, so their detailed descriptions are omitted.

In FIGS. 6A through 6C and FIGS. 7A through 7C, the bottom pillars of the embodiments are not illustrated, but the bottom pillars can be made in the same way to provide auxiliary support.

The support pillar body is formed by a plurality of first metal micropillars 43, the base metal connection pillar layer 53, and the first oxide encapsulation layer 44. The cap is formed by at least one second metal micropillar 23, a top metal connection pillar layer 13 and a second oxide encapsulation layer 24. The bottom pillar is formed by at least one third metal micropillar 63, a bottom metal connection pillar layer 73, and the fourth oxide encapsulation layer 64.

Figure 8A:
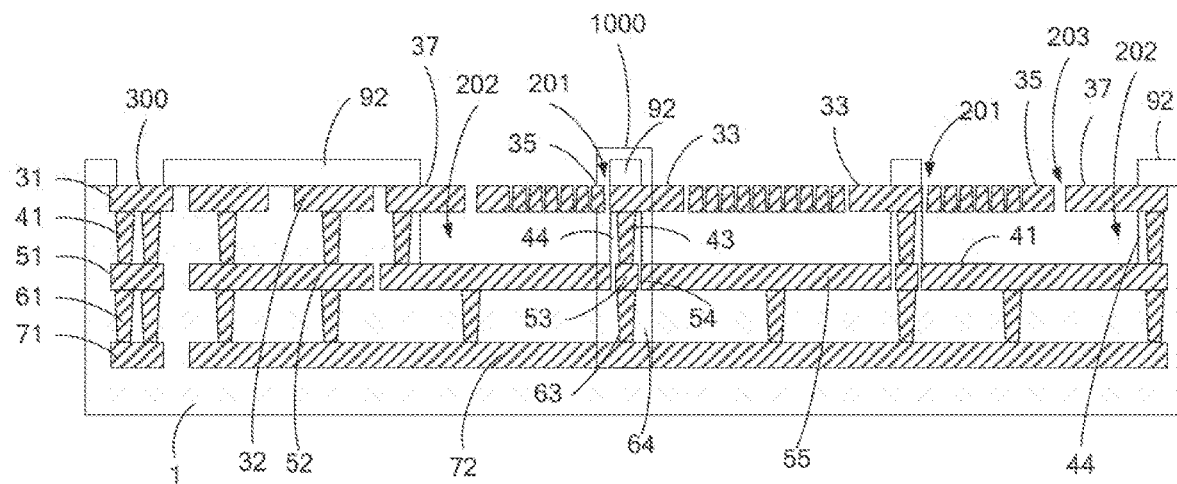
FIGS. 8A and 8B are cross section view and top view of an embodiment of the sensor chip having the movable component with the support pillar without cap structure, in accordance with the present disclosure.
Figure 8B:
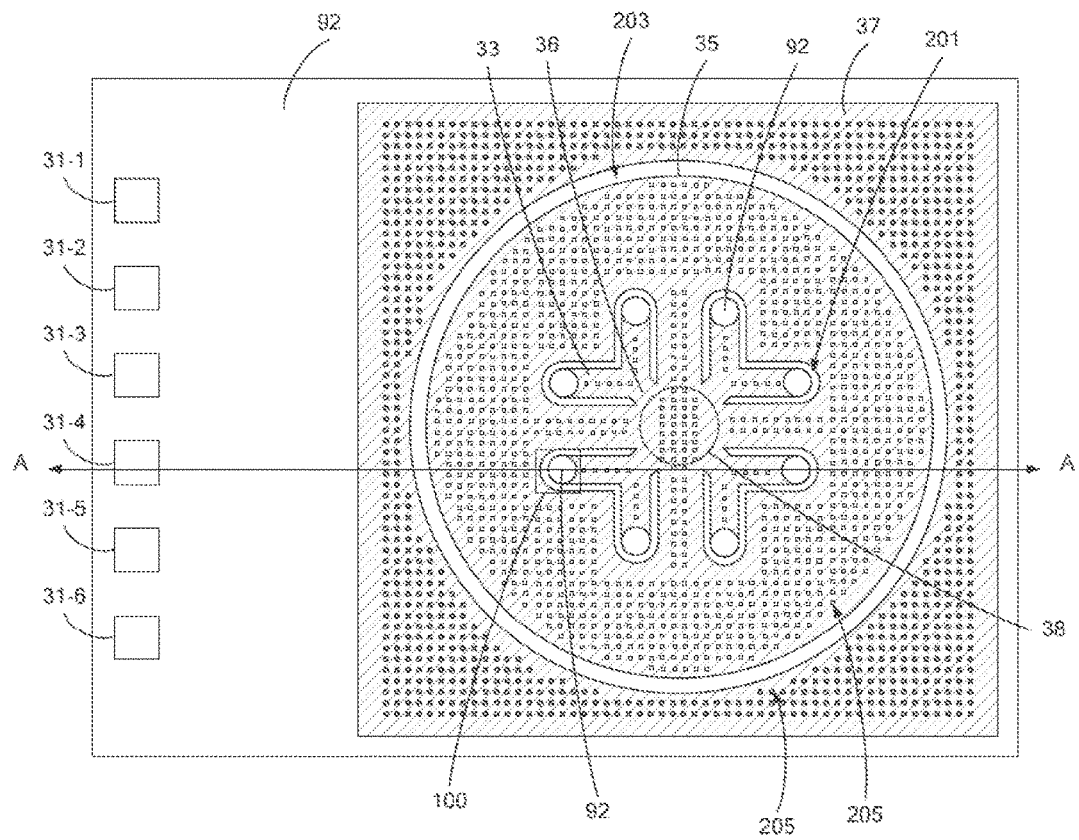

Please refer to FIGS. 8A and 8B which show other embodiment of the support pillar without cap structure. Compared with the embodiment of FIGS. 1A and 1B, the embodiment shown in FIGS. 8A and 8B is not provided with the cap structure, so the metal layer for the cap structure can be omitted and three metal layers are just required to manufacture the integrated circuit in which the CMOS movable component is integrated with the control chip. Due to lack of the cap structure, the pads 31-1, 31-2, 31-3, 31-4, 31-5 and 31-6 shown in FIG. 8B respectively correspond to the pads 11-1, 11-2, 11-3, 11-4, 11-5 and 11-6 shown in FIG. 1B. Other features of this embodiment are the same as that of the embodiment of FIGS. 1A and 1B, so their detailed descriptions are omitted.

Figure 9A:
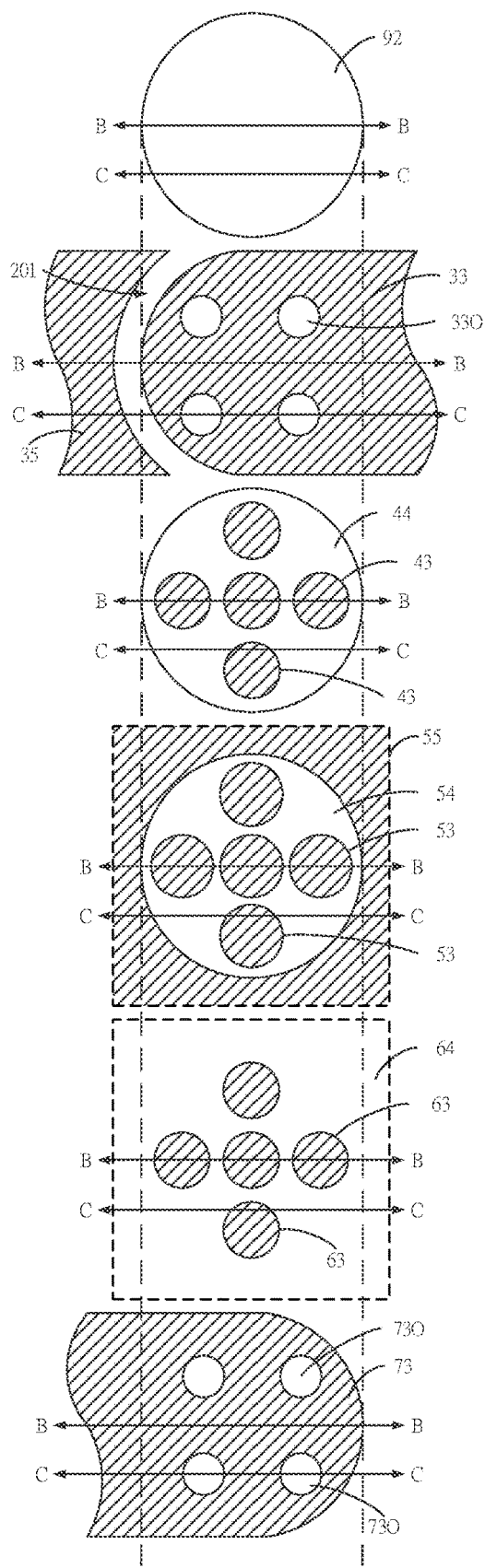
FIGS. 9A through 9C show other embodiment of the support pillar of the present disclosure, corresponding to the FIGS. 8A and 8B.
Figure 9B:
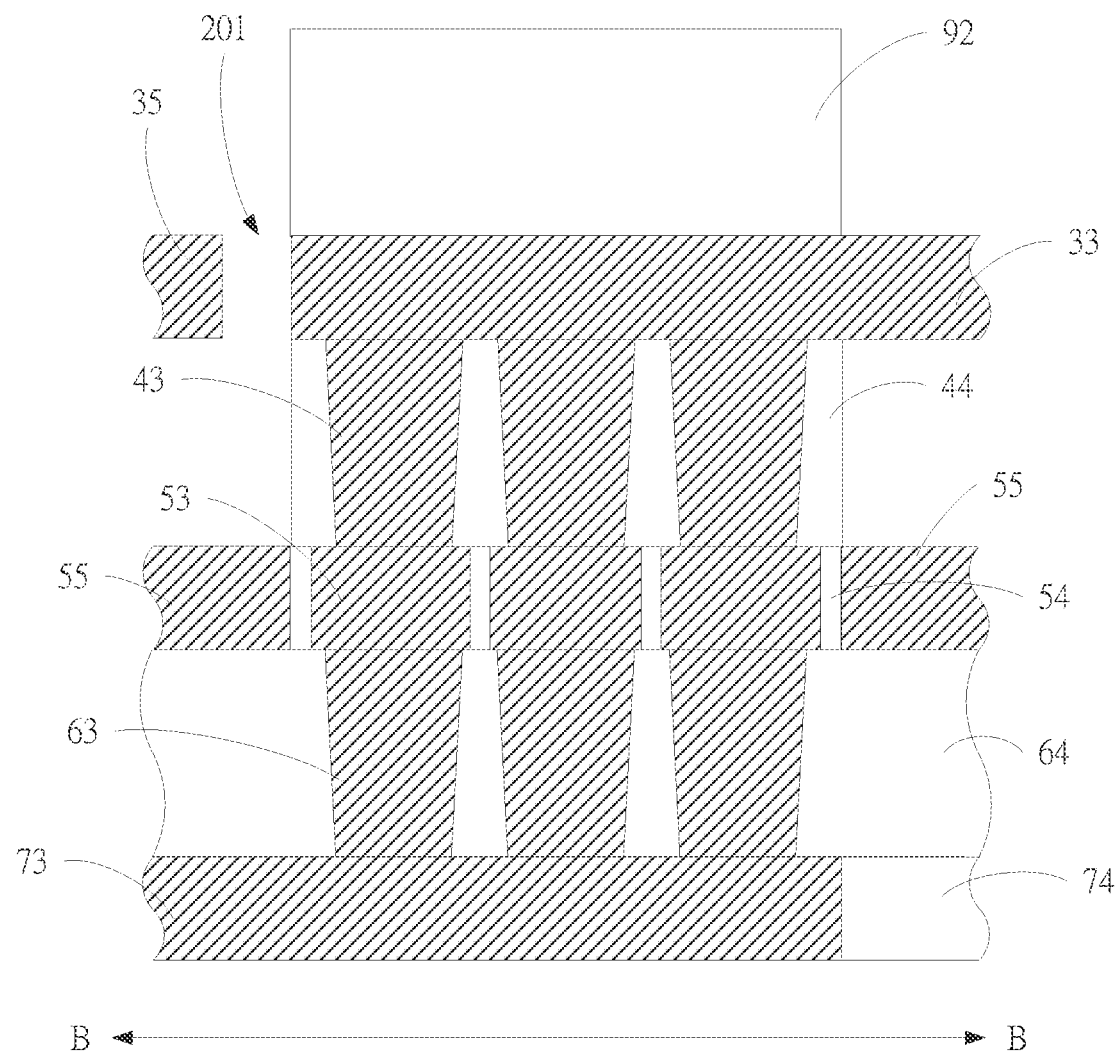
Figure 9C:
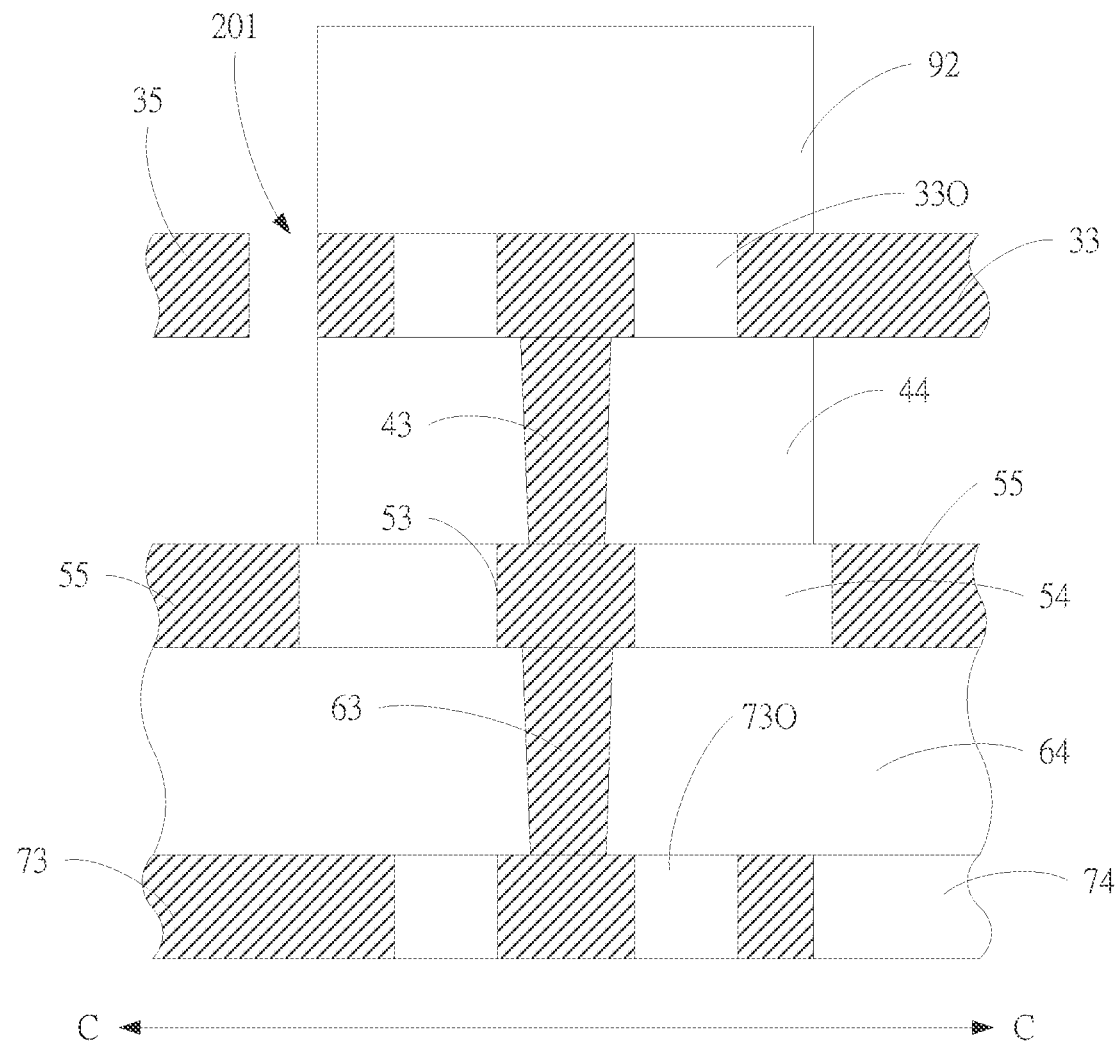

Please refer to FIGS. 9A through 9C which show other embodiment of the structure of the support pillar of the present disclosure. This embodiment is lack of cap structure, and has other features the same as that of embodiments of FIGS. 2A and 2D and FIGS. 3A and 3D, so their detailed description are omitted.

Figure 10A:
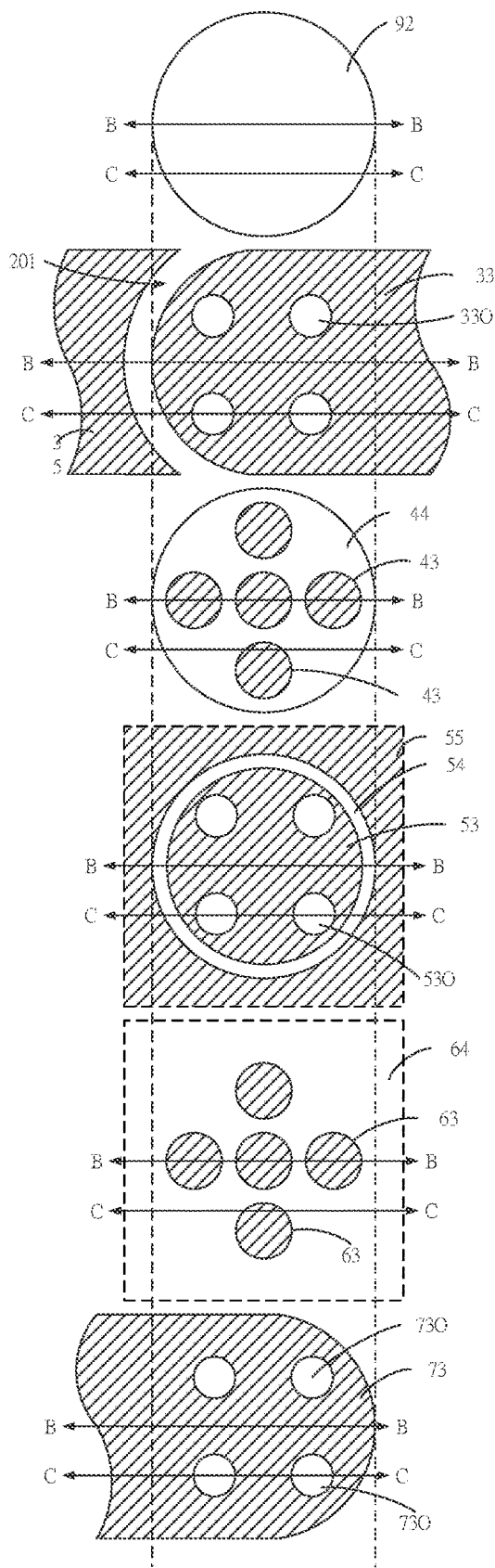
FIGS. 10A through 10C show other embodiment of the support pillar of the present disclosure, corresponding to the FIGS. 8A and 8B.
Figure 10B:
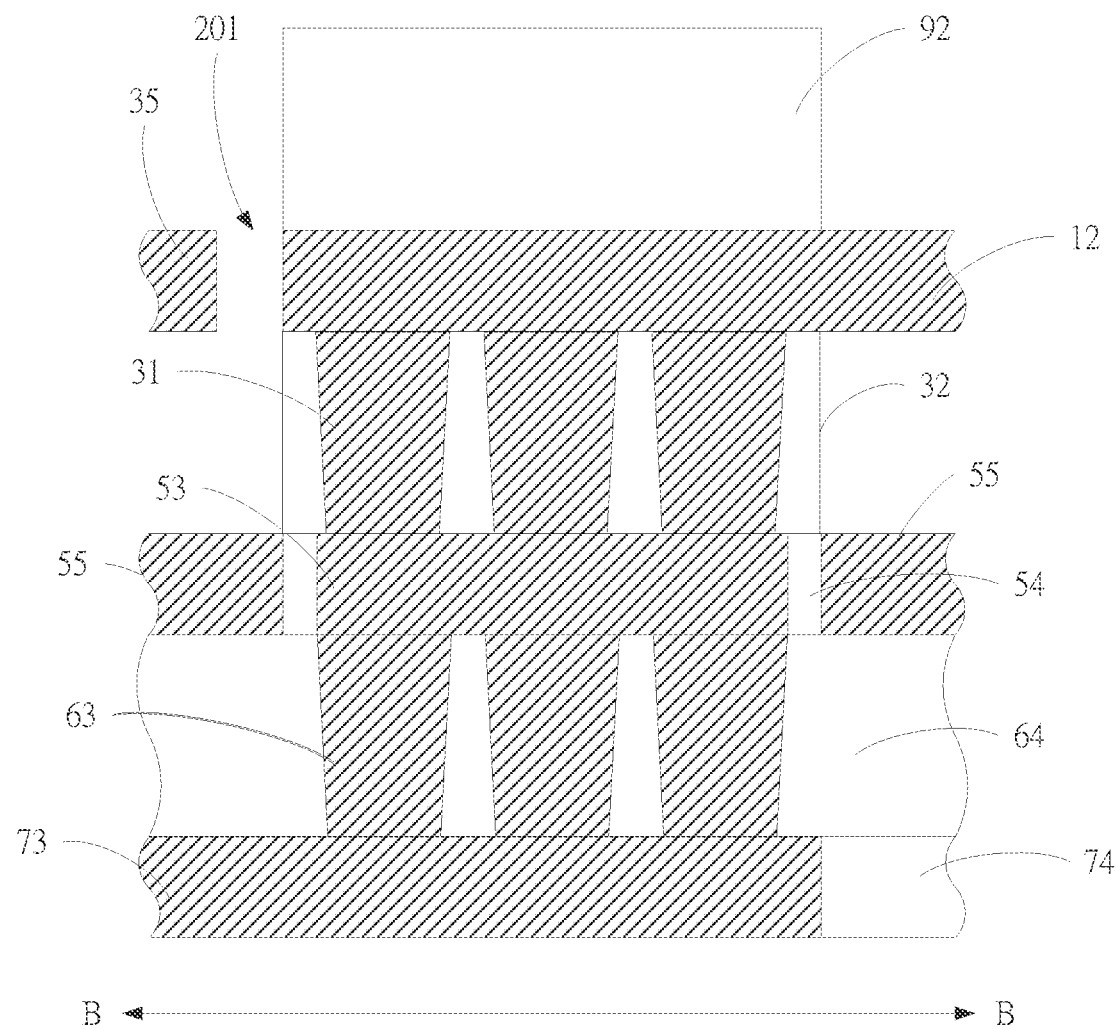
Figure 10C:
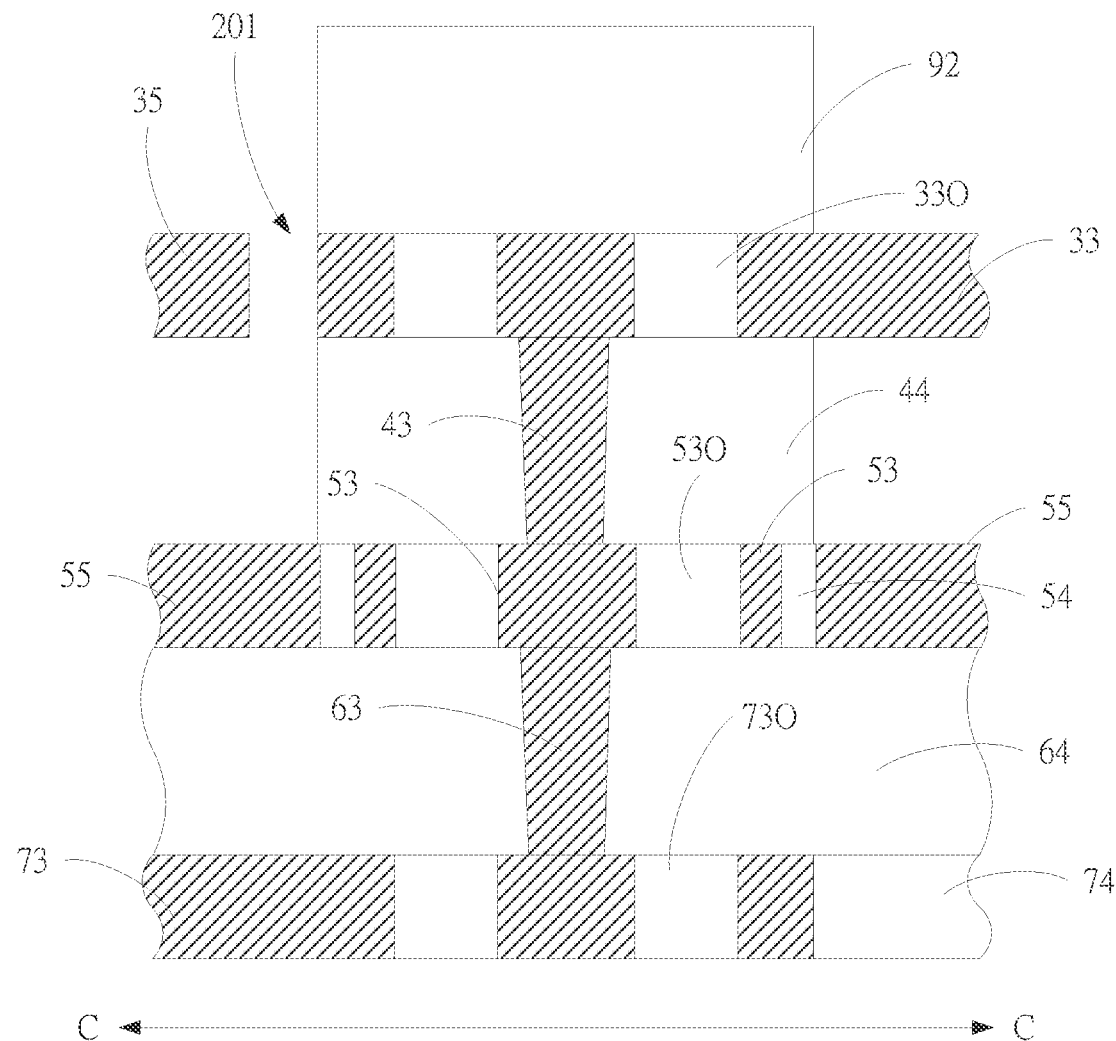

Please refer to FIGS. 10A through 10C which show other embodiment of the structure of the support pillar of the present disclosure, and this embodiment corresponds to the embodiments of FIGS. 8A and 8B. This embodiment is lack of the cap structure and has other features the same as that of embodiments of FIGS. 4A and 4D and FIGS. 5A and 5D, so their detailed descriptions are omitted.

Figure 11A:
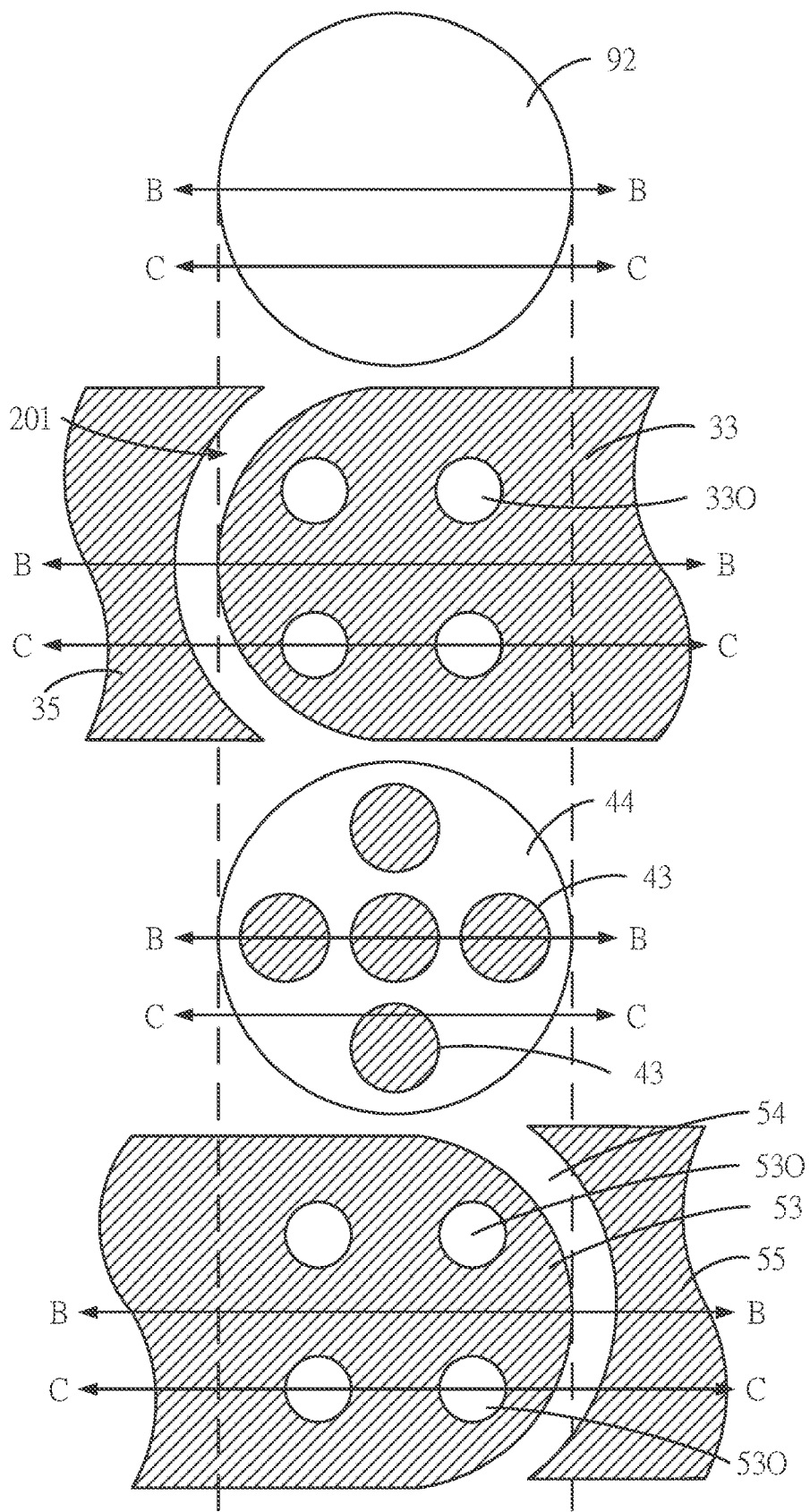
FIGS. 11A through 11C show other embodiment of the support pillar of the present disclosure, corresponding to the FIGS. 8A and 8B.
Figure 11B:
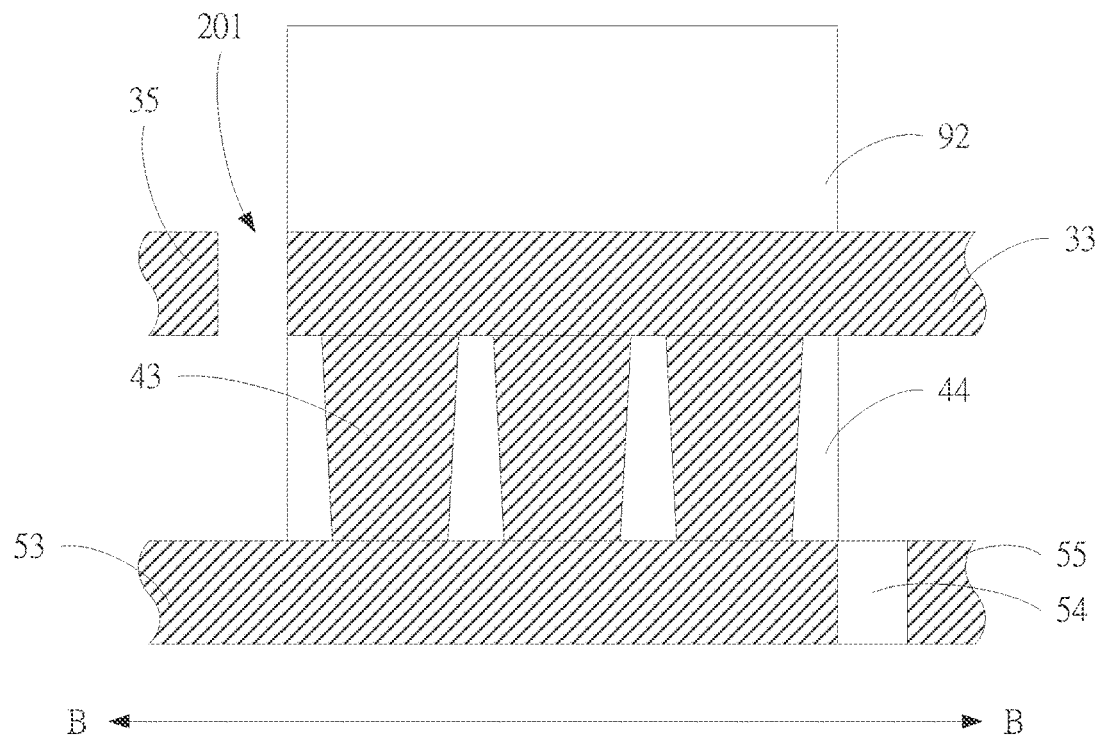
Figure 11C:
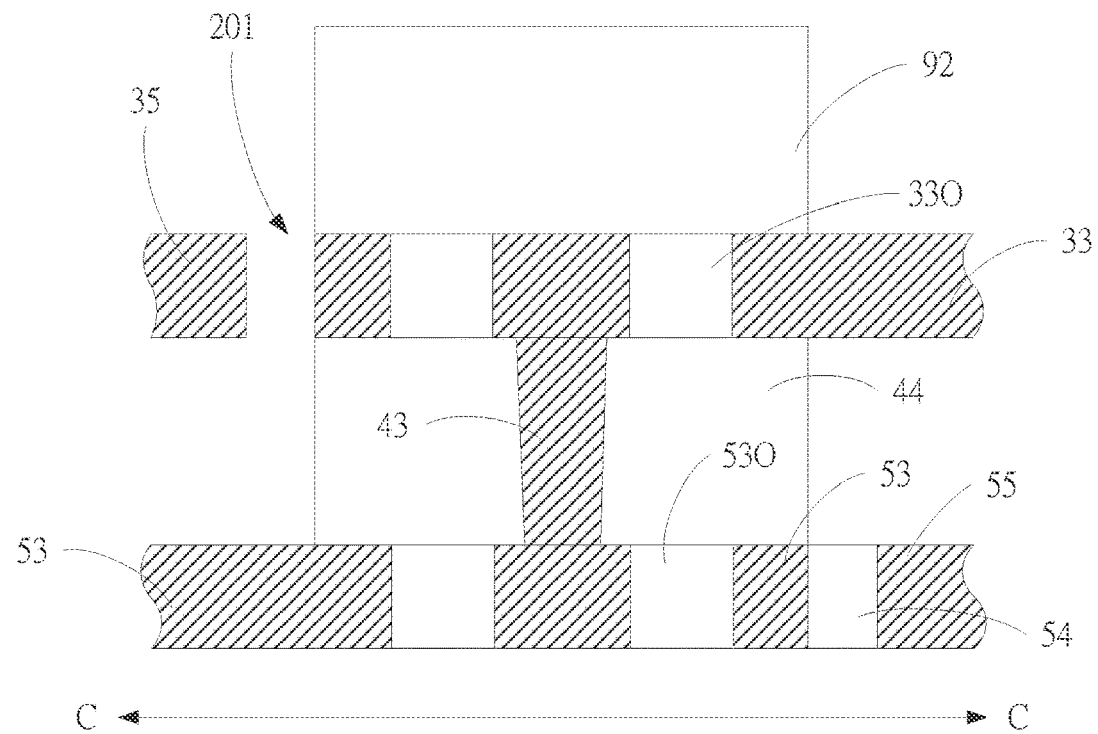

Please refer to FIGS. 11A through 11C which show other embodiment of the structure of the support pillar of the present disclosure, and this embodiment corresponds to the embodiments of FIGS. 8A and 8B. This embodiment is lack of the cap structure and has other features the same as that of embodiments of FIGS. 6A and 6D and FIGS. 7A and 7D, so their detailed descriptions are omitted.

Figure 12A:
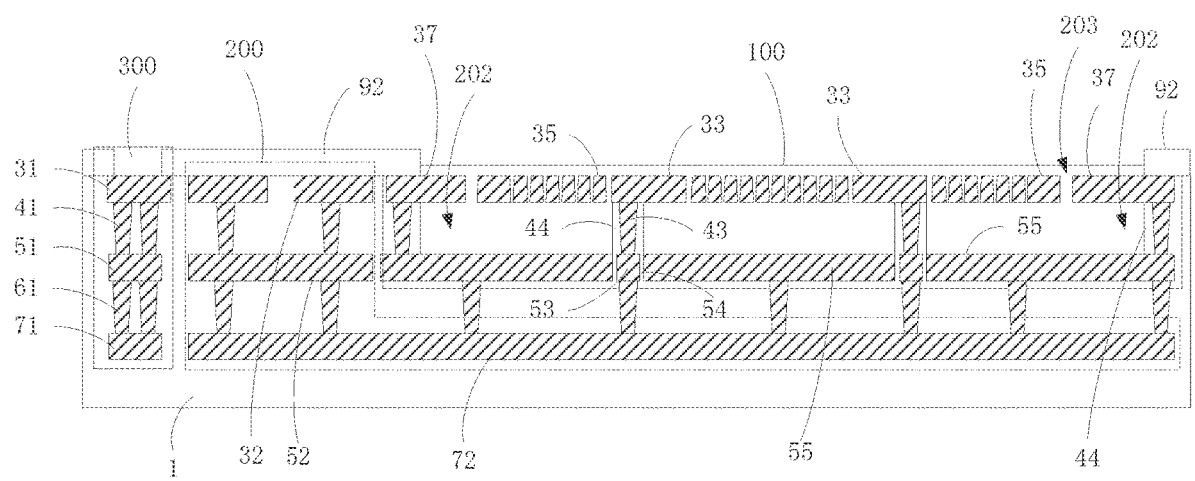
FIGS. 12A through 12C show other embodiment of the support pillar without cap structure, in accordance with the present disclosure.
Figure 12B:
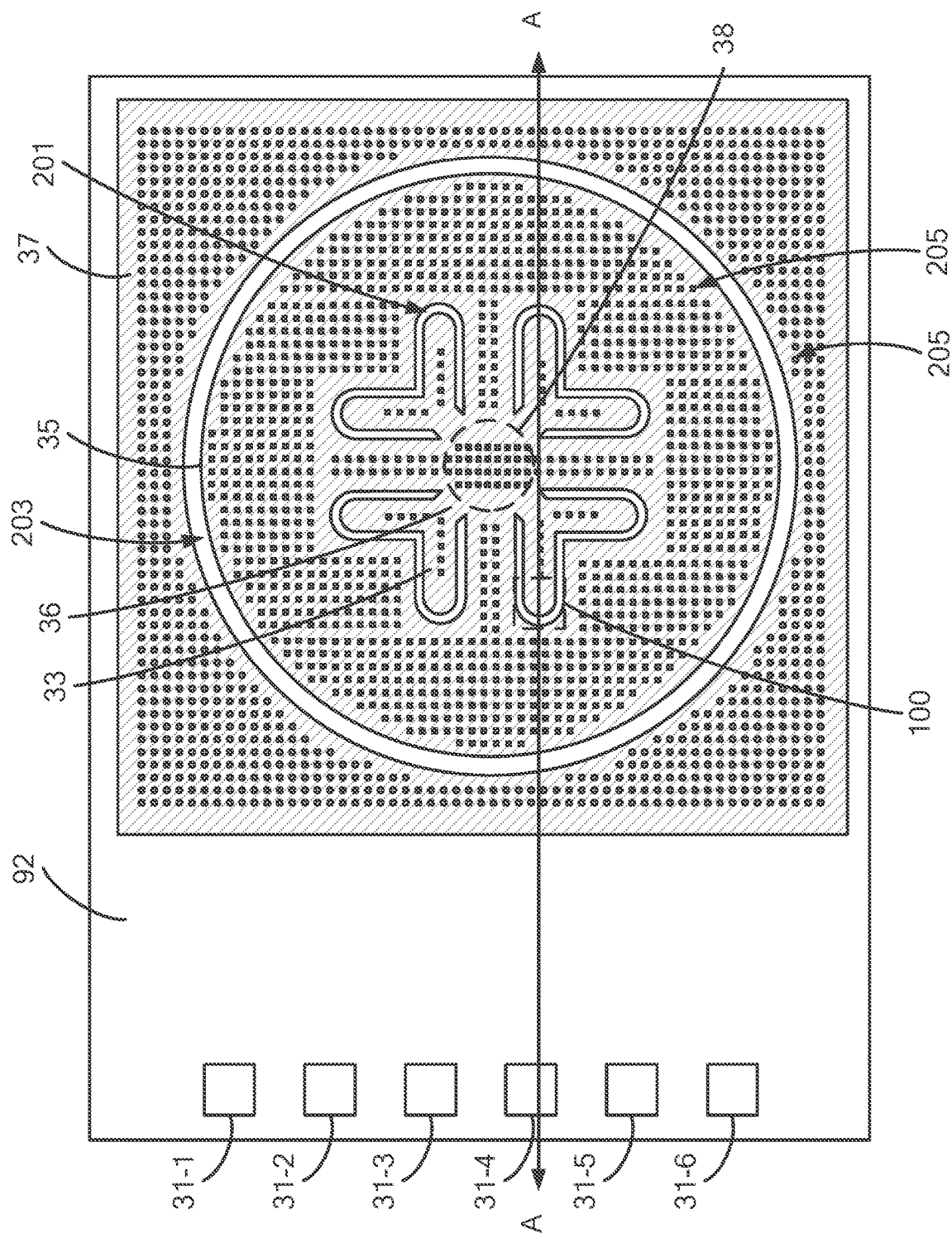

Please refer to FIGS. 12A and 12B which show another embodiment without the cap structure, in accordance with the present disclosure. Compared with the embodiment of FIGS. 8A and 8B, the top side of the leaf-shaped structure 33 of the embodiment of FIGS. 12A and 12B is not encapsulated by the protective layer 92. Other features of the embodiment of FIGS. 12A and 12B are the same as that of embodiment of FIGS. 8A and 8B, so their detailed descriptions are omitted.

Figure 13A:
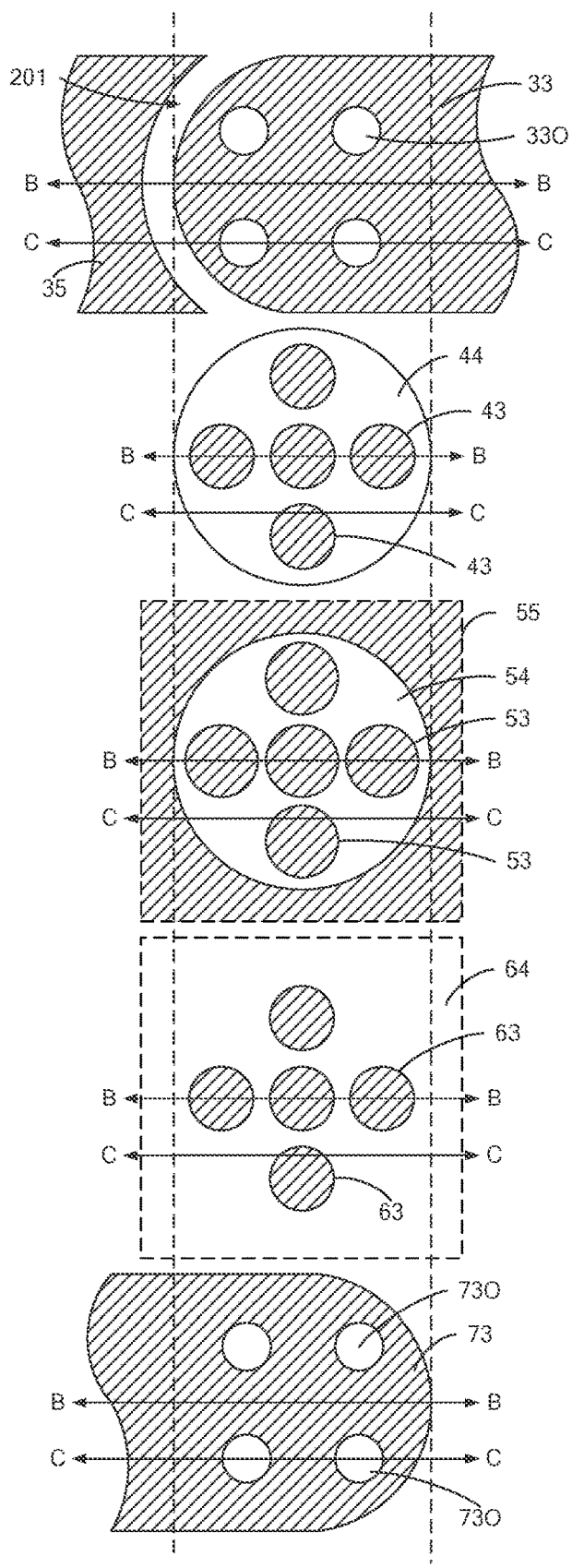
FIGS. 13A through 13C show other embodiment of the support pillar of the present disclosure, corresponding to the FIGS. 12A and 12B.
Figure 13B:
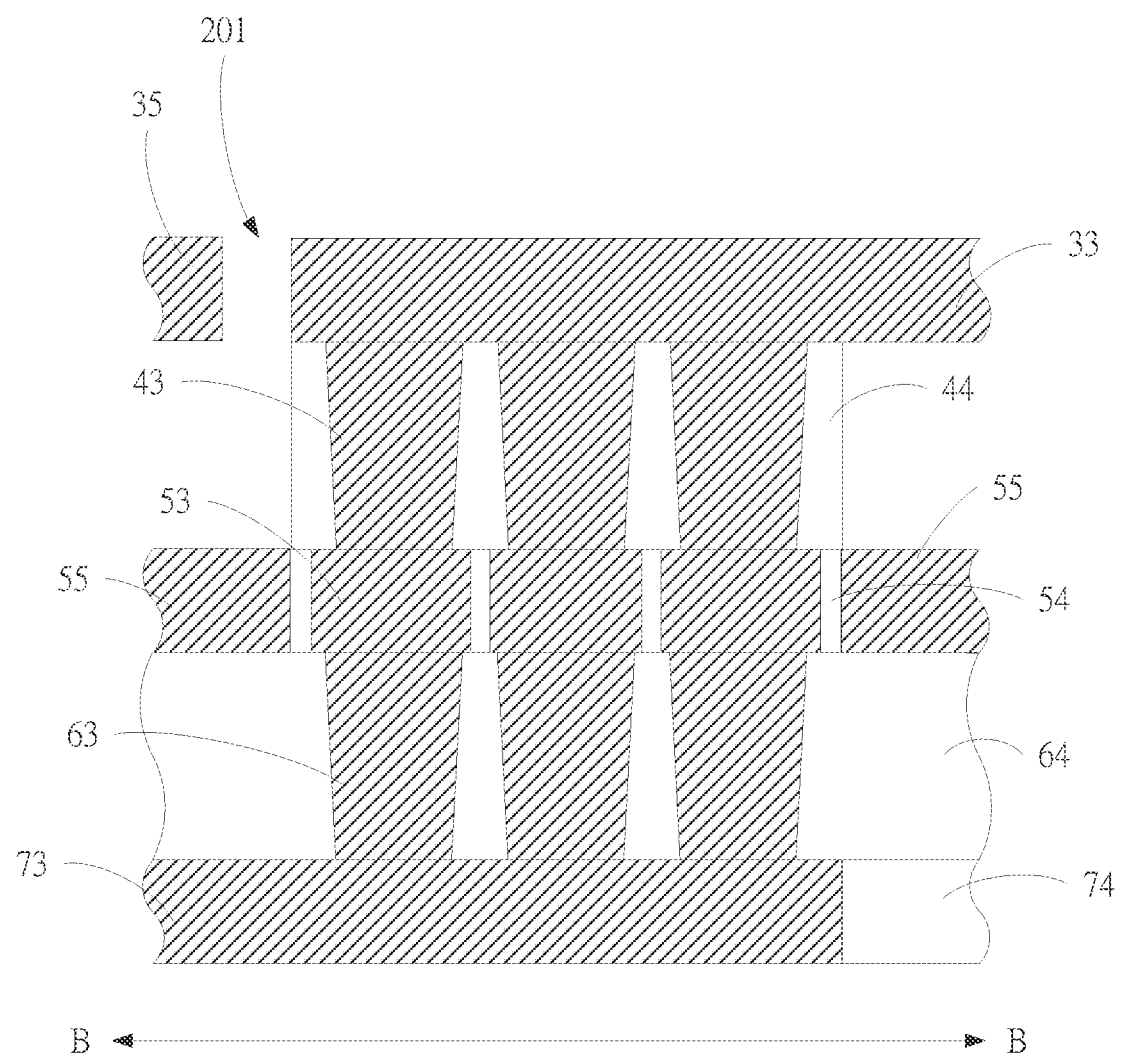
Figure 13C:
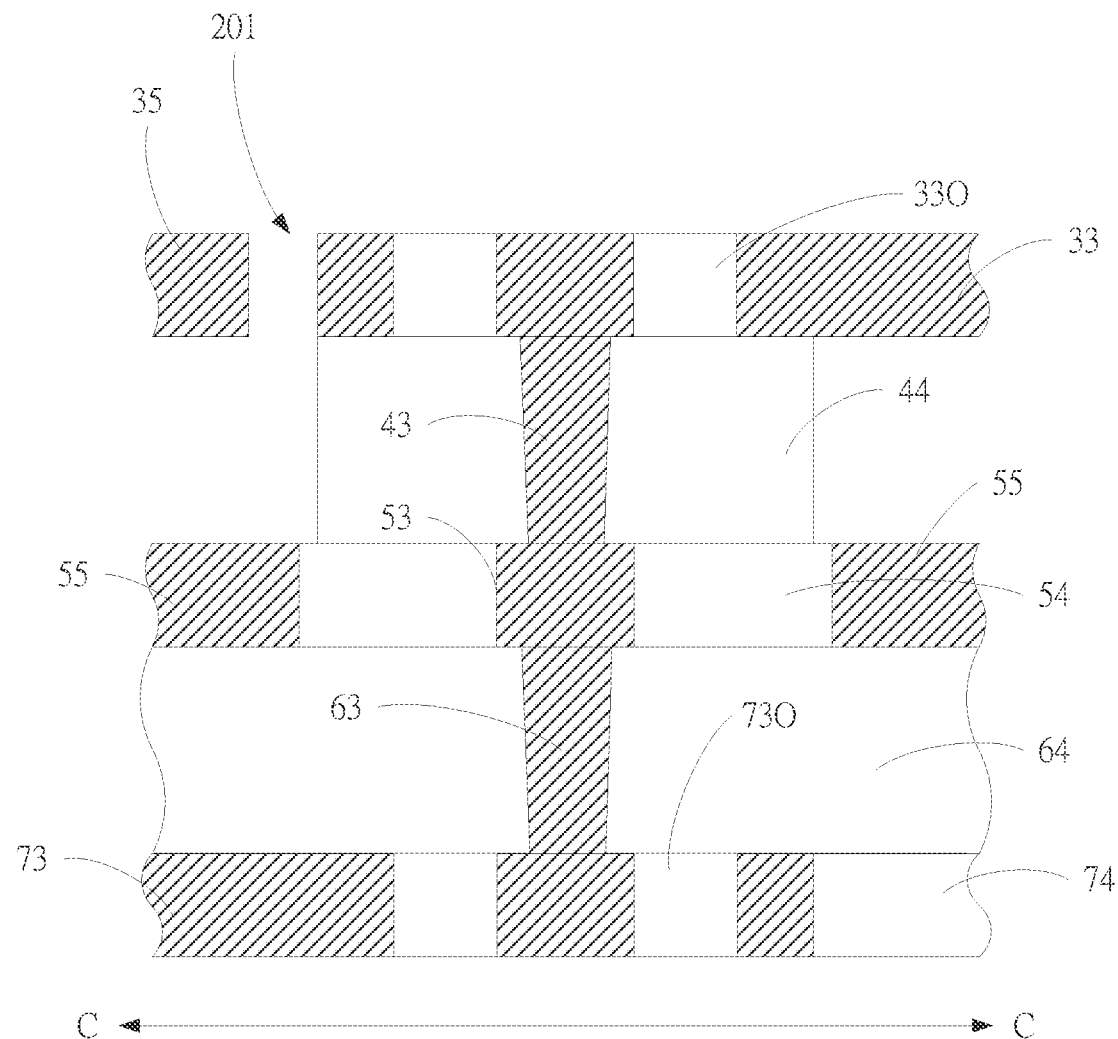

Please refer to FIGS. 13A through 13C which show other embodiment of the structure of the support pillar of the present disclosure, and this embodiment corresponds to the embodiments of FIGS. 8A and 8B. This embodiment is lack of the protective layer 92 and has other features the same as that of embodiments of FIGS. 9A and 9C, so their detailed descriptions are omitted.

Figure 14A:
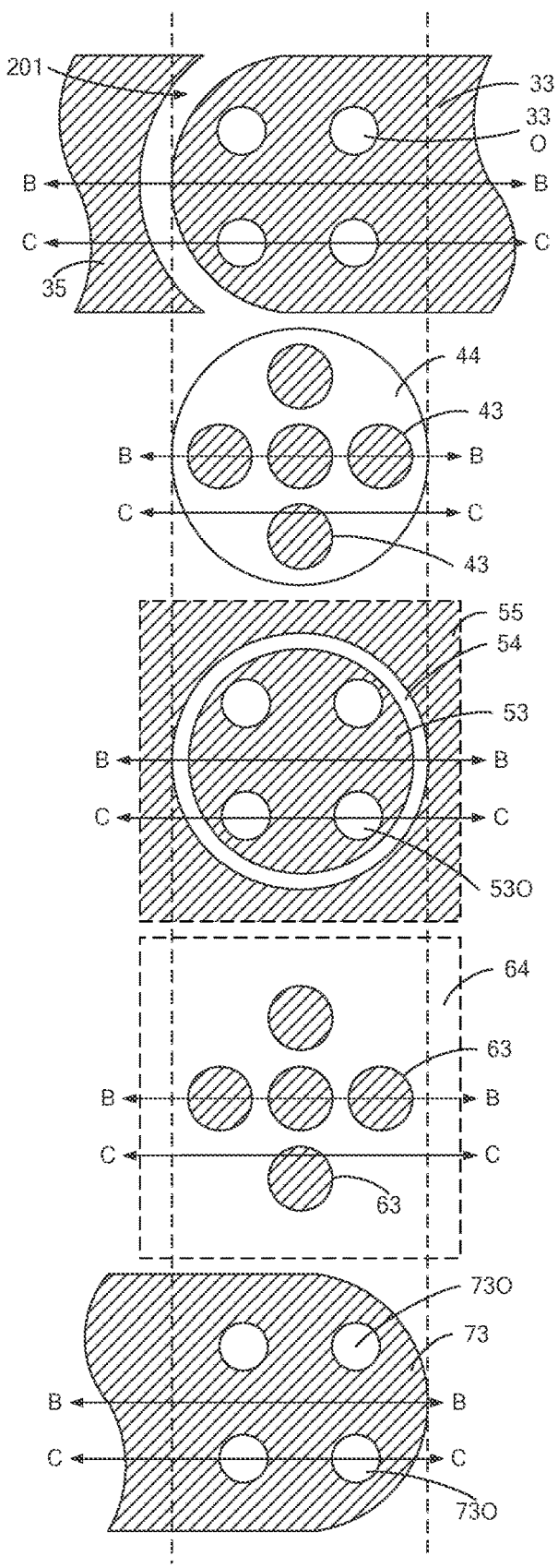
FIGS. 14A through 14C show other embodiment of the support pillar of the present disclosure, corresponding to the FIGS. 12A and 12B.
Figure 14B:
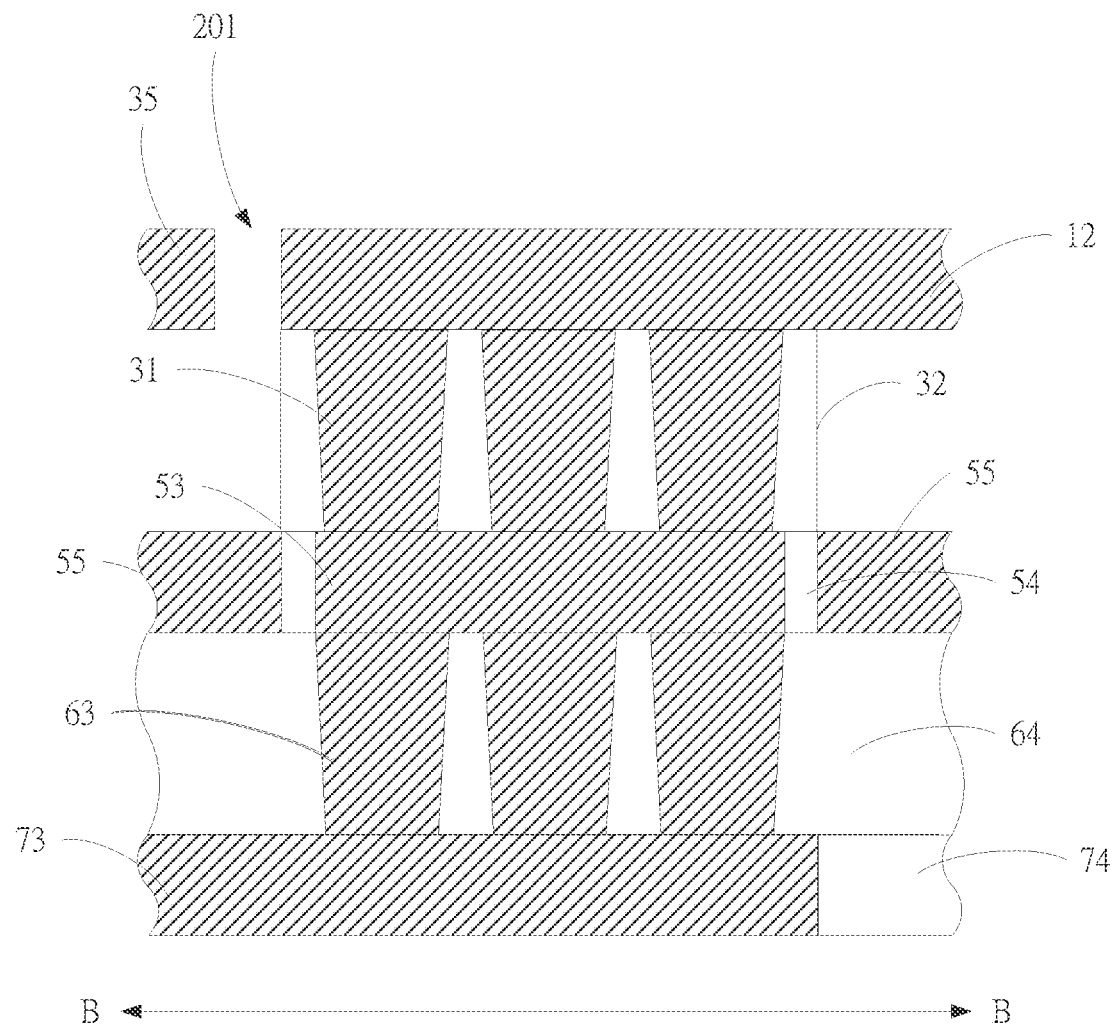
Figure 14C:
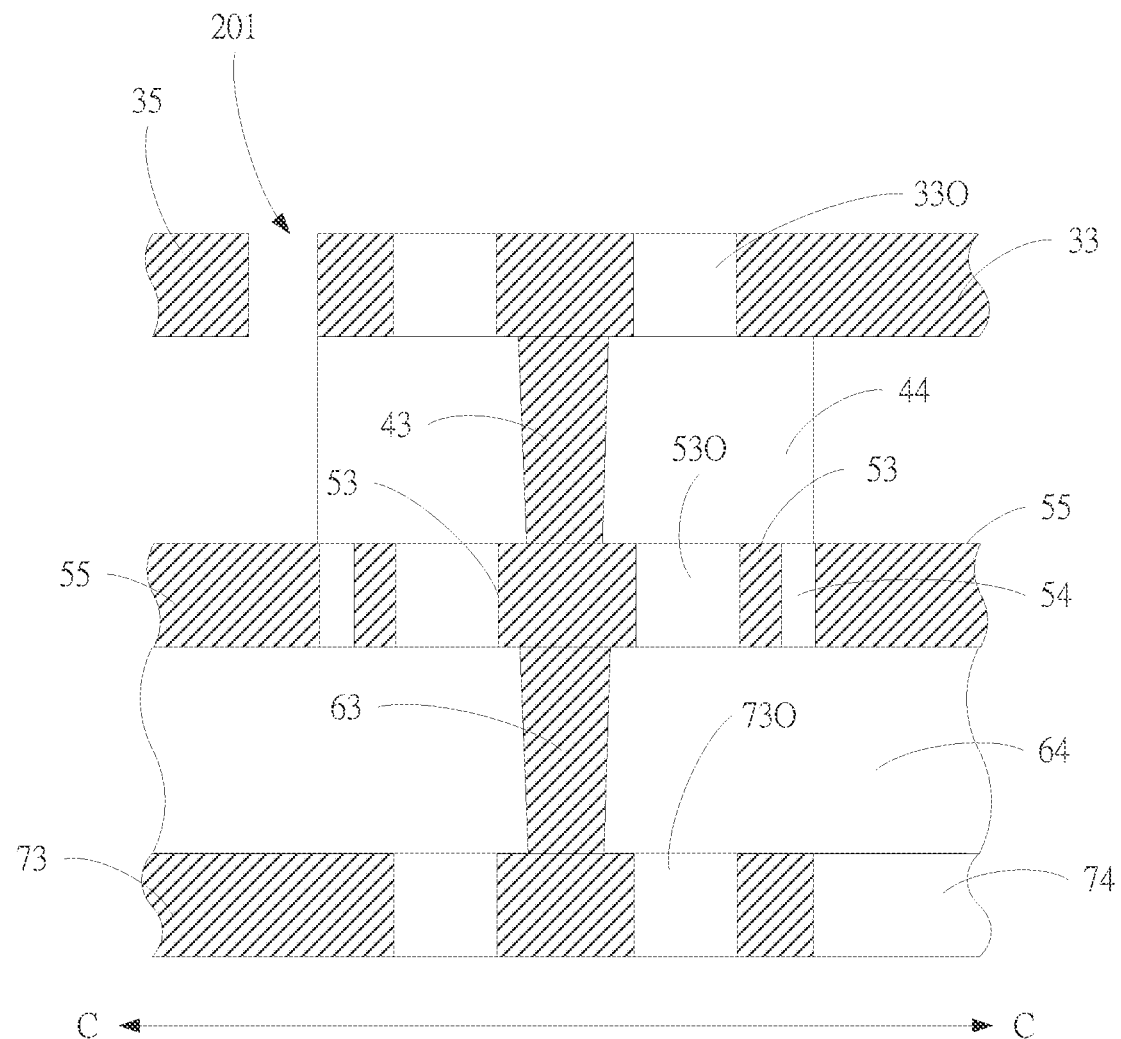

Please refer to FIGS. 14A through 14C which show other embodiment of the structure of the support pillar of the present disclosure, and this embodiment corresponds to the embodiments of FIGS. 8A and 8B. This embodiment is lack of the protective layer 92, and has other features the same as that of embodiments of FIGS. 10A through 10C, so their detailed descriptions are omitted.

Figure 15A:
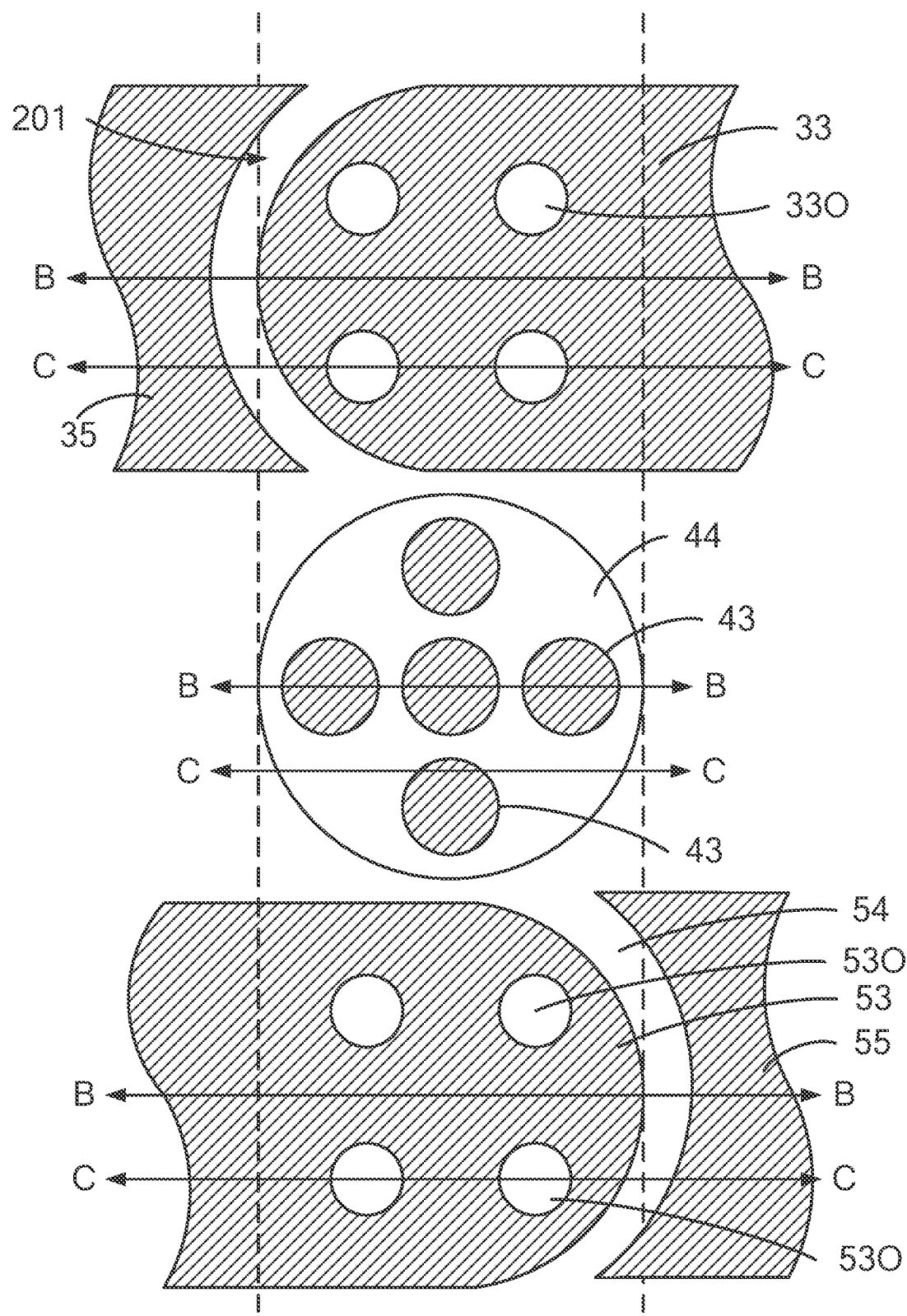
FIGS. 15A through 15C show other embodiment of the support pillar of the present disclosure, corresponding to the FIGS. 12A and 12B.
Figure 15B:
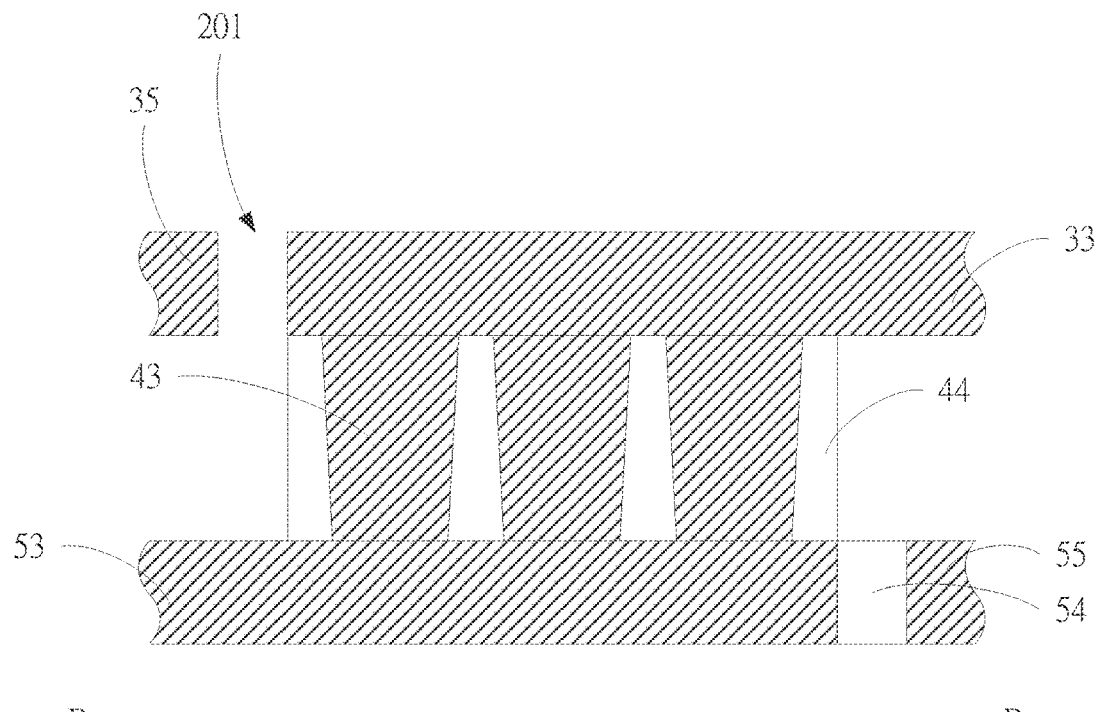
Figure 15C:
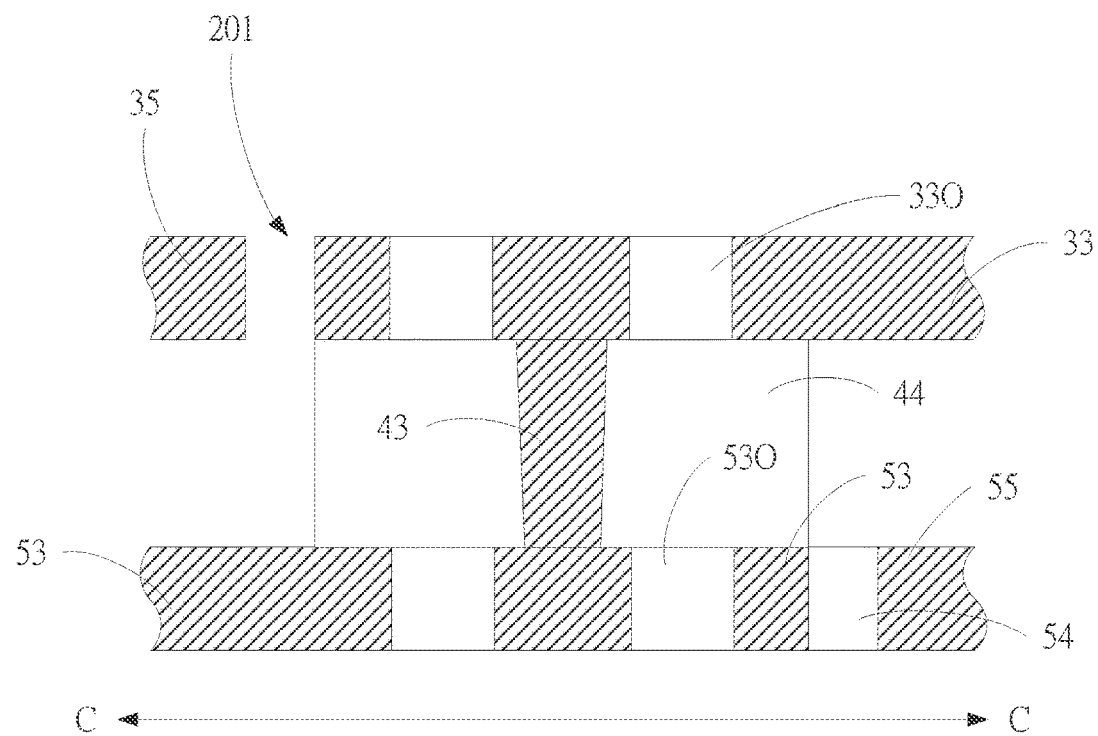

Please refer to FIGS. 15A through 15C which show other embodiment of the structure of the support pillar of the present disclosure, and this embodiment corresponds to the embodiments of FIGS. 8A and 8B. This embodiment is lack of the protective layer 92 and has other features the same as that of embodiments of FIGS. 11A through 11C, so their detailed descriptions are omitted.

Figure 16A:
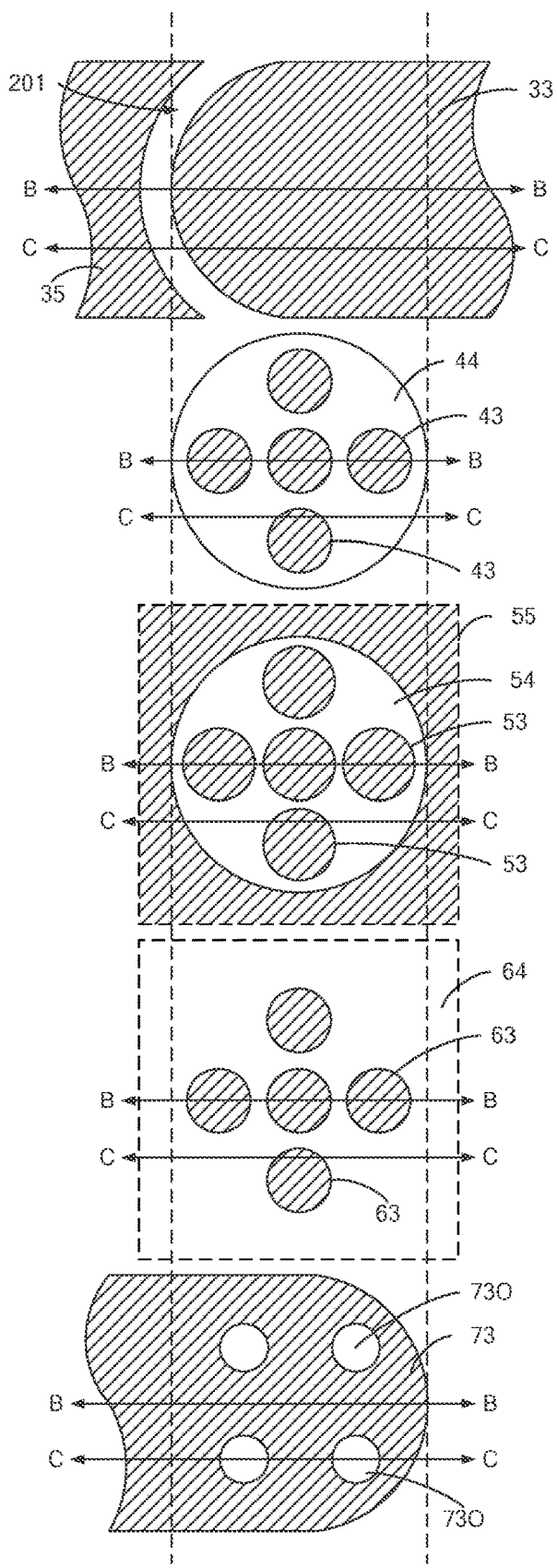
FIGS. 16A through 16C show other embodiment of the support pillar of the present disclosure, corresponding to the FIGS. 12A and 12B.
Figure 16B:
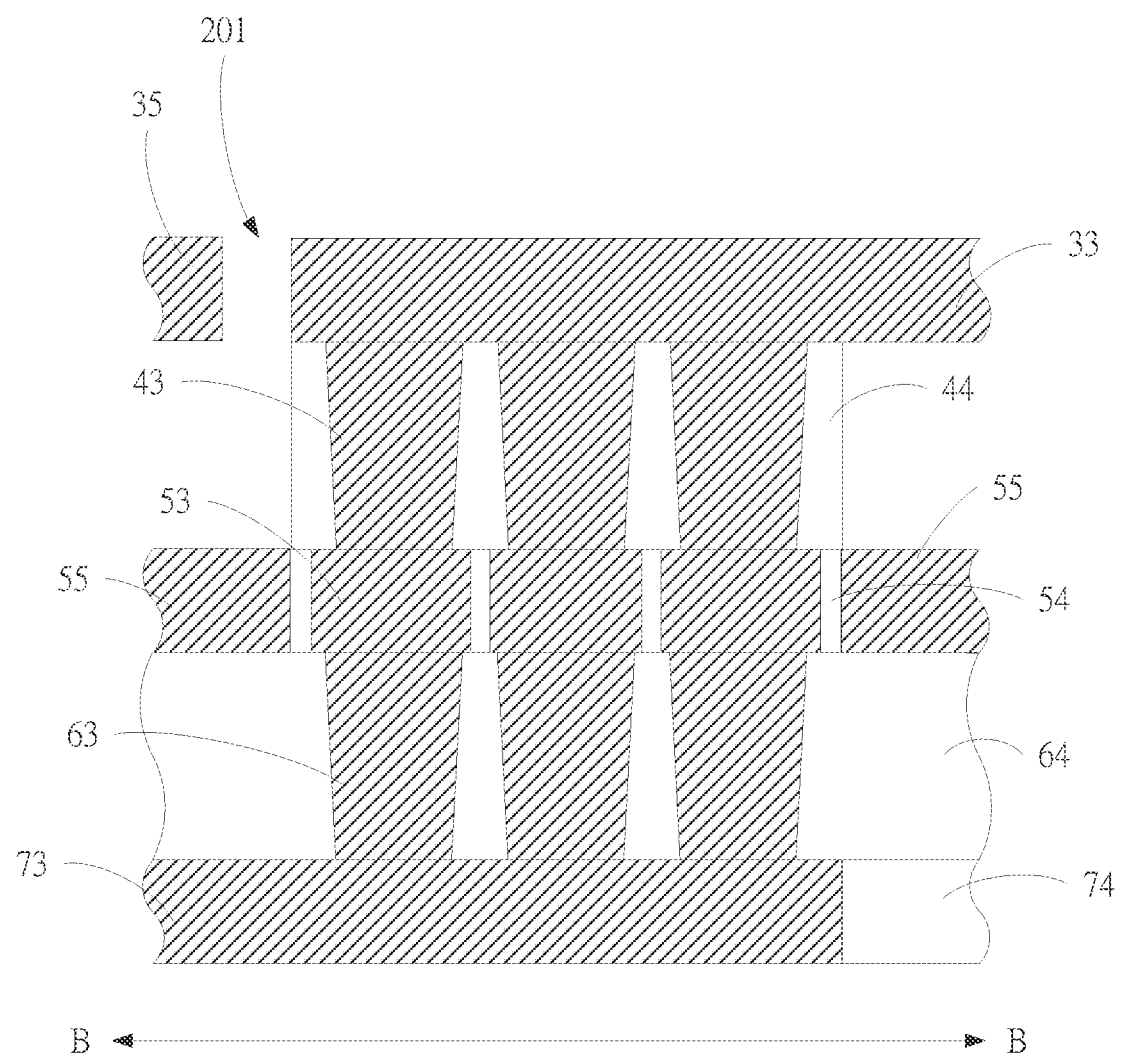
Figure 16C:
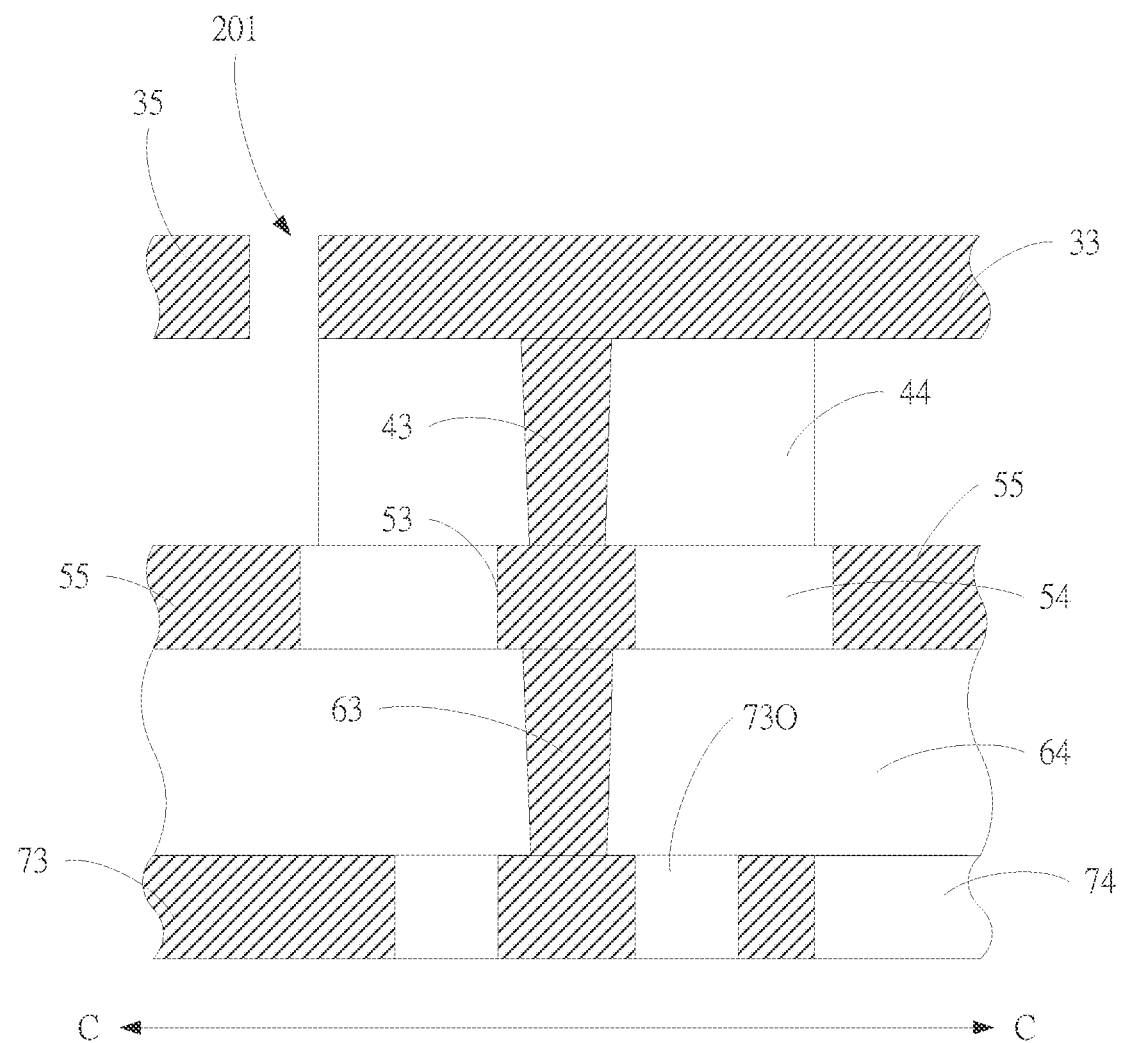

Please refer to FIGS. 16A through 16C which show other embodiment of the structure of the support pillar of the present disclosure, and this embodiment corresponds to the embodiments of FIGS. 8A and 8B. This embodiment is lack of the first through-vias 330 and has other features the same as that of embodiments of FIGS. 13A through 13C, so their detailed descriptions are omitted.

Figure 17A:
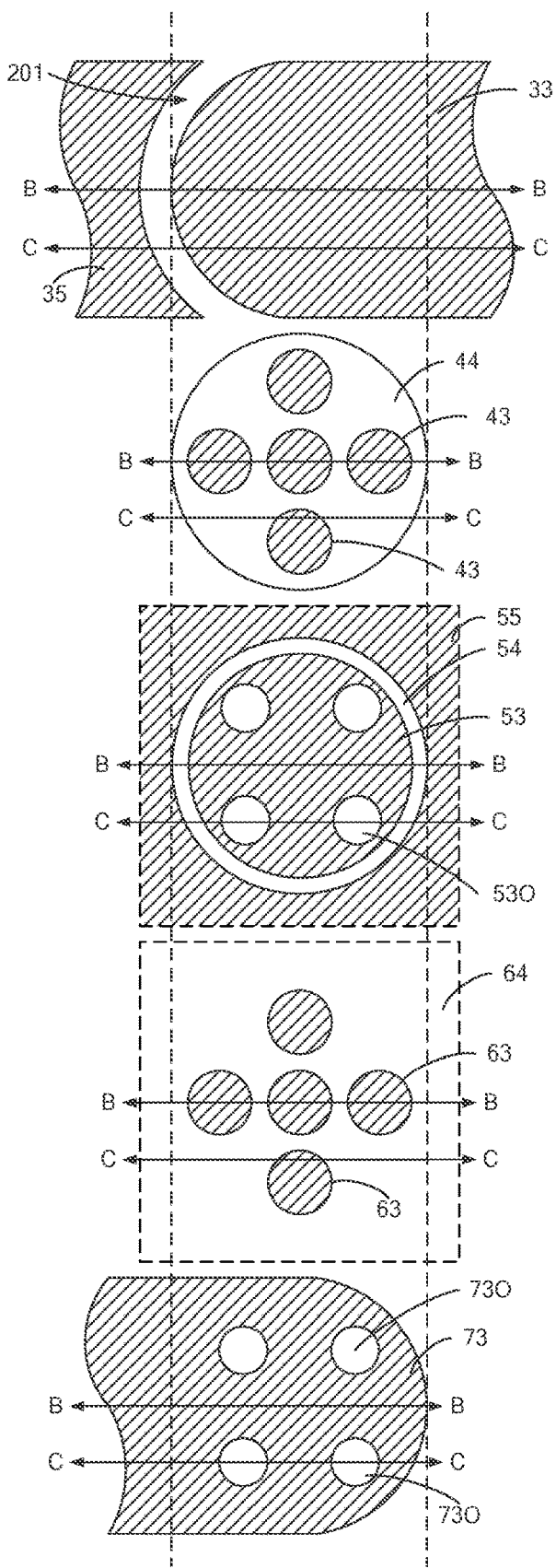
FIGS. 17A through 17C show other embodiment of the support pillar of the present disclosure, corresponding to the FIGS. 12A and 12B.
Figure 17B:
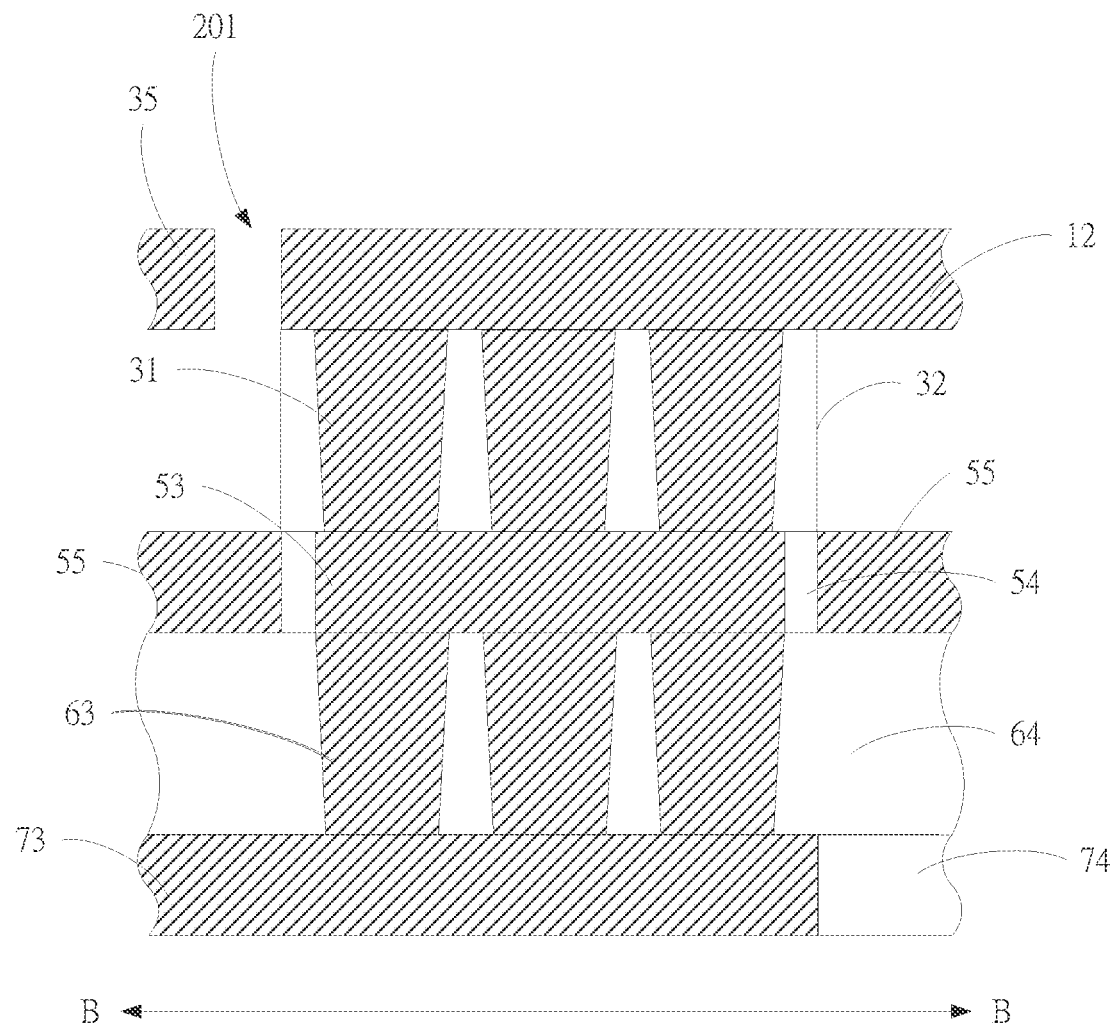
Figure 17C:
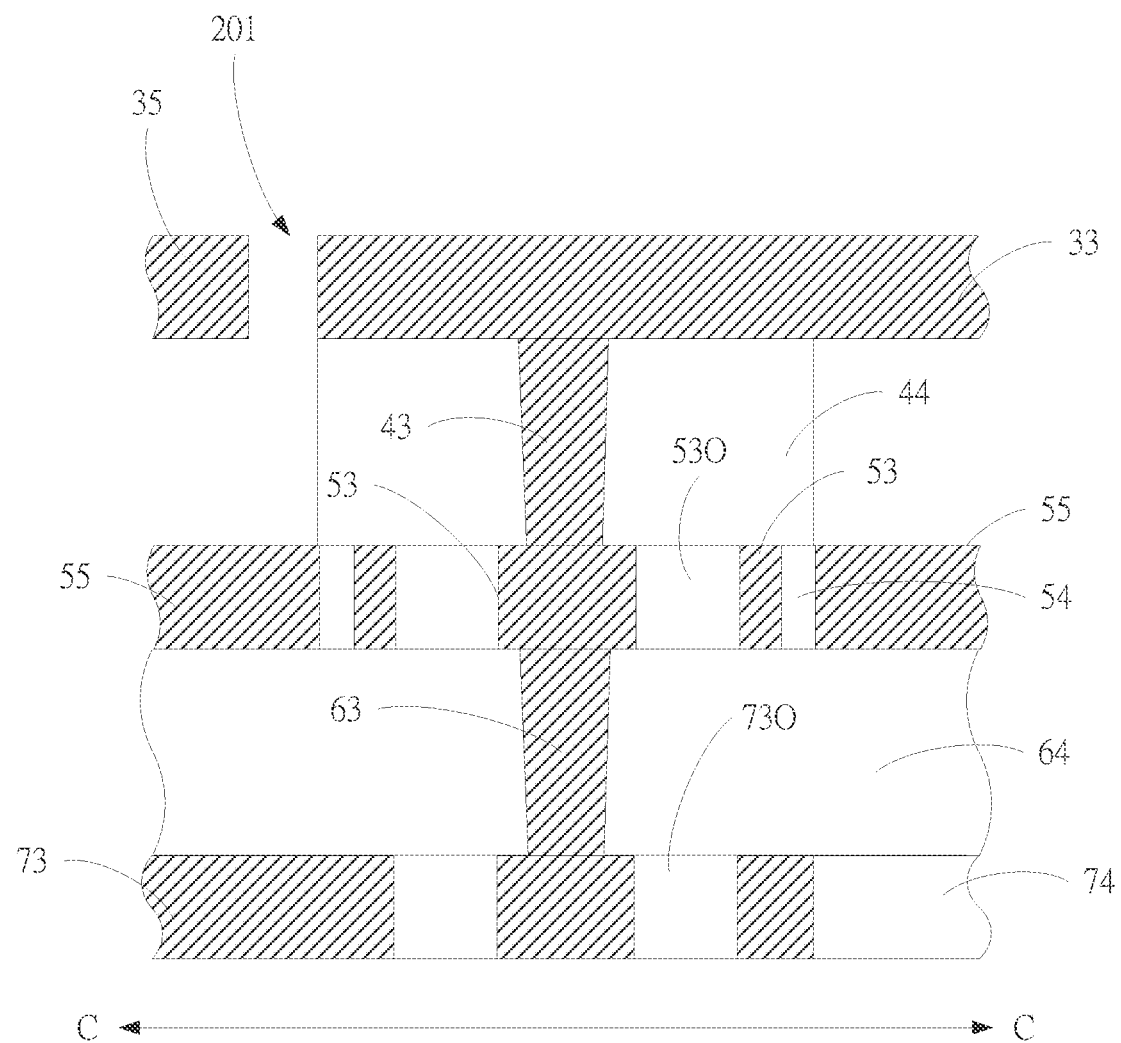

Please refer to FIGS. 17A through 17C which show other embodiment of the structure of the support pillar of the present disclosure, and this embodiment corresponds to the embodiments of FIGS. 8A and 8B. This embodiment is lack of the first through-vias 330 and has other features the same as that of embodiments of FIGS. 14A through 14C, so their detailed descriptions are omitted.

Figure 18A:
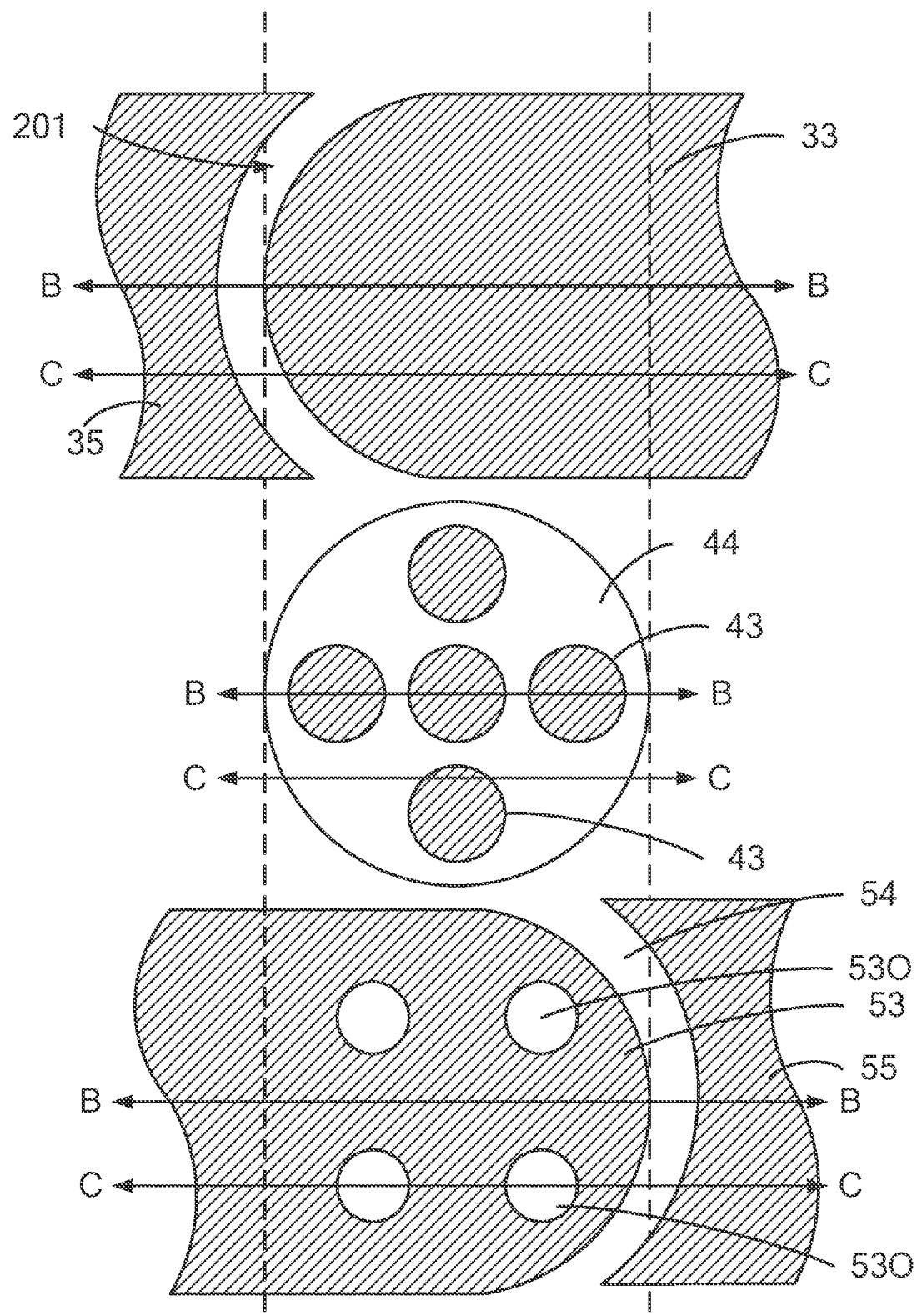
FIGS. 18A through 18C show other embodiment of the support pillar of the present disclosure, corresponding to the FIGS. 12A and 12B.
Figure 18B:
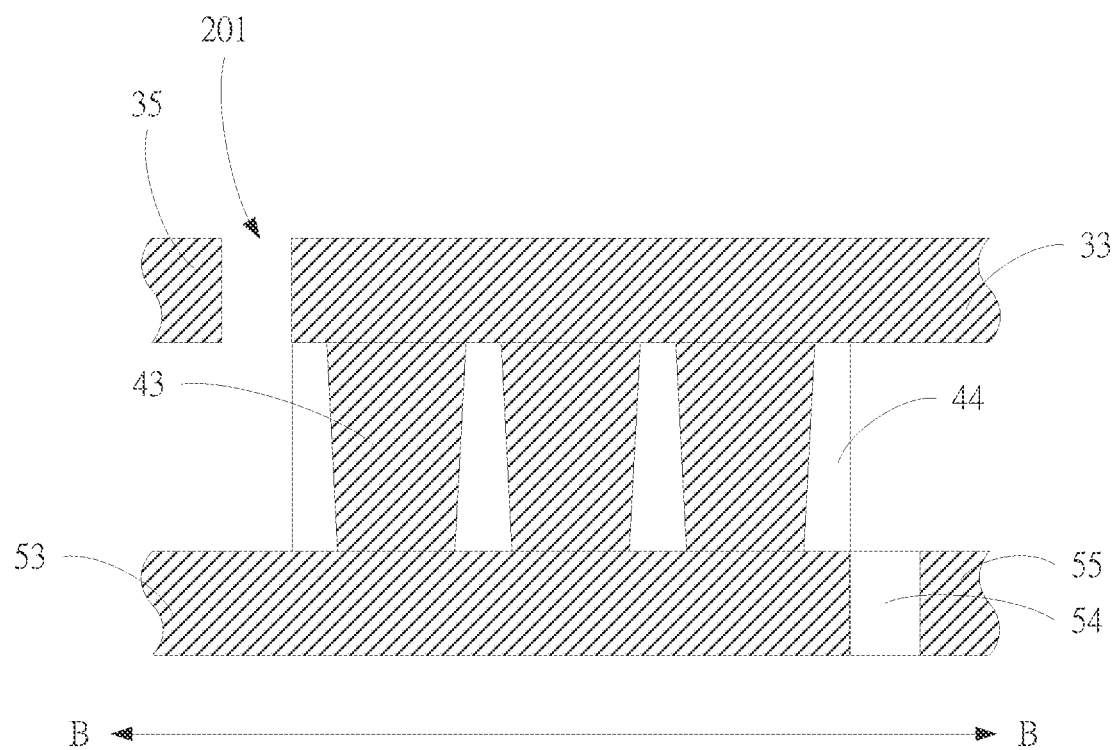
Figure 18C:
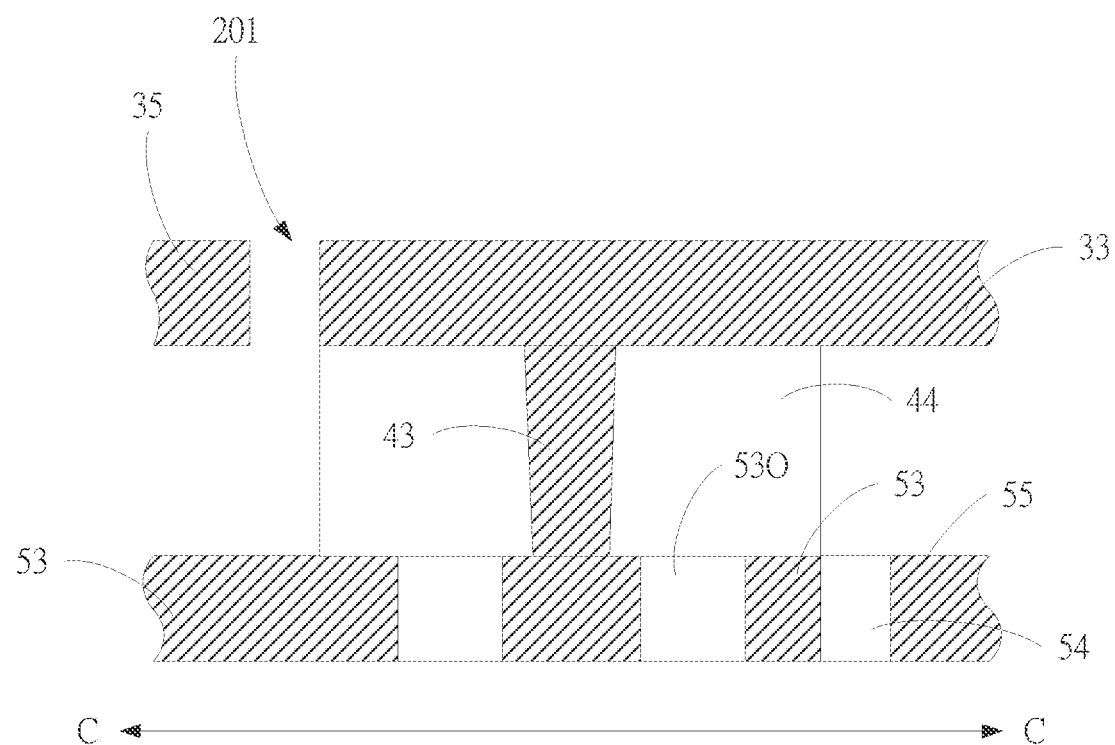

Please refer to FIGS. 18A through 18C which show other embodiment of the structure of the support pillar of the present disclosure, and this embodiment corresponds to the embodiments of FIGS. 8A and 8B. This embodiment is lack of the first through-vias 330 and has other features the same as that of embodiments of FIGS. 15A through 15C, so their detailed descriptions are omitted.

In above-mentioned embodiments, the inner-annular-supported acoustic collection film of a microphone is taken as an example for the movable film, and can be integrated into the CMOS process. Generally speaking, the support pillar of the present disclosure can be applied in any movable film including the movable film manufactured by micro electro mechanical system (MEMS) process, and the support pillar of the present disclosure can also be an integral part of the movable film and provide improved technical solution about the support pillar. The movable film is generally used for parallel capacitor, and its applications include an inertial sensor, a sound sensor, a fluid sensor, a touch sensor, a pressure sensor, actuator, and so on. These applications can adopt the support pillar of the present disclosure, to achieve the purpose of supporting the movable film and improving durability of the movable film.

In summary, the support pillar of the present disclosure essentially includes the support pillar body, and selectively includes the cap and the bottom pillar. The support pillar body is formed under the movable film to support the movable film, and the movable film can be manufactured by the CMOS process or a MEMS process. The support pillar includes a plurality of first metal micropillars, a base metal connection pillar layer and a first oxide encapsulation layer. The first metal micropillars are formed under the movable film, and conductively connected to the movable film. The base metal connection pillar layer is formed under and conductively connected with the first metal micropillars. The first metal micropillars are encapsulated by the first oxide encapsulation layer to be insulated from air and form a column shape.

The cap includes at least one second metal micropillar, the top metal connection pillar layer and the second oxide encapsulation layer. The at least one second metal micropillar is conductively connected to the movable film. The second metal micropillar is conductively connected to the top metal connection pillar layer, and encapsulated by the second oxide encapsulation layer to be insulated from air and form the column shape.

The bottom pillar includes at least one third metal micropillar, the bottom metal connection pillar layer, and the fourth oxide encapsulation layer. The at least one third metal micropillar is conductively connected to the base metal connection pillar layer, encapsulated by the fourth oxide encapsulation layer to be insulated from air and form the column shape.

In summary, the support pillar of the present disclosure can have resistance against vibration.

The embodiment of micro acoustic collector of the present disclosure is illustrated below. In the embodiment, the micro acoustic collector of the present disclosure adopts the special structure with the inner-annular-supported acoustic collection film which is supported by the support pillars annularly arranged in the inner area thereof rather than the central portion or outer periphery thereof, so the peripheral of the acoustic collection film can be suspended to form airway, and the vertical 3D space is not occupied. Moreover, by means of disposal of the support pillar, the acoustic collection film of the present disclosure can have high reliability, high sensitivity and optimization for space requirement. In addition, the present disclosure further integrate the CMOS process to simplify and integrate process, so as to achieve excellent technical effect of optimizing chip area and significantly reducing overall cost in production and package.

Figure 19:
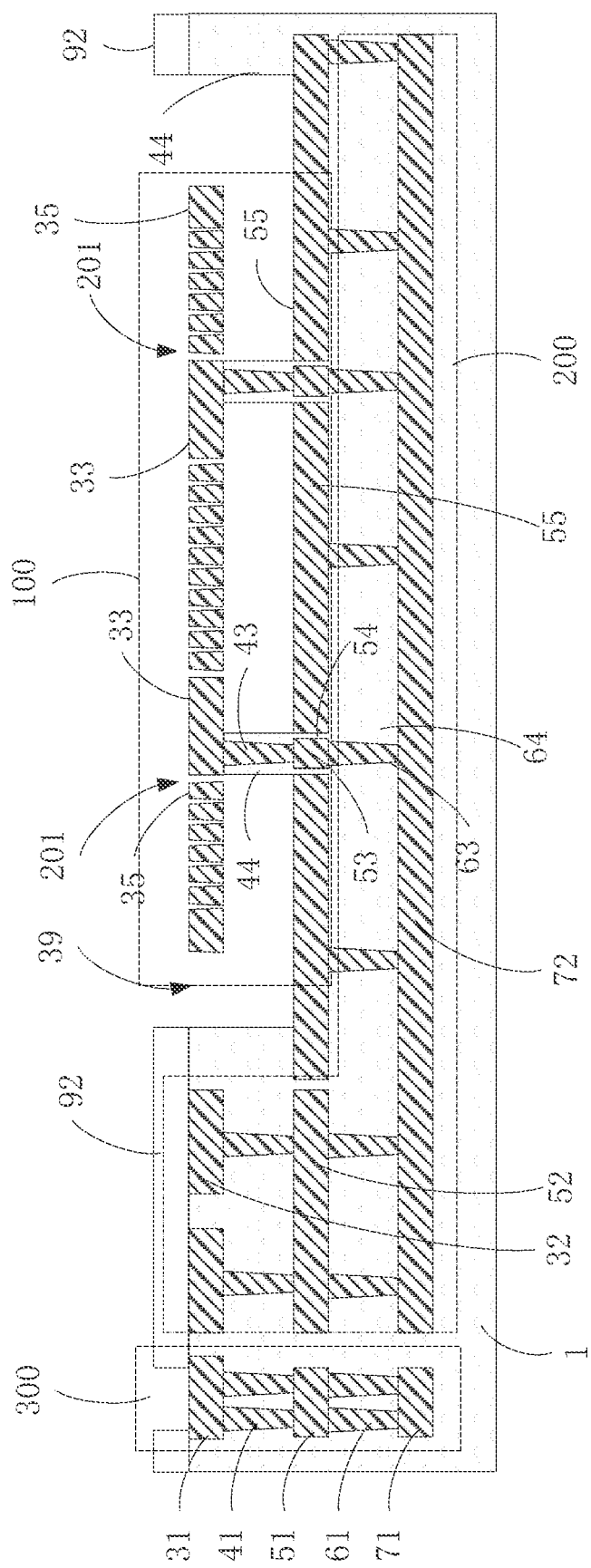
FIG. 19 is a cross-sectional schematic view of an embodiment of a CMOS microphone single chip of the present disclosure.

Please refer to FIG. 19 which shows a cross-sectional schematic view of an embodiment of a CMOS microphone single chip of the present disclosure. The cross-sectional schematic view is taken along A-A line of FIG. 20A. The CMOS microphone single chip includes a micro acoustic collector area 100, a circuit integration area 200 and a pad area 300. As shown in FIG. 19, the micro acoustic collector area 100 is disposed over the circuit integration area 200 and at a side of the circuit integration area 200. The pad area 300 is disposed at other side of the circuit integration area 200. As shown in FIG. 19 and FIGS. 20A through 20C, the connection line layers 32 and 52 are disposed at a side of the inner-annular-supported acoustic collection film 35. The circuit integration area 200 includes the connection line layer 52 and the semiconductor device layer 72 which are formed on the substrate 1. In other embodiment, the circuit integration area 200 can be disposed under the micro acoustic collector area 100 only, and the pad area 300 is disposed at the side of the micro acoustic collector area 100.

Figure 20A:
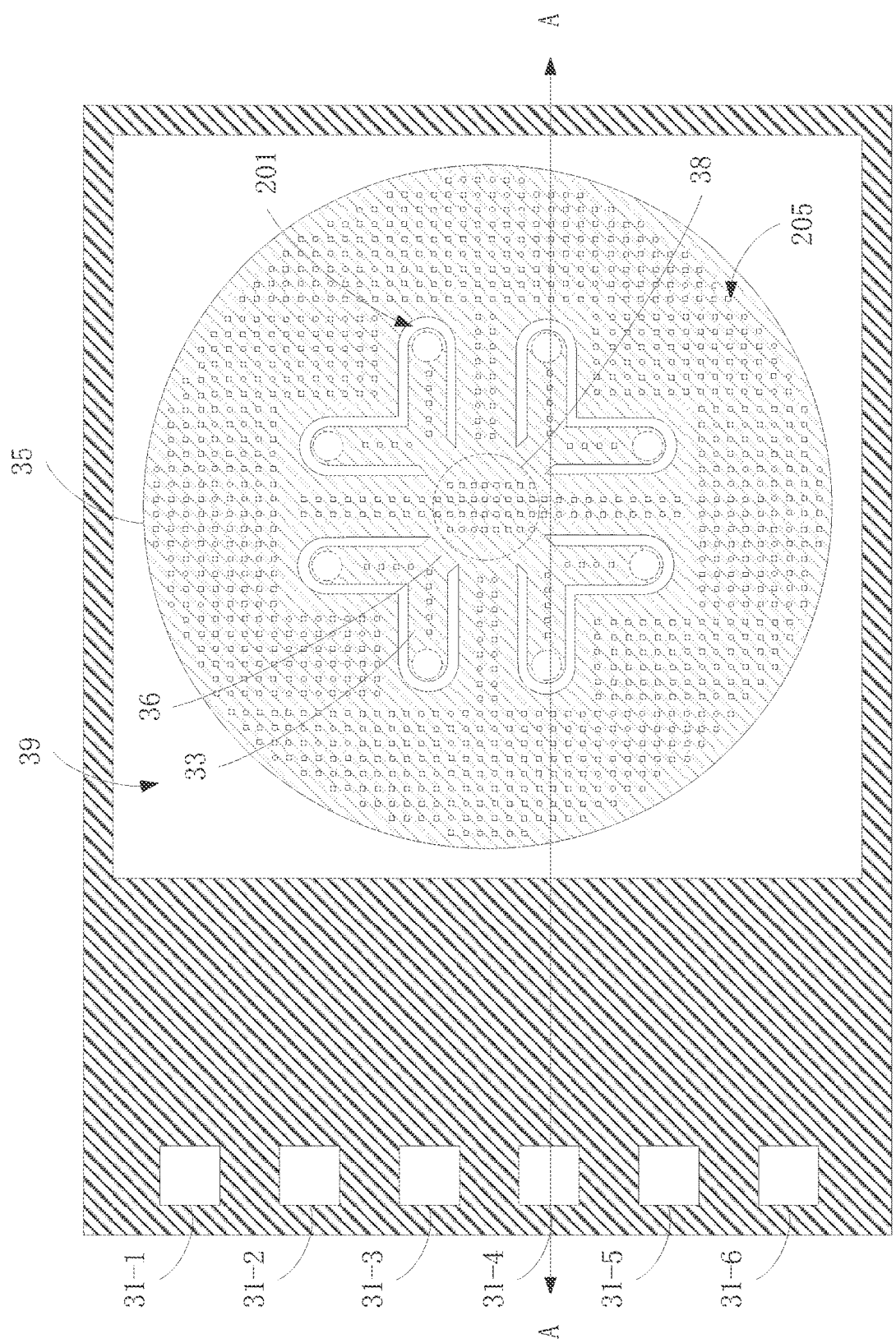
FIGS. 20A through 20C are top views of layers of the CMOS microphone single chip of the present disclosure.

Please refer to FIG. 20A. The micro acoustic collector area 100 includes the inner-annular-supported acoustic collection film 35, the support pillar including body 43 and the insulating layer 44, and the base metal layer 55.

Please refer to FIG. 20A. The inner-annular-supported acoustic collection film 35 is disposed on a top side of the CMOS microphone single chip, and includes multiple leaf-shaped structures 33 disposed around the central portion of the inner-annular-supported acoustic collection film 35. The inner-annular-supported acoustic collection film 35 is made by metal, such as Al, Cu or alloy, for example, AlCu, TiN, Ti (in Al process, Cu process or mixed process). As shown in FIG. 20A, the leaf-shaped structure 33 is four in number, and multiple leaf-shaped structures 33 are arranged annularly. Each leaf-shaped structure 33 is defined by a continuous trench 201, and four continuous trenches 201 define a film arm well (that is, well-shaped film arm structure). The leaf-shaped structures 33 are designed as L-shaped restrained arm with the same length. The two support pillars are disposed at distal ends of the L-shaped restrained arm, and the suspended arm 36 is formed at the connection between the restrained arms. Two parallel and adjacent leaf-shaped structures 33 are spaced apart from each other to form the central channel, and the central channels are passed through the central portion of the inner-annular-supported acoustic collection film 35 to form the suspended fulcrum 38. In addition, the isotropic etching process is performed on entire inner-annular-supported acoustic collection film 35, including leaf-shaped structure 33, the central channels and the suspended fulcrum 38, through the through-via 205 uniformly distributed, so as to form the suspended structure.

The design of the continuous trenches 201, the through-vias 205 and the suspended space 39 can replace the conventional back-etching technology, and improve mechanical function (such as sensitivity, frequency response and signal-to-noise ratio) by reducing effect of fluid-structure interaction, squeeze film damping, turbulence, and vortex.

In addition, locations, lengths, widths and thicknesses of the suspended fulcrum 38, the suspended arm 36, the single-side restrained arm and the support pillar can be adjusted to meet function and process requirements. By manner of appropriately adjusting the shape of the inner-annular-supported acoustic collection film 35, and the physical locations and shapes of the suspended fulcrum 38, the leaf-shaped structure 33, the suspended arm 36 and the support pillar, the CMOS microphone single chip of the present disclosure can be nondirectional, unidirectional or multi-directional.

In addition, by manner of appropriately adjusting the shape of the inner-annular-supported acoustic collection film 35, and the physical locations and shapes of the suspended fulcrum 38, the leaf-shaped structure 33, the suspended arm 36 and the support pillar to meet the material parameter, function evaluation and process requirement, the CMOS microphone single chip of the present disclosure can have resistance against gravity, residual stress deformation, thermal stress and inappropriate external force. While being applied with external signal, the inner-annular-supported acoustic collection film 35 responds appropriate mechanical response according to the above-mentioned conditions and limitations of the material parameter, function evaluation and process requirement.

Figure 20B:
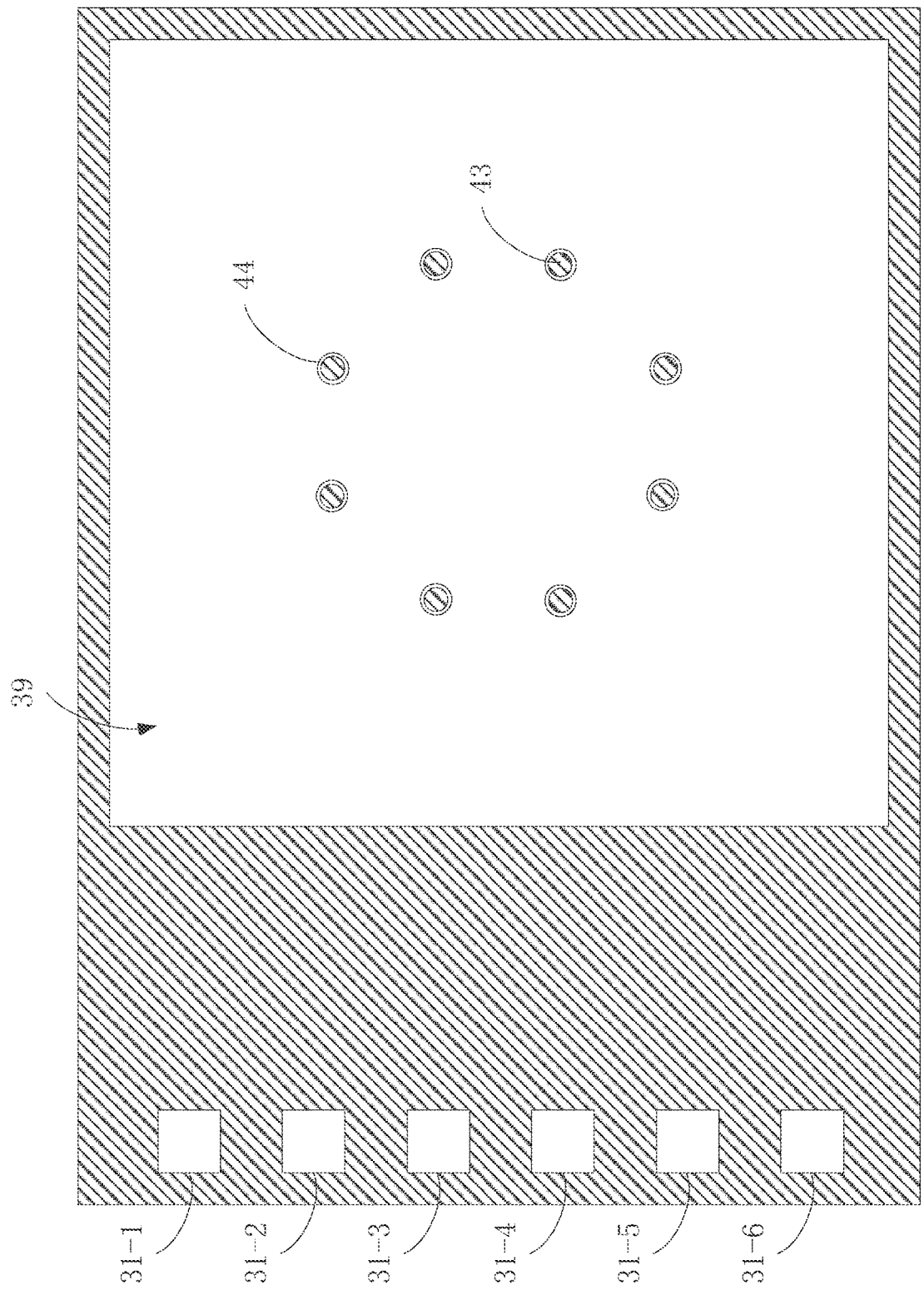

Please refer to FIGS. 19 and 20B. The support pillars are uniformly disposed under the edges (such as distal ends of two L-shaped arms shown in FIG. 20A) of the leaf-shaped structures 33 of the inner-annular-supported acoustic collection film 35, to support the leaf-shaped structures 33. The support pillar body 43 and the insulating layer 44 of the support pillar respectively provide electroconduction between the support pillar and the inner-annular-supported acoustic collection film 35.

Figure 20C:
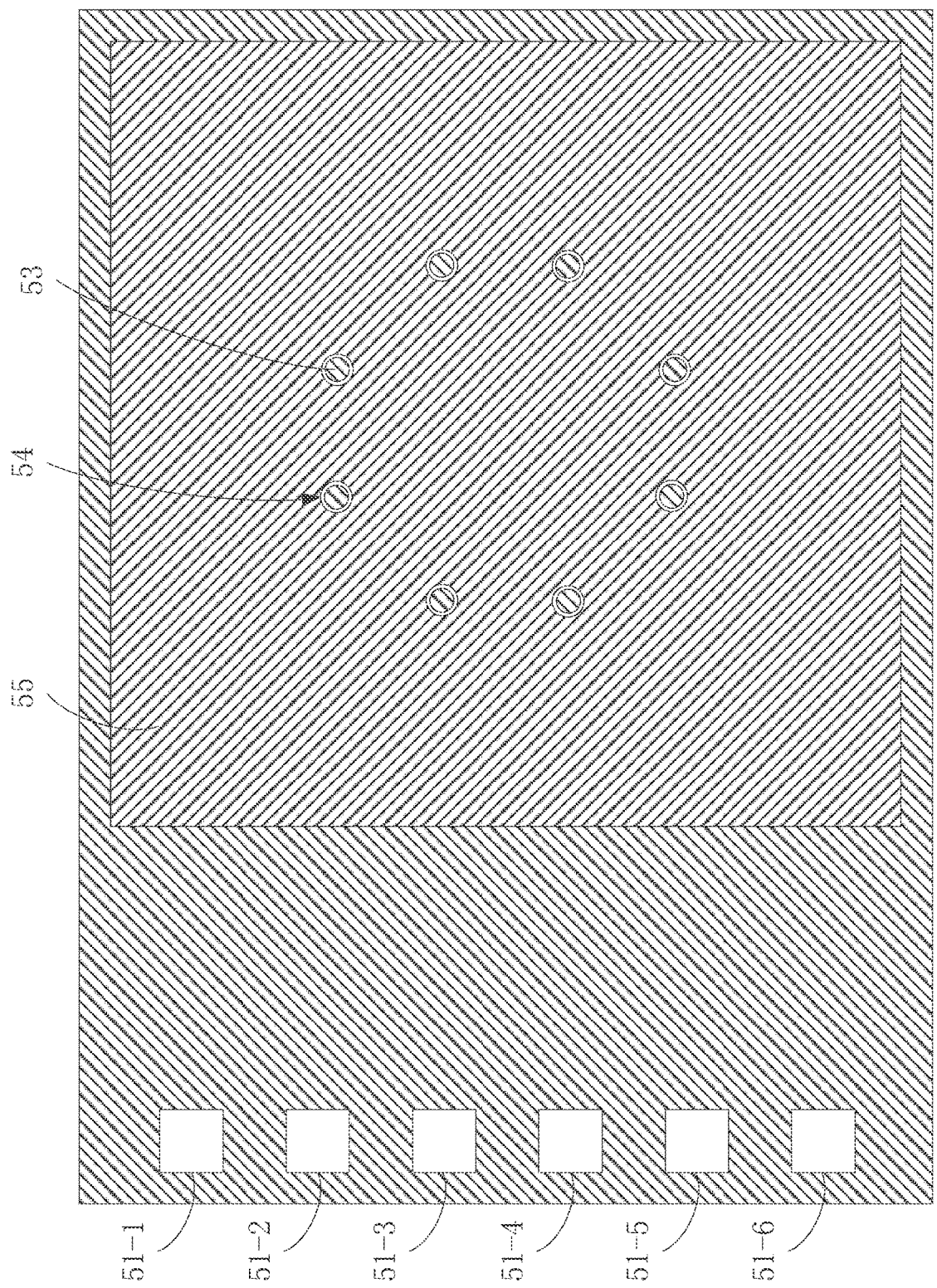

Please refer to FIGS. 19 and 20C. The base metal layer 55 is formed under the support pillar and insulated from the support pillar by the insulating layer 54 (the support pillar is connected the circuit integration area 200 below through the support pillar body 53 disposed on the same layer with the base metal layer 55. The base metal layer 55 faces towards the inner-annular-supported acoustic collection film 35 to form the hollow space. The circuit integration area 200 is formed under the base metal layer 55 and connected with the support pillar body 43 of the support pillar and the base metal layer 55, to supply an operation voltage to the micro acoustic collector which is formed by the inner-annular-supported acoustic collection film 35 and the base metal layer 55, and receive a voltage signal converted from the sonic signal sensed by the inner-annular-supported acoustic collection film 35, and convert the voltage signal into an output signal.

The output signal is outputted through the pad of the pad area 300. In addition, the external power and control instruction are transmitted to the circuit integration area 300 through the pad area 300, so as to enable the CMOS microphone single chip of the present disclosure to work. Please refer to FIG. 1 and FIGS. 2A through 2D. The pads 31-1, 31-2, 31-3, 31-4, 31-5 and 31-6 disposed on top of the CMOS microphone single chip, the pad connection points 51-1, 51-2, 51-3, 51-4, 51-5 and 51-6, and pad connection points 71-1, 71-2, 71-3, 71-4, 71-5 and 71-6 are for illustration only, and the number and sizes of these pads and pad connection points can be adjusted upon practical requirement, so the detailed descriptions are omitted.

As shown in FIGS. 19-20C, the particular circuits in the circuit parts 32, 52 and the electronic component area 72 of the circuit integration area 200 may be varied upon practical requirement, so the detailed descriptions are omitted.

The restrained arm of the leaf-shaped structure 33 of the present disclosure can be in straight shape, L shape with the same lengths, V shape with the same lengths, square shape, circular shape, elliptic shape, heart-like shape or heart shape, or a combination thereof.

Figure 21A:
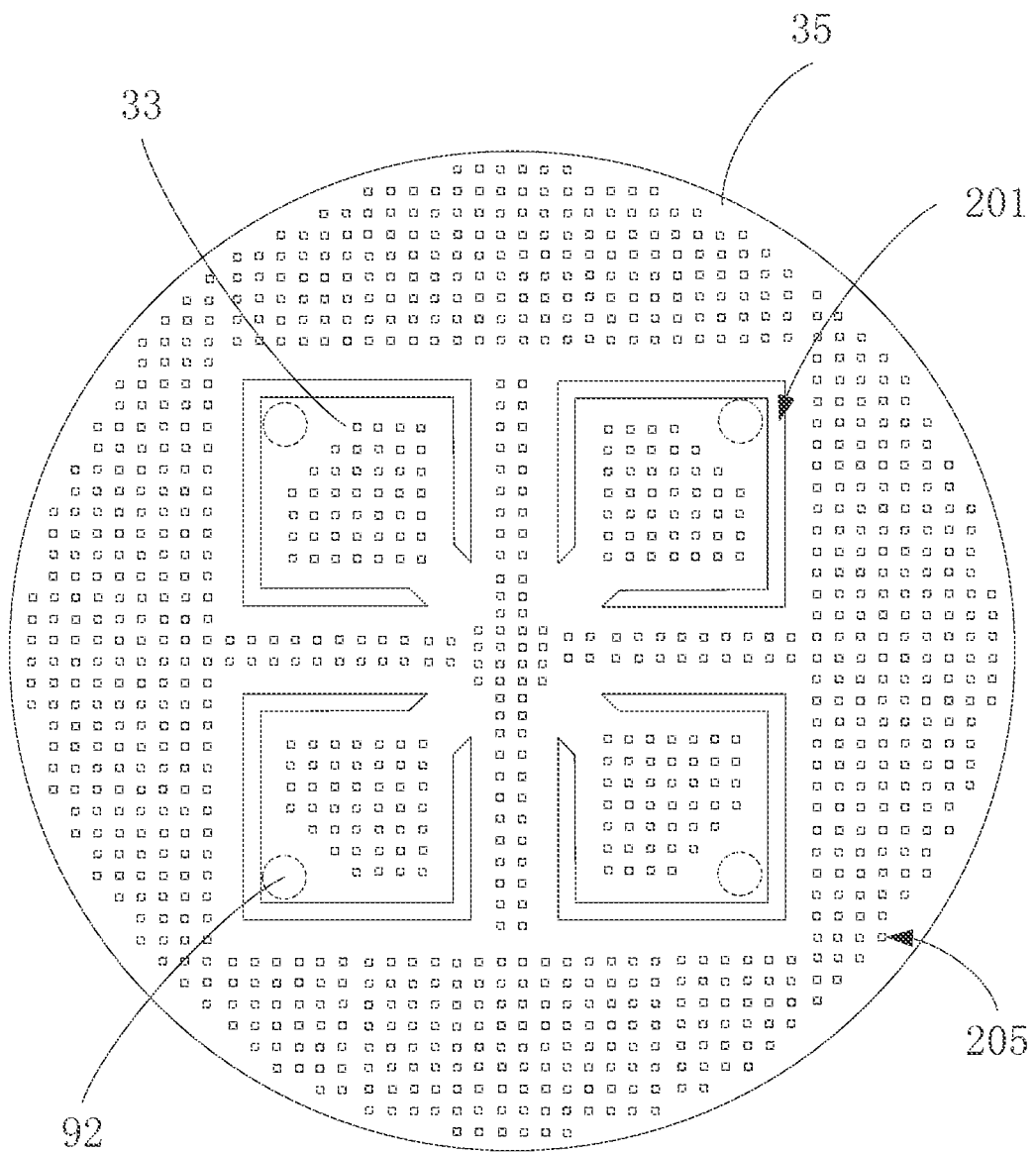
FIGS. 21A and 21B are top views of other embodiments of the inner-annular-supported acoustic collection film of the CMOS microphone single chip of the present disclosure.
Figure 21B:
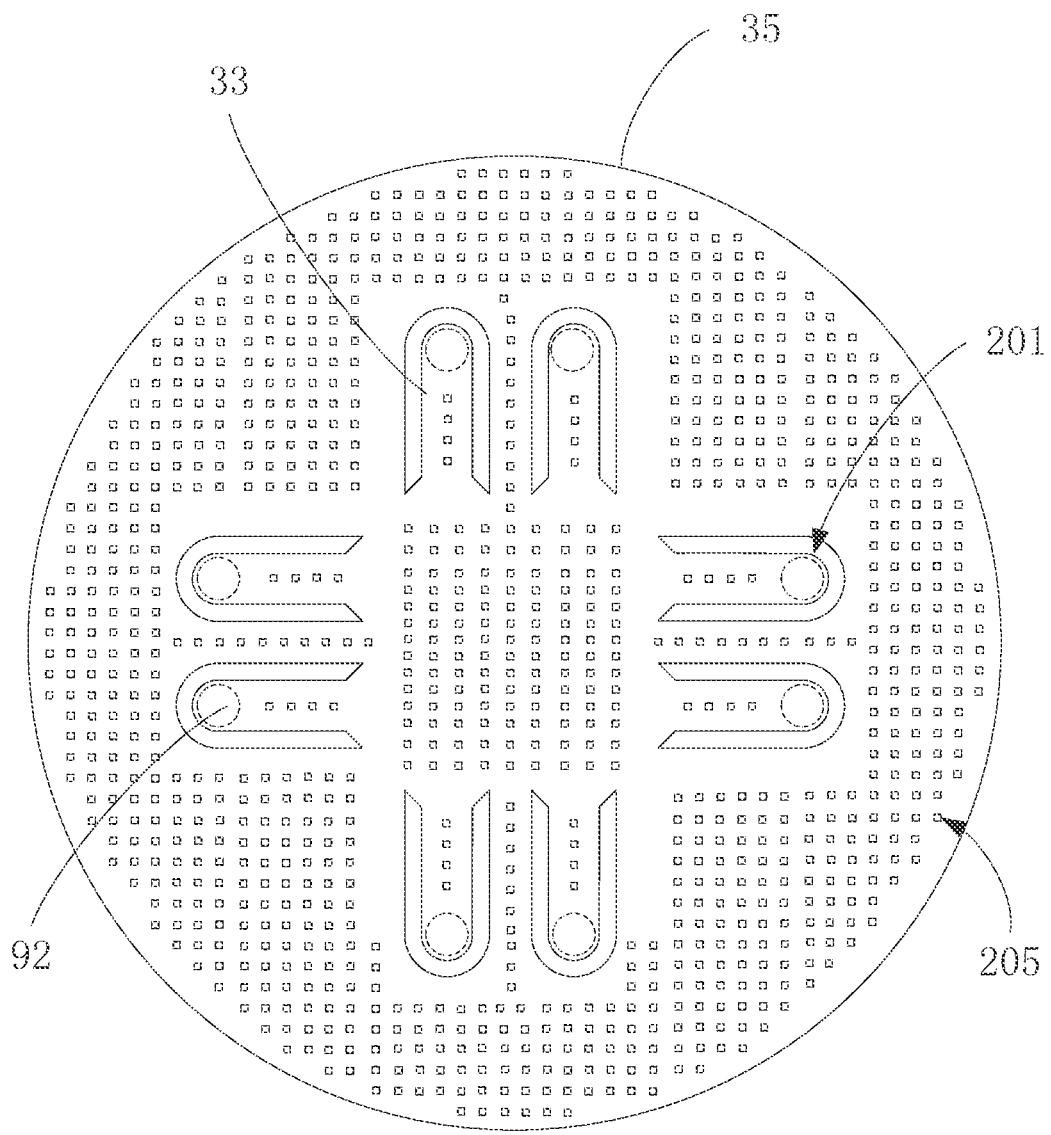

Please refer to FIGS. 21A and 21B which show other two embodiments of the inner-annular-supported acoustic collection film of the CMOS microphone single chip of the present disclosure. FIG. 21A shows the restrained arm with a square-shaped structure, and FIG. 21B shows the restrained arm with a straight-shaped structure.

As shown in FIGS. 21A and 21B, the three support pillars are annularly disposed with symmetry. Preferably, the inner-annular-supported acoustic collection film 35 is in circular shape, or in other shape with symmetry, such as square shape, rectangular shape or polygonal shape.

In summary, the CMOS microphone single chip of the present disclosure can reduce steps and complexity of manufacturing process and facilitate circuit integration, so as to significantly reduce the manufacturing cost. In addition, in the CMOS microphone single chip of the present disclosure, the number of components in a wafer unit area can be increased the package volume and area can be reduced, so that the package cost can be significantly reduced. In addition, the CMOS microphone single chip of the present disclosure can be directly performed package process after the CMOS process is completed, so that the product yield can be significantly improved. The package body does not reduce and impact the performance of sensing function of the microphone film. The design of the suspended structure can significantly increase sensitivity of the microphone film without decreasing the resistance against the inappropriate vibration.

The embodiment of micro acoustic collector of the present disclosure is illustrated below. In the embodiment, the micro acoustic collector of the present disclosure adopts the special structure with the inner-annular-supported acoustic collection film which is supported by the support pillars annularly arranged in the inner area thereof rather than the central portion or outer periphery thereof, so the peripheral of the acoustic collection film can be suspended to form airway, and the vertical 3D space is not occupied. Moreover, by means of disposal of the support pillar, the acoustic collection film of the present disclosure can have high reliability, high sensitivity and optimization for space requirement. In addition, the present disclosure further integrate the CMOS process to simplify and integrate process, so as to achieve excellent technical effect of optimizing chip area and significantly reducing overall cost of production and package.

Please refer back to FIG. 12A which shows a cross-sectional schematic view of the embodiment of the CMOS microphone single chip with lateral cavity. The cross-sectional schematic view is taken along the A-A line in FIG. 12B. The CMOS microphone single chip includes a micro acoustic collector area 100, a circuit integration area 200 and a pad area 300.

As shown in FIG. 12B, the micro acoustic collector area 100 mainly includes an inner-annular-supported acoustic collection film 35, a lateral metal layer 37, a support pillar (including the body 43 and the insulating layer 44) and a base metal layer 55. Entire inner-annular-supported acoustic collection film 35 is supported by the support pillar, and the lateral metal layer 37 is supported by an annular side wall. Similarly, additional support pillar can also be formed under the lateral metal layer 37. As shown in FIGS. 12A and 12B, the lateral metal layer 37 and the inner-annular-supported acoustic collection film 35 are formed at the same layer, and the lateral metal layer 37 is fastened by the annular side wall to be around and spaced apart from the peripheral of the inner-annular-supported acoustic collection film 35 by a distance. The lateral metal layer 37 faces towards the base metal layer 55 to form a lateral cavity 202 to facilitate the flow of fluid.

Figure 12C:
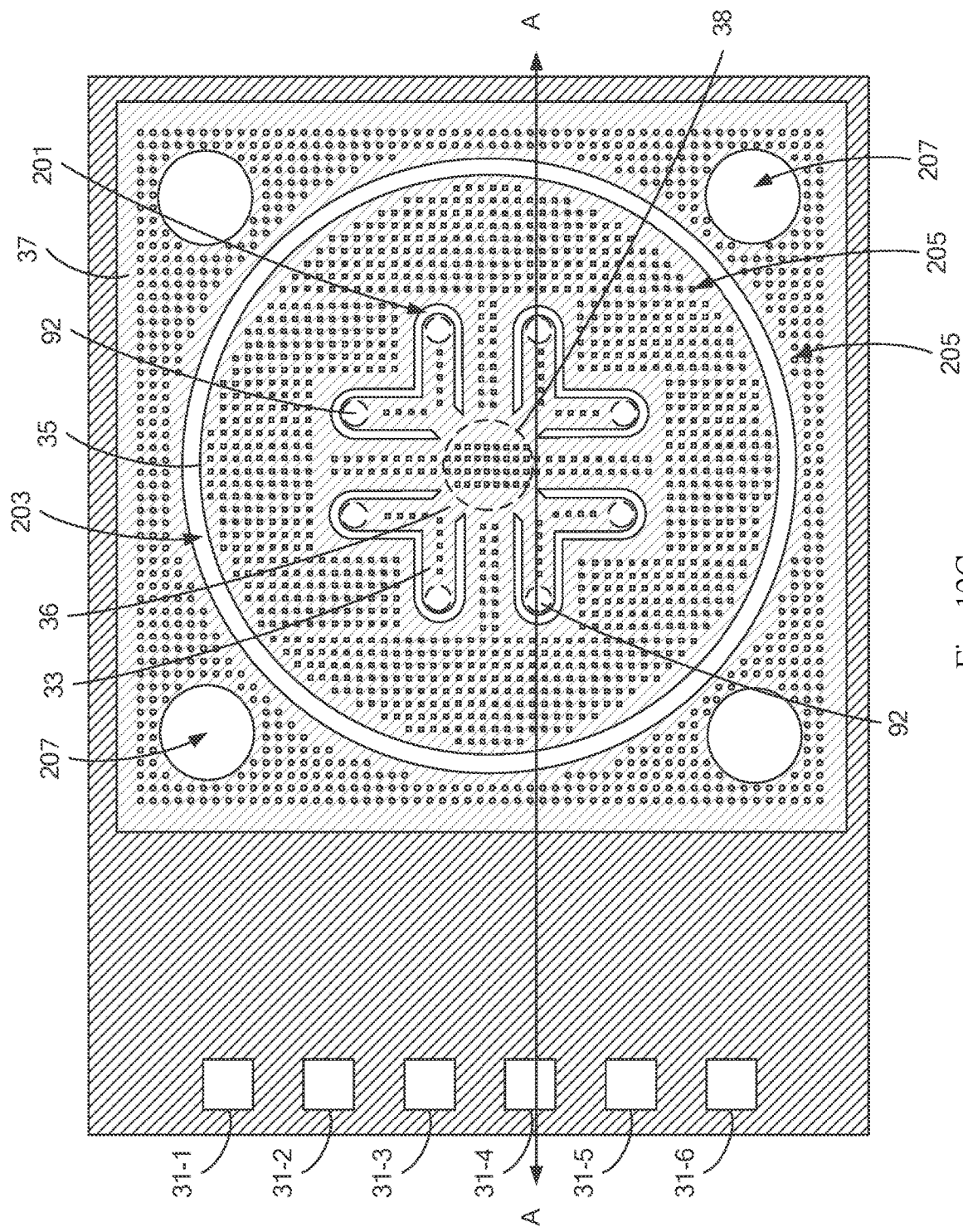

Please refer to FIG. 12C. The lateral metal layer 37 further has four pores 207 to improve smoothness of gas flow.

Figure 22:
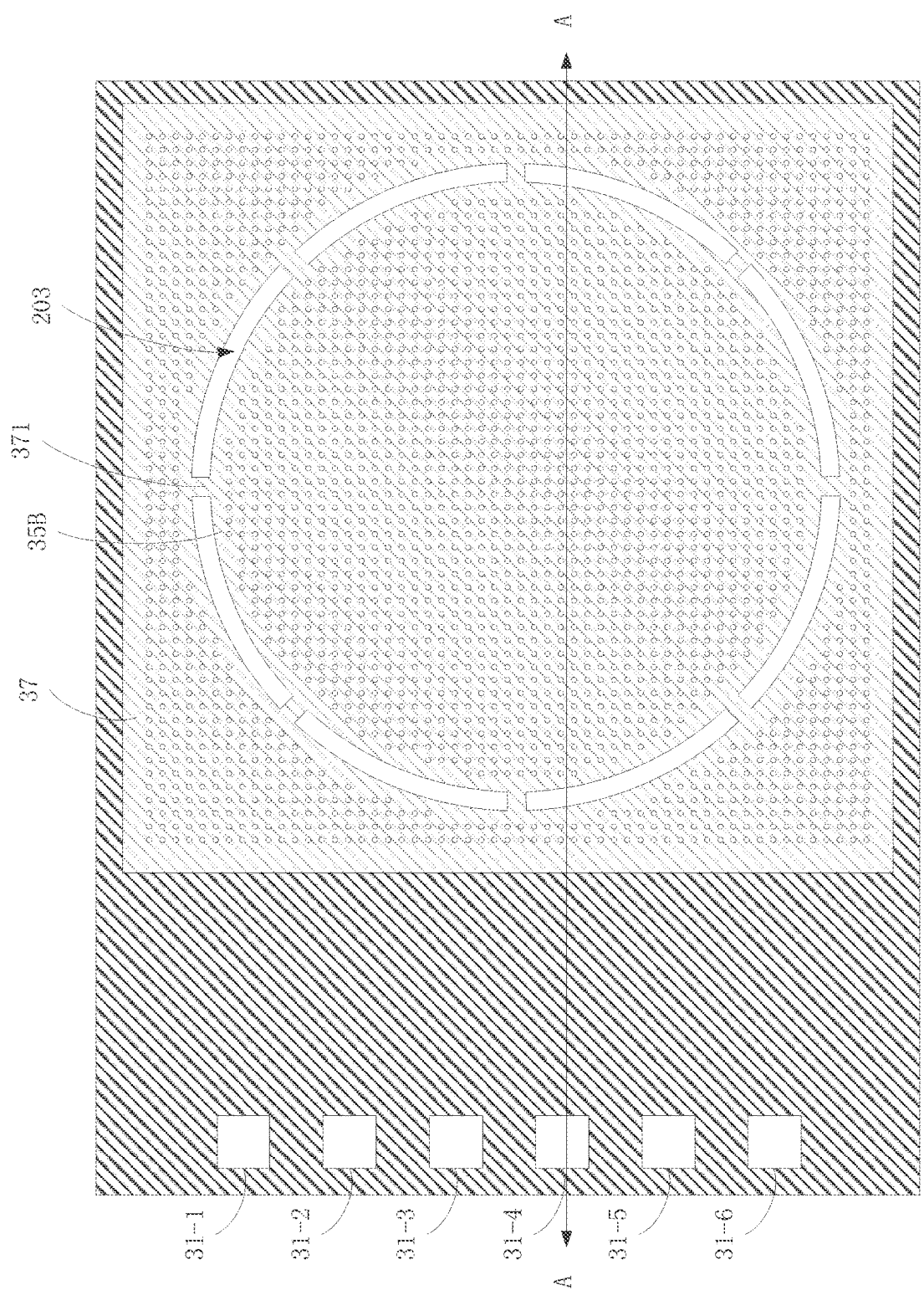
FIG. 22 is a top view of an embodiment of the CMOS microphone single chip applying peripheral-supported acoustic collection film.

Please refer to FIG. 22 which shows an embodiment of the CMOS microphone single chip applying peripheral-supported acoustic collection film. The peripheral-supported acoustic collection film 35B is adopted in the embodiment, and similarly, the lateral metal layer 37 is disposed around the peripheral-supported acoustic collection film 35B. The peripheral-supported acoustic collection film 35B is connected to the lateral metal layer 37 through multiple connection section 371, and entire movable film is formed by the peripheral-supported acoustic collection film 35B, the connection sections 371 and the lateral metal layer 37. In other words, in the embodiment the peripheral-supported acoustic collection film 35B is supported by the connection sections 371. Similarly, the lateral metal layer 37 is supported by the support pillars and the annular side wall.

Alternatively, the lateral cavity of the present disclosure can be applied to central-supported movable film, and the particular implementation is similar to the peripheral-supported or inner-annular-supported movable film, so the detailed description is omitted.

The embodiment of the CMOS sensing component will be described below. In the present disclosure, the CMOS process is applied to manufacture the sensing component and sensing circuit integration both, so as to achieve the excellent technical effect of simplifying process and integration, optimizing the chip area, significantly reducing the overall cost of production and package.

Please refer to FIGS. 23A through 23G which respectively show cross-sectional schematic views of steps of manufacturing the CMOS single chip of the present disclosure. FIG. 24 shows a top view of the CMOS single chip manufactured by the steps of FIGS. 23A through 23G.

Figure 23A:
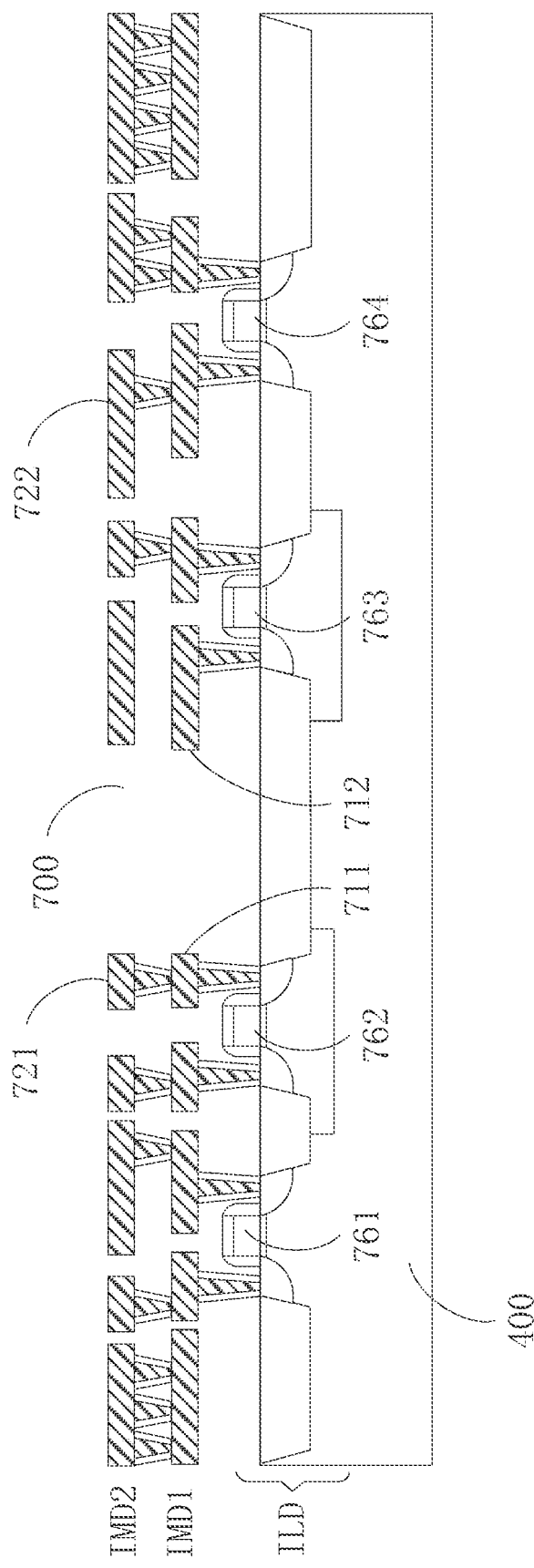
FIGS. 23A through 23G show cross-sectional schematic views of steps of manufacturing the CMOS single chip of the present disclosure.
Figure 24:
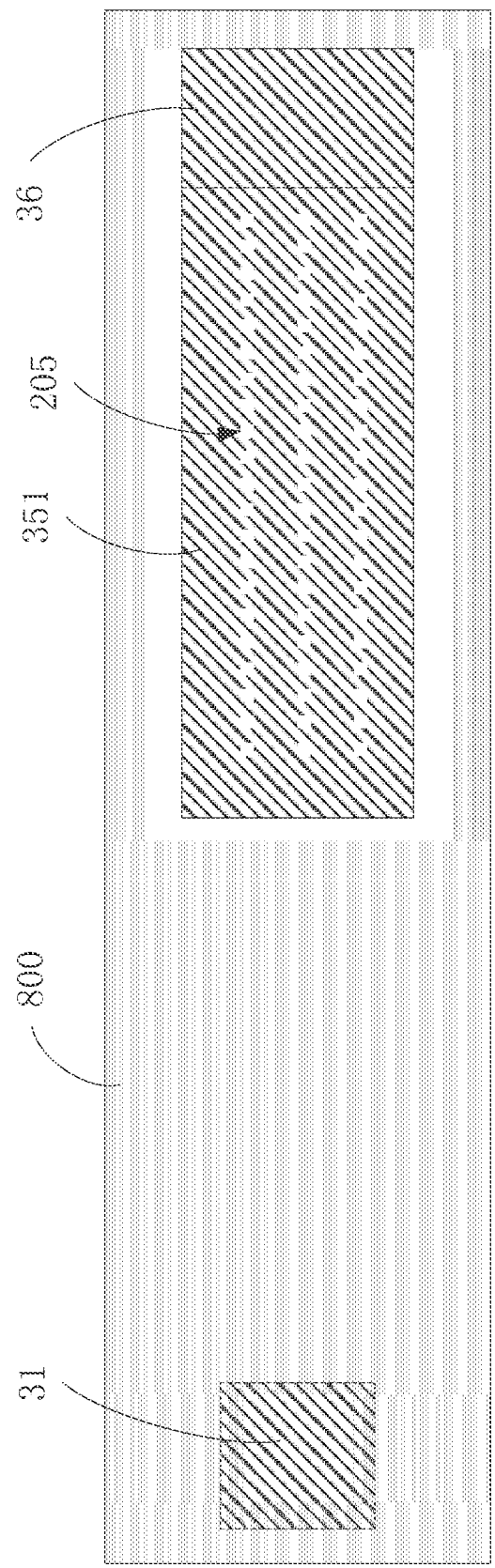
FIG. 24 a top view of the CMOS single chip manufactured by the steps of FIG. 23A through 23G of the present disclosure.

As shown in FIG. 23A, first of all, a semiconductor substrate 400 is provided, and then a circuit integration area (that is, the circuit integration area 200 shown in FIG. 19G) is formed on the semiconductor substrate 400. The circuit integration area at least includes an electronic component area ILD (that is, an interlayer dielectric layer) and a first metal layer IMD1, and a second metal layer IMD2 (that is, an inter-metal dielectric layer). The first metal layer IMD1 and the second metal layer IMD2 are served as the circuit area. As shown in FIG. 23A, at least transistors 761, 762, 763 and 764 are formed in the electronic component area ILD, and multiple circuit areas 711, 712, 721 and 722 are formed in the first metal layer IMD1 and the second metal layer IMD2, respectively. The circuit integration area is manufactured according to general CMOS process. The metal connection layer of the first metal layer IMD1 or the second metal layer IMD2 is not limited to one layer. Insulating layers 700 must be disposed in these areas during the manufacturing process.

Figure 23B:
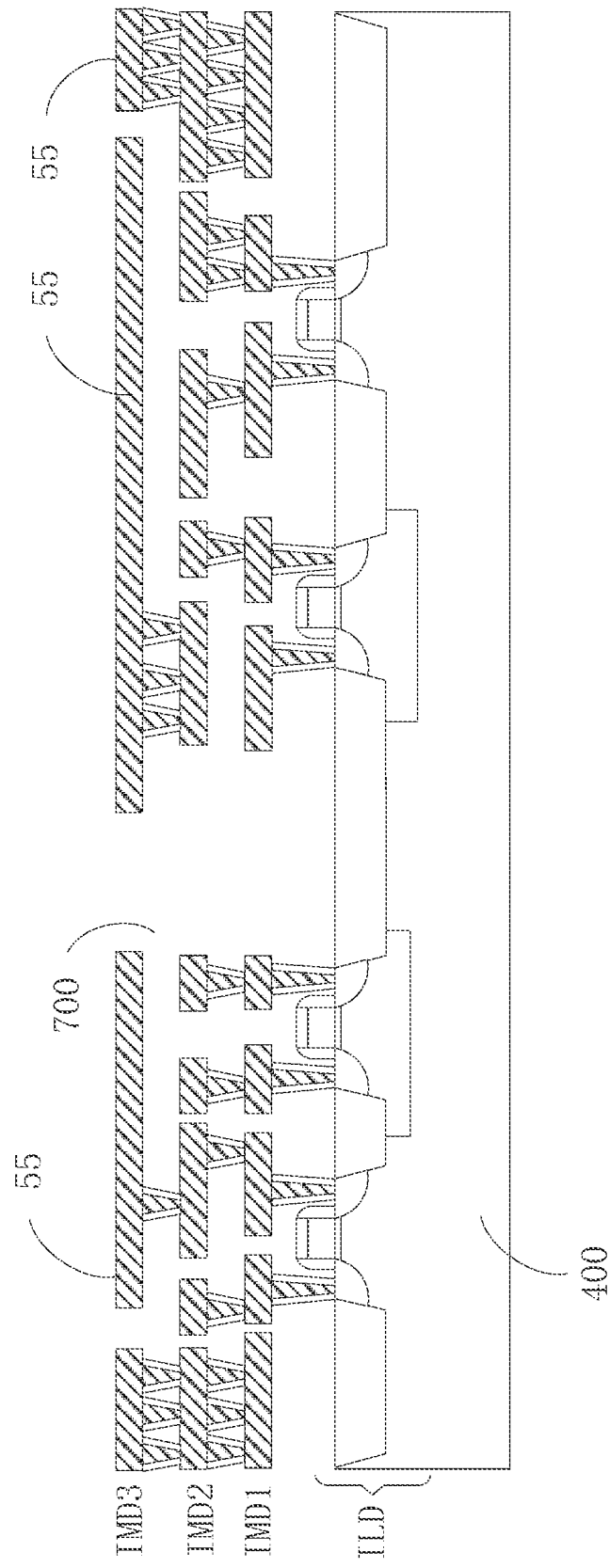

Next, as shown in FIG. 23B, a base metal layer 55 is formed on the insulated circuit integration. The base metal layer 55 is disposed corresponding in position to the movable film, and has two functions: (A) corresponding to the movable film, the base metal layer 55 functions as one capacitive plate of the movable component; (B) the base metal layer 55 can function as an etching stop layer. If the movable component area is smaller than the circuit integration area, an additional metal layer (that is, a third metal layer IMD3) can be disposed on lateral space of the base metal layer to be a part of the circuit area. Similarly, the insulating layers 700 must be disposed in these areas during the manufacturing process.

In addition, this embodiment includes the support pillar 43, so the metal layer for the support pillar area is manufactured at the same time.

Figure 23C:
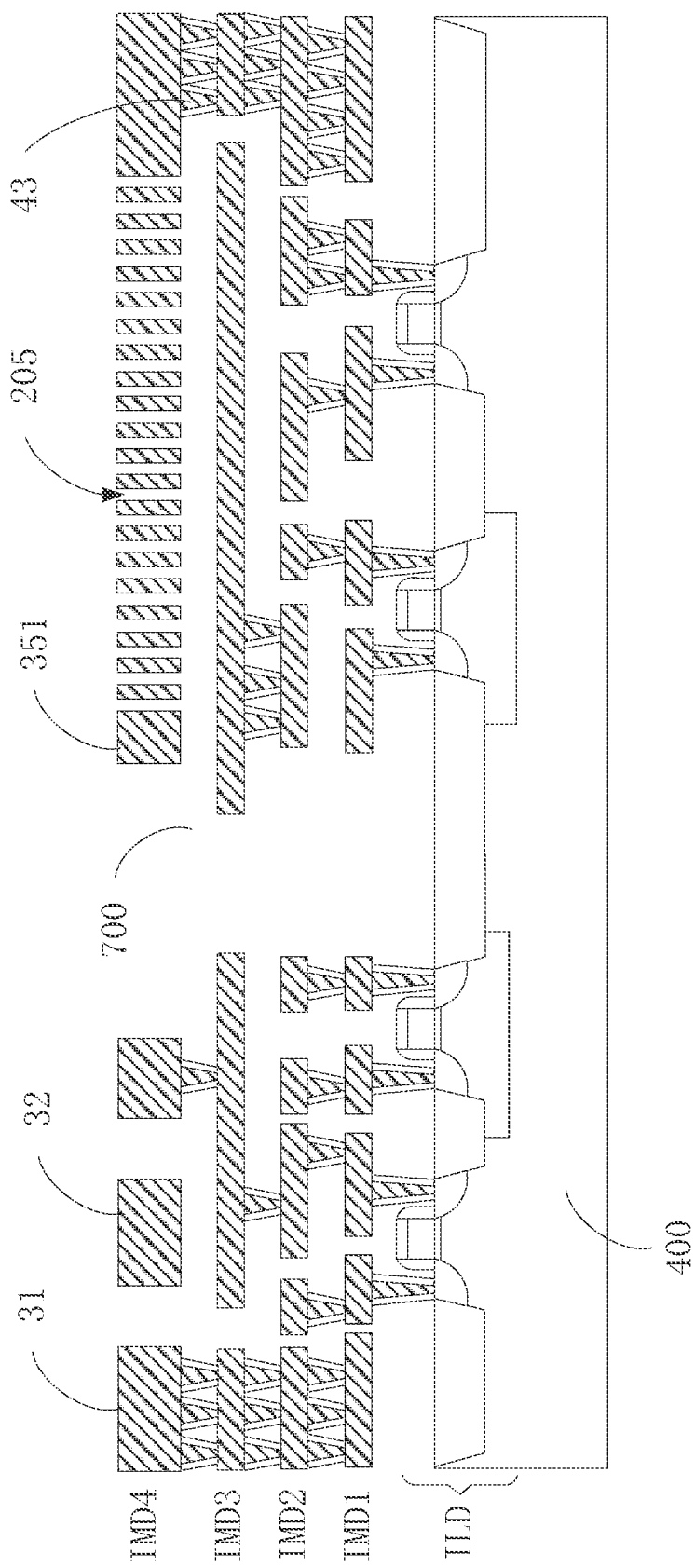

Next, as shown in FIG. 23C, a movable film area 351 and a pad area 31 are formed over the metal substrate layer 55, and insulated from the metal substrate layer 55 by the insulating layer 700. The support pillar 43 and the movable film area 351 are electrically conducted with each other and connected to the circuit integration area, and the base metal layer 55 is electrically connected to the circuit integration area. In the embodiment of FIG. 23C, the circuit integration area has a larger area, so a circuit area 32 can also be disposed in the lateral space of the movable film area 351 to be a part of the circuit integration area. This layer is the fourth metal layer IMD4.

In addition, multiple through-vias 205 must be uniformly formed in the movable film area 351 to be airways and etching paths.

Figure 23D:
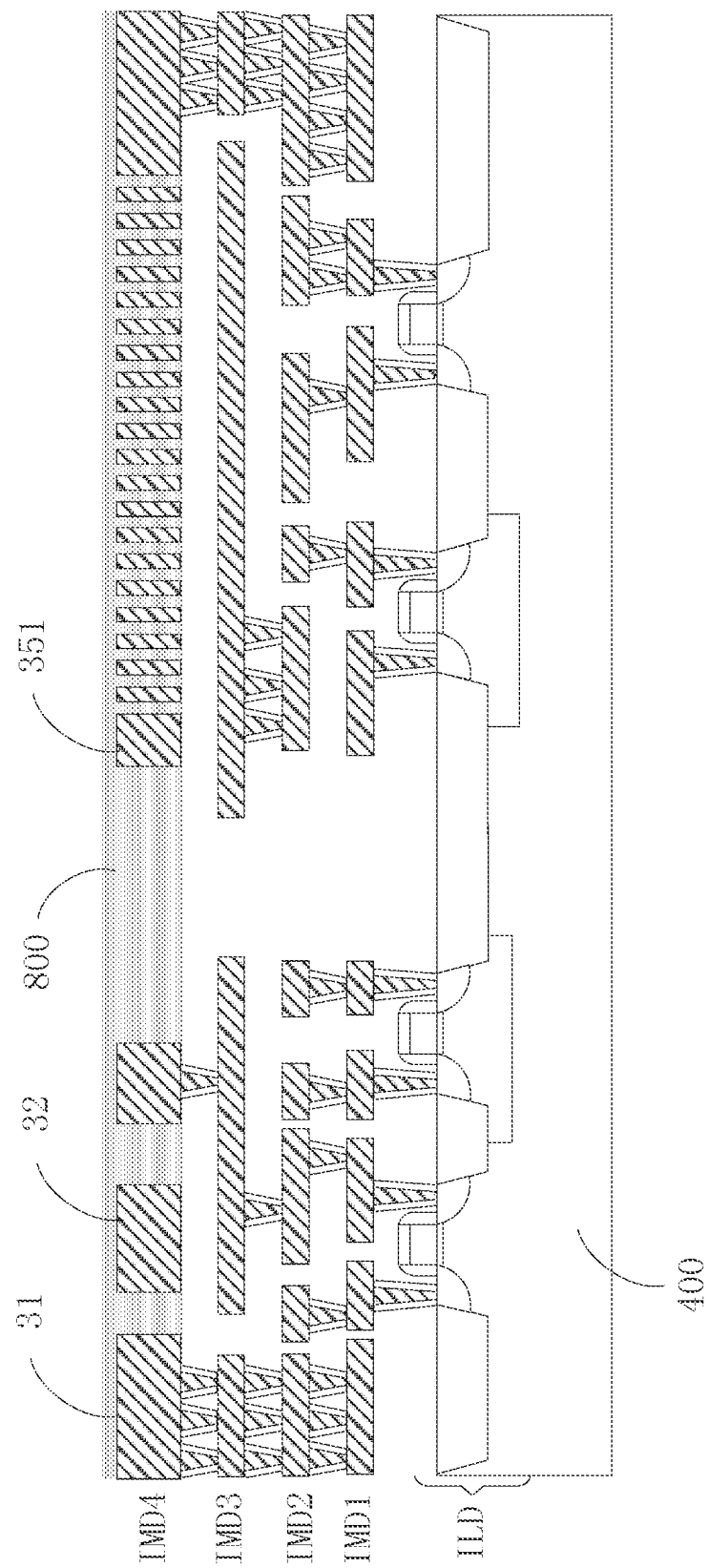
Figure 23E:
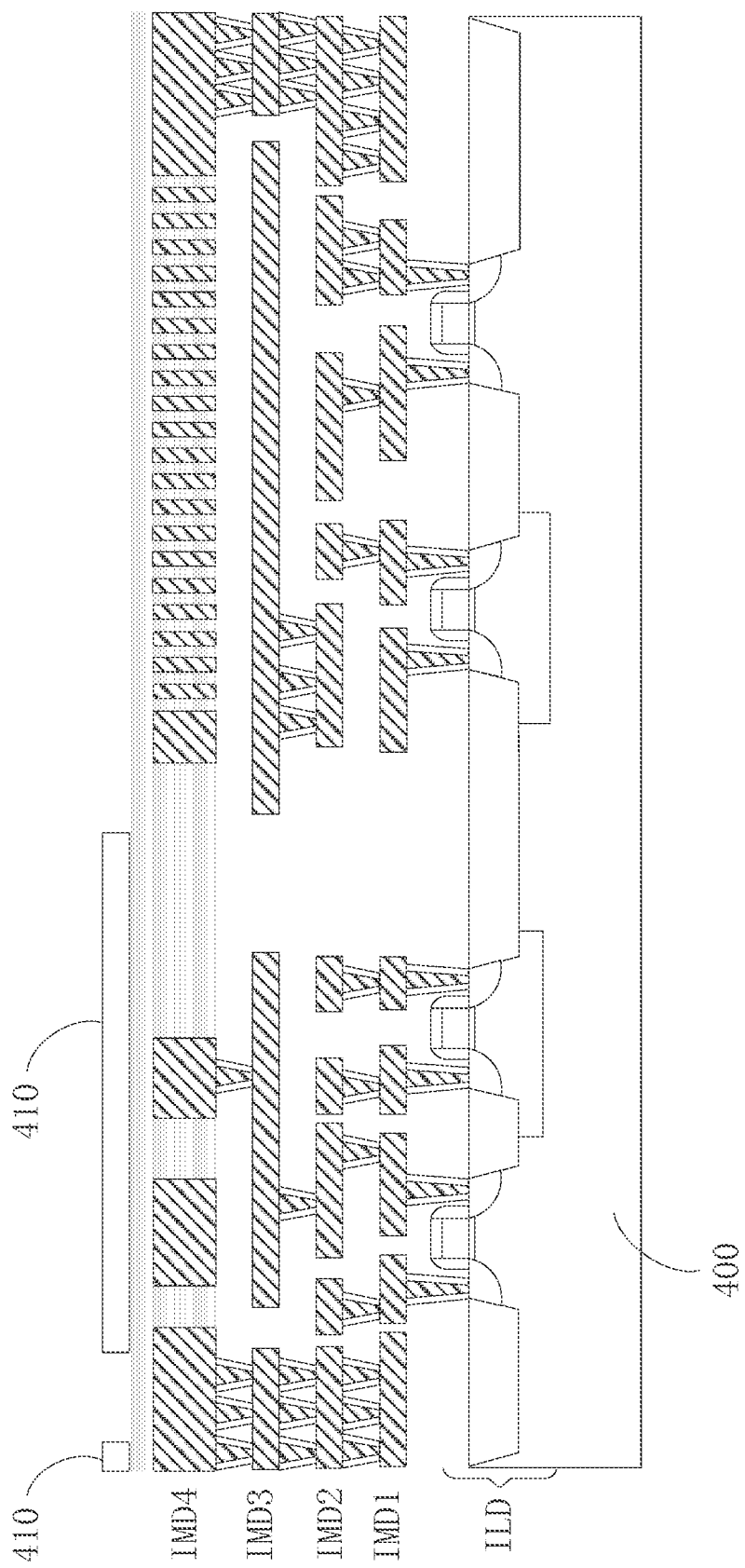

Please refer to FIG. 23D. A protective layer 800 is formed on the movable film area 351 and the pad area 31. Next, an exposed movable film area of the movable film area 351 and the exposed pad area of the pad area 31 are defined to form a resist layer 410 over the protective layer 800, so as to further define the area for releasing the movable component of the movable film area 351 and exposing the pad of the pad area 31, as shown in FIG. 23E.

Figure 23F:
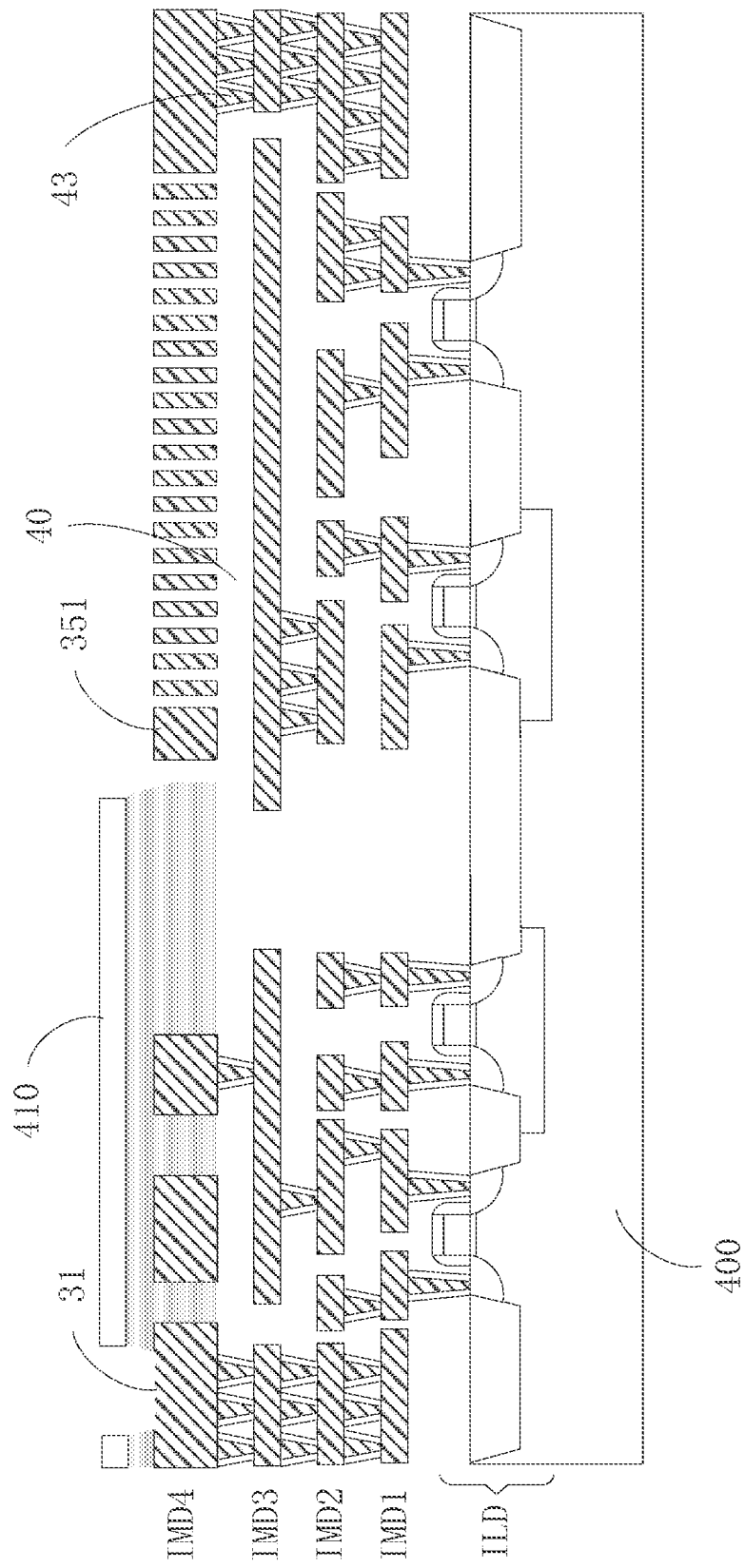
Figure 23G:
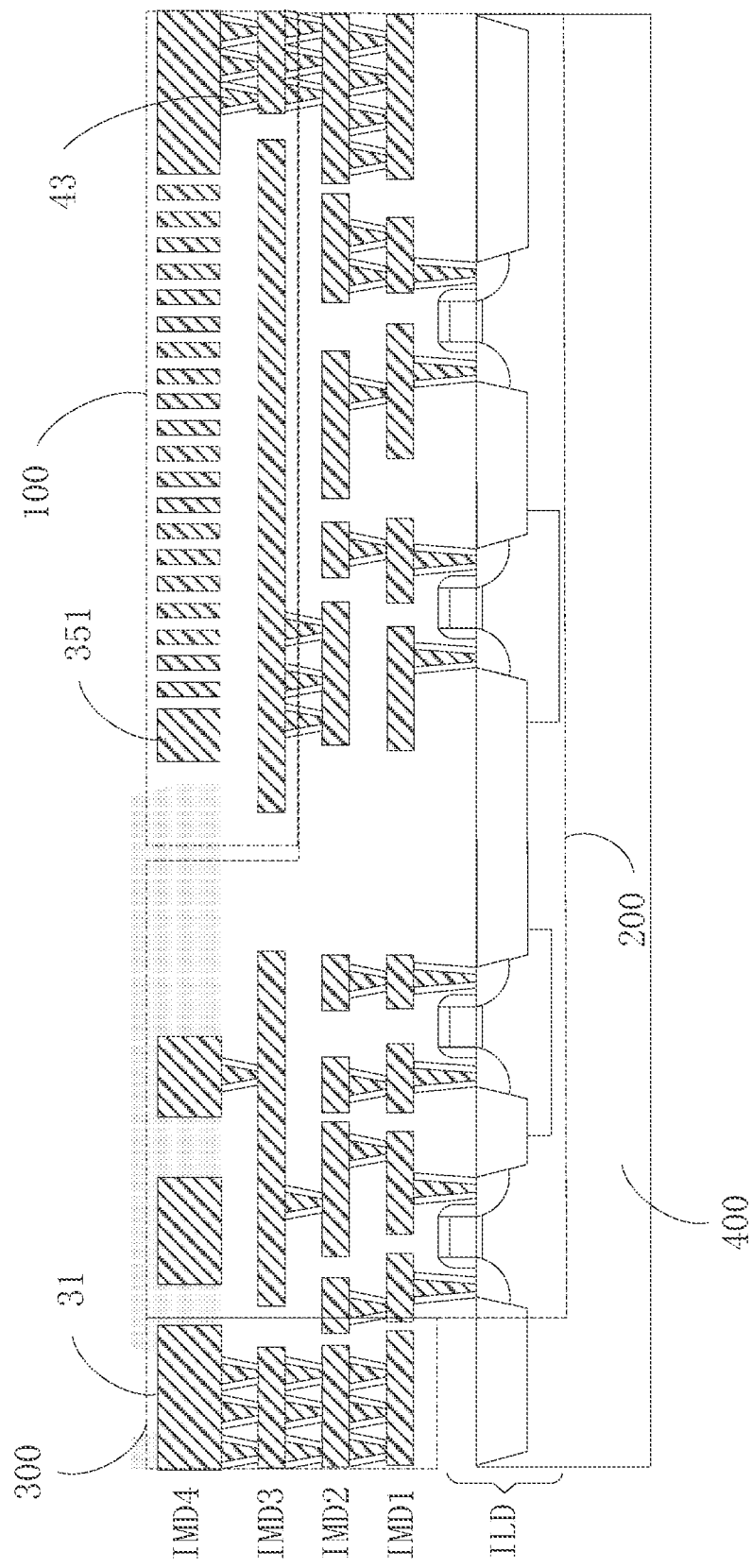

Next, as shown in FIG. 23F, the exposed movable film area and exposed pad area are etched. The bottom part of the exposed movable film area is etched to suspend the movable part of the movable film area 351, as shown in FIG. 23G. By the above-mentioned steps, the movable component area 100, the circuit integration area 200 and the pad area 300 can be formed. The way of etching the bottom part of the exposed movable film area can be the isotropic etching process. The etchant for etching the remaining oxide layer 40 under the movable component area can be SV3 or BFH2 with high selectivity. The dry etching process can also be used to etch the remaining oxide layer 40.

Please refer to FIG. 24 which shows a top view of the CMOS single chip manufactured by the steps of FIG. 23A through 23G of the present disclosure. As shown in FIG. 24, from top of the single chip, the exposed part of the movable component of the movable film 351 and the exposed pad part of the pad area 31 can be directly viewed, and the other part of the single chip is the protective layer 800.

Figure 25A:
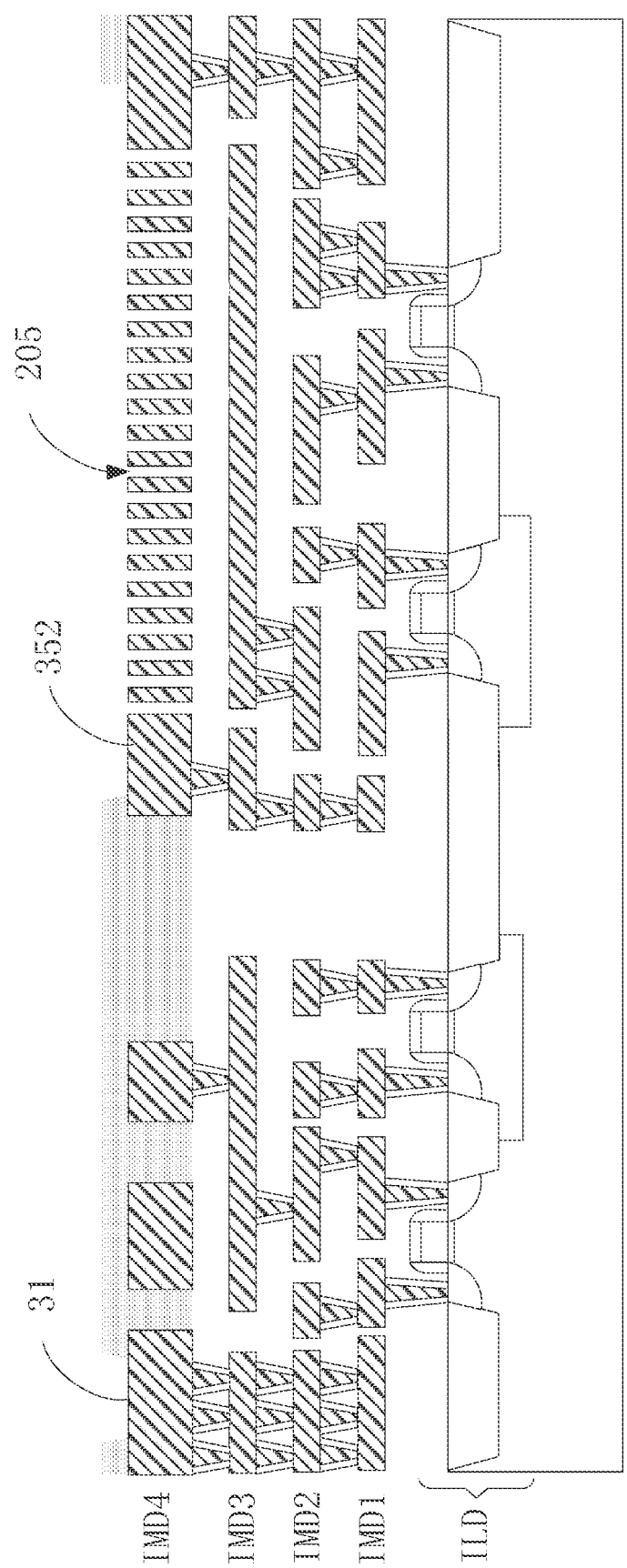
FIGS. 25A and 25B are cross-sectional schematic view of final step of manufacturing the CMOS single chip of the present disclosure, and top view of the CMOS single chip of FIG. 25A of the present disclosure.
Figure 25B:
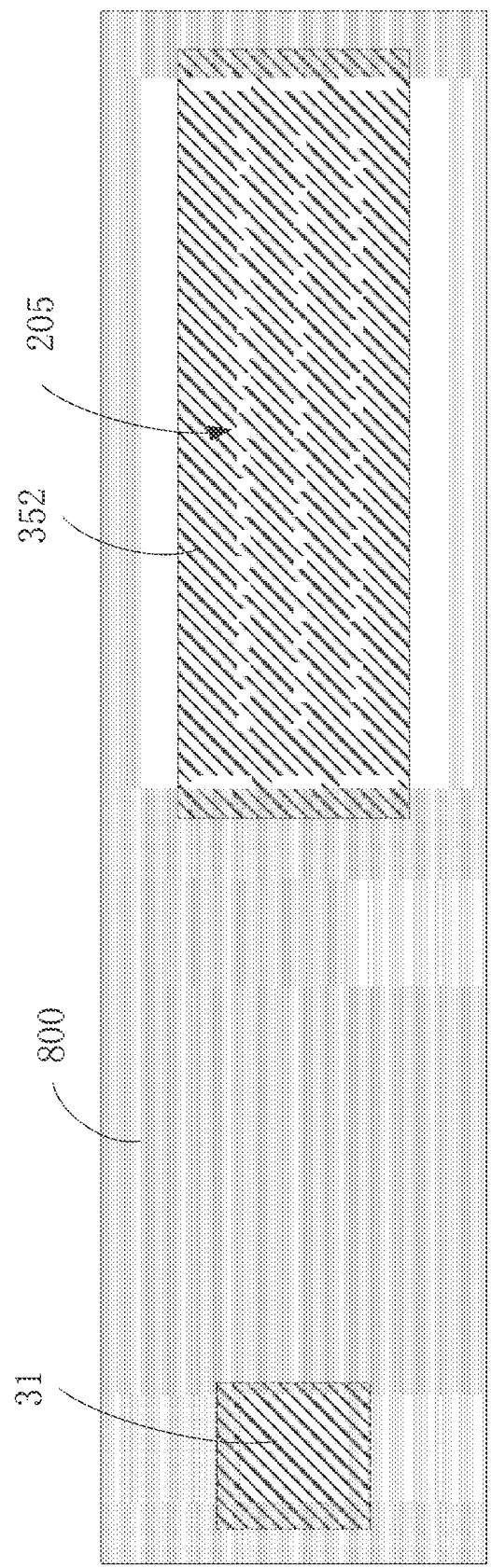

The design of supporting the peripheral of the movable film 352 can also be adopted. Please refer to FIGS. 25A and 25B which respectively show cross-sectional schematic view of final step of process of other embodiment of the CMOS single chip of the present disclosure, and top view of the CMOS single chip of FIG. 25A of the present disclosure.

In the embodiment, it is obvious that the support pillars are designed to support the peripheral of the movable film 352.

In summary, the present disclosure provides a CMOS sensing component which is manufactured by CMOS process, and the CMOS sensing component includes a movable film, at least one support pillar and a base metal layer. The movable film has multiple through-vias. The support pillar is disposed under the movable film to support the movable film. The base metal layer is formed under the support pillar and insulated from the support pillar, and faces towards the movable film to form a micro capacitor for sensing a sensing signal from the outside. In the manufacturing process, the base metal layer also functions as an etching stop layer, and has a larger area than the movable film. The sensing signal is indicative of acceleration, voice, flow speed of fluid, pressure, momentum, impulse, stress, temperature variation, humidity variation, or polarity variation. In addition, the heights of the movable film and the base metal layer can be adjusted, and can be formed by etching the metal layer in CMOS process for multiple times.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A micro acoustic collector with a lateral cavity, comprising:
    a base metal layer;
    a movable film, facing towards the base metal layer, the movable film comprising an inner-annular-supported movable film; and
    a lateral metal layer, formed at a side of the movable film and around the movable film, and spaced apart from a peripheral of the movable film by a distance, and facing towards the base metal layer to form the lateral cavity to assist an acoustic collection,
    wherein the inner-annular-supported movable film is connected to a plurality of support pillars to form a support, and
    wherein the inner-annular-supported movable film comprises a plurality of leaf-shaped structures, each of the plurality of leaf-shaped structures having a suspended arm and a restrained arm both defined by a continuous trench, and each of the plurality of support pillars is uniformly disposed under an edge of each of the plurality of leaf-shaped structures to support the plurality of leaf-shaped structures.

2. The micro acoustic collector with the lateral cavity according to claim 1, wherein the lateral metal layer comprises a plurality of through-vias.

3. The micro acoustic collector of the lateral cavity according to claim 1, wherein the plurality of leaf-shaped structures are arranged with symmetry, and the plurality of leaf-shaped structures are arranged annularly.

4. The micro acoustic collector of the lateral cavity according to claim 1, wherein the plurality of leaf-shaped structures are spaced apart from each other to form at least one central channel which is passed through a central portion of the inner-annular-supported movable film, and the at least one central channel and the plurality of leaf-shaped structures each have a plurality of through-vias.

5. The micro acoustic collector of the lateral cavity according to claim 1, wherein each of the plurality of support pillars is formed by a metal layer coated with an insulating material.

6. The micro acoustic collector of the lateral cavity according to claim 1, wherein the suspended arm of each of the plurality of leaf-shaped structures is selected from any of the following combinations: a straight shape, an L shape, a V shape, a square shape, a circular shape, an elliptic shape, and a heart-like shape.

7. The micro acoustic collector of the lateral cavity according to claim 1, wherein the plurality of support pillars are annularly arranged with symmetry.

8. A complementary metal-oxide-semiconductor (CMOS) microphone single chip, comprising:
    a circuit integration area;
    a pad area; and
    a micro acoustic collector with a lateral cavity, the micro acoustic collector comprising:
        a base metal layer;
        a movable film, facing towards the base metal layer, the movable film comprising an inner-annular-supported movable film; and
        a lateral metal layer, formed at a side of the movable film and around the movable film, and spaced apart from a peripheral of the movable film by a distance, and facing towards the base metal layer to form the lateral cavity to assist an acoustic collection,
    wherein the inner-annular-supported movable film is connected to a plurality of support pillars to form a support, and
    wherein the inner-annular-supported movable film comprises a plurality of leaf-shaped structures, each of the plurality of leaf-shaped structures having a suspended arm and a restrained arm both defined by a continuous trench, and each of the plurality of support pillars is uniformly disposed under an edge of each of the plurality of leaf-shaped structures to support the plurality of leaf-shaped structures.

9. The CMOS microphone single chip according to claim 8, wherein the lateral metal layer comprises a plurality of through-vias.

10. The CMOS microphone single chip according to claim 8, wherein the plurality of leaf-shaped structures are arranged with symmetry, and the plurality of leaf-shaped structures are arranged annularly.

11. The CMOS microphone single chip according to claim 8, wherein the plurality of leaf-shaped structures are spaced apart from each other to form at least one central channel which pass through a central portion of the inner-annular-supported movable film, and the at least one central channel and the plurality of leaf-shaped structures each have a plurality of through-vias.

12. The CMOS microphone single chip according to claim 8, wherein each of the plurality of support pillars is formed by a metal layer coated with an insulating material.

13. The CMOS microphone single chip according to claim 8, wherein the suspended arm of each of the plurality of leaf-shaped structures is selected from any of the following combinations: a straight shape, an L shape, a V shape, a square shape, a circular shape, an elliptic shape, and a heart-like shape.

14. The CMOS microphone single chip according to claim 8, wherein the support pillar are annularly arranged with symmetry.

* * * * *